United States Patent
Iwasaki

(10) Patent No.: US 9,721,988 B2
(45) Date of Patent: Aug. 1, 2017

(54) METHOD FOR MANUFACTURING SEMICONDUCTOR DEVICE, AND SEMICONDUCTOR DEVICE

(71) Applicant: RENESAS ELECTRONICS CORPORATION, Tokyo (JP)

(72) Inventor: Toshifumi Iwasaki, Ibaraki (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 22 days.

(21) Appl. No.: 14/949,422

(22) Filed: Nov. 23, 2015

(65) Prior Publication Data

US 2016/0163758 A1  Jun. 9, 2016

(30) Foreign Application Priority Data

Dec. 5, 2014  (JP) ................................. 2014-247337

(51) Int. Cl.
*H01L 27/148* (2006.01)
*H01L 27/146* (2006.01)

(52) U.S. Cl.
CPC .... *H01L 27/14643* (2013.01); *H01L 27/1462* (2013.01); *H01L 27/14614* (2013.01); *H01L 27/14689* (2013.01)

(58) Field of Classification Search
CPC ...................................................... H01L 27/148
See application file for complete search history.

(56) References Cited

FOREIGN PATENT DOCUMENTS

JP  2008-124310 A  5/2008

*Primary Examiner* — Marvin Payen
(74) *Attorney, Agent, or Firm* — McDermott Will & Emery LLP

(57) ABSTRACT

Provided is a semiconductor device with improved performance. In a method for manufacturing a semiconductor device, after forming a gate electrode of a transfer transistor over a p-type well, a photodiode is formed in one part of the p-type well positioned on one side with respect to the gate electrode. Then, a cap insulating film including silicon and nitrogen is formed over the photodiode before implanting impurity ions for formation of an n-type low-concentration semiconductor region of the transfer transistor, into the other part of the p-type well positioned on a side opposite to the one side with respect to the gate electrode.

9 Claims, 28 Drawing Sheets

METHOD FOR MANUFACTURING SEMICONDUCTOR DEVICE, AND SEMICONDUCTOR DEVICE

CROSS-REFERENCE TO RELATED APPLICATIONS

The disclosure of Japanese Patent Application No. 2014-247337 filed on Dec. 5, 2014 including the specification, drawings and abstract is incorporated herein by reference in its entirety.

BACKGROUND

The present invention relates to a method for manufacturing a semiconductor device and a semiconductor device, and more particularly, a technique suitable for use in a method for manufacturing a semiconductor device and a semiconductor device, for example, including a solid-state imaging element.

Complementary metal oxide semiconductor (CMOS) image sensors using the CMOS have been developed as the solid-state imaging element. A CMOS image sensor includes a plurality of pixels, each pixel including a photodiode and a transfer transistor. The photodiode and the transfer transistor are formed in a pixel region of a semiconductor substrate. On the other hand, a transistor serving as a logic circuit, namely, a logic transistor is formed in a peripheral circuit region of the semiconductor substrate.

Japanese Unexamined Patent Application Publication No. 2008-124310 (Patent Document 1) describes a technique for a solid-state imaging device that includes a peripheral circuit region with a silicide layer formed over a semiconductor substrate, and a pixel region without having a silicide layer. The pixel region has a region that is covered with three-layered insulating films and serves to block invasion of a high melting point metal in forming the silicide layer.

RELATED ART DOCUMENT

Patent Document

[Patent Document 1] Japanese Unexamined Patent Application Publication No. 2008-124310

SUMMARY

In manufacturing processes for a semiconductor device including the CMOS image sensor, impurity ions are implanted to form, for example, an n-type well of the photodiode, and other impurity ions are implanted to form the drain region of the transfer transistor. Then, a cap insulating film is formed over the photodiode.

In such a case, when implanting the impurity ions to form the drain region of the transfer transistor, or after forming the drain region of the transfer transistor, the photodiode might be damaged during removing a mask made of a photoresist film, for example, by sulfuric acid peroxide mixture (SPM) cleaning or an asking process. That is, crystal defects might be generated in the photodiode.

If many crystal defects are included in the photodiode, light is falsely determined to be irradiated even though the light is not irradiated, leading to improper lighting, generating white spots. The increase in frequencies of generation of the white spots while light is not irradiated, that is, the increase in frequencies of pixel defects might degrade the performance of the CMOS image sensor, thereby reducing the semiconductor device Other problems and new features of the present invention will be clearly understood by the following detailed description of the present specification in connection with the accompanying drawings.

According to one embodiment of the invention, in a method for manufacturing a semiconductor device, a cap insulating film containing silicon and nitrogen is formed over the photodiode after forming a gate electrode of a transfer transistor and forming a photodiode and before forming a drain region of the transfer transistor.

In another embodiment of the invention, the semiconductor device includes the cap insulating film that contains silicon and nitrogen and is formed over the photodiode and the side surface of the gate electrode in the transfer transistor on the photodiode side. The semiconductor device also includes a sidewall spacer formed over the side surface of the gate electrode in the transfer transistor on the photodiode side via the cap insulating film.

In a further embodiment of the invention, the semiconductor device includes the cap insulating film that contains silicon and nitrogen and is formed over the photodiode and the side surface of the gate electrode in the transfer transistor on the photodiode side in a pixel region. The semiconductor device includes a liner film that covers the photodiode formed in the pixel region, a transfer transistor formed in the pixel region, and a transistor formed in a peripheral circuit region. The liner film is in contact with each of the part of the cap insulating film formed over the side surface of the gate electrode of the transfer transistor on the photodiode side, the side surface opposite to the photodiode side of the gate electrode of the transfer transistor, and the side surfaces of the gate electrode in the transistor.

Accordingly, the one embodiment of the present invention can improve the performance of the semiconductor device.

DETAILED DESCRIPTION

Figure 1:
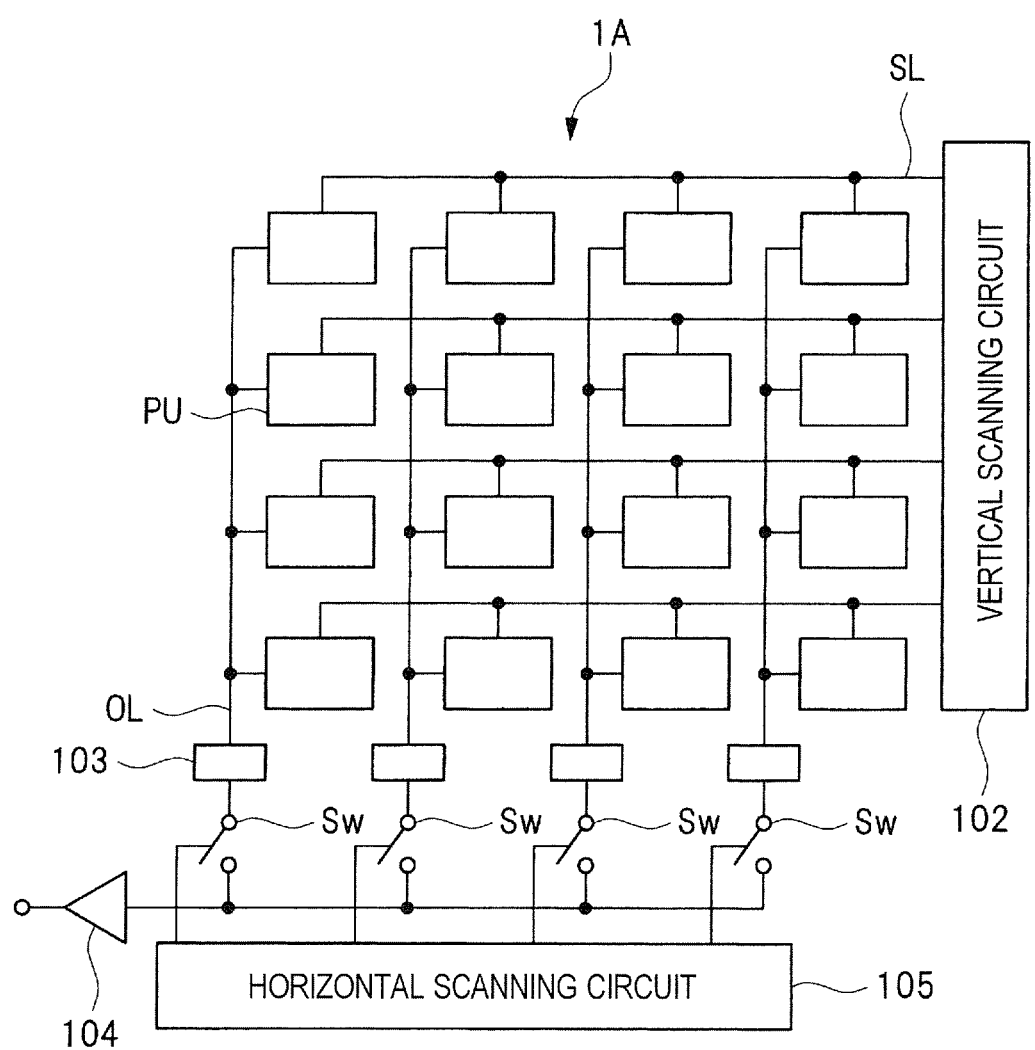
FIG. 1 is a circuit block diagram showing an example of the configuration of a semiconductor device according to a first embodiment.

The following preferred embodiments may be described by being divided into a plurality of sections or embodiments for convenience, if necessary, which are not independent from each other, unless otherwise specified. One of the sections or embodiments may be a modified example, a detailed description, supplementary explanation, and the like of a part or all of the other.

Even when referring to a specific number about an element and the like (including the number of elements, a numerical value, an amount, a range, and the like) in the following embodiments, the invention is not limited to the specific number, and may take the number greater than, or less than the specific numeral number, unless otherwise specified, and except when obviously limited to the specific number in principle.

The components (including steps) in the following embodiments are not necessarily essential unless otherwise specified, and except when clearly considered to be essential in principle. Likewise, when referring to the shape of one component, or the positional relationship between the components in the following embodiments and the like, any shape or positional relationship substantially similar or approximate to that described herein may be included in the invention unless otherwise specified and except when clearly considered not to be so in principle. The same goes for the above numerical value and the range.

Typical preferred embodiments will be described in detail below based on the accompanying drawings. In all drawings for explaining the embodiments, parts having the same function are denoted by the same reference character, and the repeated description thereof will be omitted. In the following embodiments, the description of the same or similar parts will not be repeated in principle, except when needed.

In the accompanying drawings used in the embodiments, even some cross-sectional views may omit hatching for better understanding.

Further, some cross-sectional views do not reflect the size of the actual devices and emphasize a specific part in a relatively large size to make the drawings easily understood.

First Embodiment

Figure 2:
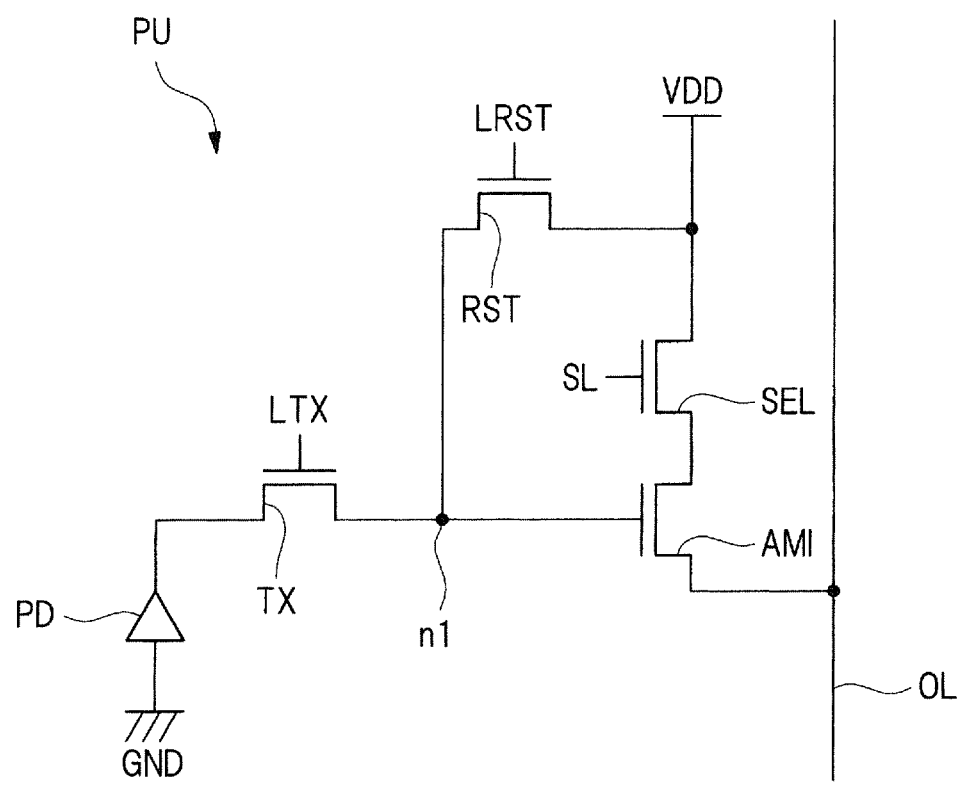
FIG. 2 is a circuit diagram showing an example of the configuration of a pixel.

Now, a semiconductor device in a first embodiment will be described in detail with reference to the accompanying drawings.
<Structure of Semiconductor Device>
FIG. 1 is a circuit block diagram showing an example of the configuration of a semiconductor device in the first embodiment. FIG. 2 is a circuit diagram showing an example of the configuration of a pixel. FIG. 1 illustrates 16 pixels arranged in an array, specifically, of 4 rows by 4 columns. However, when the semiconductor device of the first embodiment is applied to an electronic device, such as a camera, for example, millions of pixels are provided.

In a pixel region 1A shown in FIG. 1, a plurality of pixels PU is arranged in the array, and driving circuits, including a vertical scanning circuit 102 and a horizontal scanning circuit 105, are arranged around the pixels. The semiconductor device of the first embodiment has a pixel array including a plurality of pixels PU arranged in the array. In other words, the semiconductor device of the first embodiment has a plurality of pixels PU arranged in the array.

Each pixel PU is arranged at the intersection of a selection line SL and an output line OL. The selection lines SL are coupled to the vertical scanning circuit 102, and the output lines OL are coupled to the respective column circuits 103. Each column circuit 103 is coupled to the output amplifier 104 via a corresponding switch Sw. Each switch Sw is coupled to the horizontal scanning circuit 105, and controlled by the horizontal scanning circuit 105.

For example, an electric signal read from a pixel PU that is selected by the vertical scanning circuit 102 and the horizontal scanning circuit 105 is output via the output line OL and the output amplifier 104.

For example, as shown in FIG. 2, the pixel PU includes a photodiode PD and four MOSFETs. These MOSFETs are of the n-channel type and include a reset transistor RST, a transfer transistor TX, a selection transistor SEL, and an amplifier transistor AMI. The transfer transistor TX transfers an electric charge generated by the photodiode PD. In addition to these transistors, other transistors, capacitive elements, or the like may be incorporated in some cases. These transistors can take various coupling forms in modified examples. The term "MOSFET" as used herein is an abbreviation for the metal oxide semiconductor field effect transistor, which may also be referred to as a "MISFET" (metal insulator semiconductor field effect transistor). Further, the term "FET" as used herein is an abbreviation for the field effect transistor.

In an example of the circuit shown in FIG. 2, in the pixel PU, the photodiode PD and the transfer transistor TX are coupled in series between a ground potential GND and a node n1. The reset transistor RST is coupled to between the node n1 and a power supply potential VDD. The power supply potential VDD is a potential of a power supply potential line. The selection transistor SEL and the amplifier transistor AMI are coupled in series between the power supply potential VDD and the output line OL. A gate electrode of the amplification transistor AMI is coupled to the node n1. A gate electrode of the reset transistor RST is coupled to a reset line LRST. A gate electrode of the selection transistor SEL is coupled to the selection line SL, and a gate electrode of the transfer transistor TX is coupled to a transfer line LTX.

The photodiode PD generates electric charges by photoelectric conversion. The transfer transistor TX transfers the electric charges generated by the photodiode PD. The amplifier transistor AMI amplifies a signal in response to the electric charges transferred by the transfer transistor TX. The selection transistor SEL selects the pixel PU that includes the photodiode PD and the transfer transistor TX. In other words, the selection transistor SEL selects the amplifier transistor AMI. The reset transistor RST resets the electric charges of the photodiode PD.

For example, the transfer line LTX and the reset line LRST are activated to an H level, and the transfer transistor TX and the reset transistor RST are turned on. As a result, the electric charges of the photodiode PD are removed from the photodiode PD, which becomes depleted. Then, the transfer transistor TX is turned off.

Thereafter, for example, once a shutter, e.g., a mechanical shutter, of an electronic device, such as a camera, is opened, an incident light falls on the photodiode PD to generate electric charges while the shutter is open, and the generated electric charges are stored in the photodiode PD. That is, the photodiode PD receives the incident light, thereby generating the electric charges.

Then, after closing the shutter, the reset line LRST is activated to an L level, and the reset transistor RST is turned off. Further, the selection line SL and the transfer line LTX are activated to an H level, and the selection transistor SEL and the transfer transistor TX are turned on. Thus, the electric charges generated by the photodiode PD are transferred to an end of the side of the node n1 of the transfer transistor TX (floating diffusion FD shown in FIG. 3 to be described later). At this time, a signal, or potential from the floating diffusion FD changes to a value according to the electric charges transferred from the photodiode PD, so that the changed signal value is amplified by the amplifier transistor AMI to be output to the output line OL. The signal, or potential of the output line OL becomes an electric signal (photodetection signal) and is readout of the output amplifier 104 as an output signal via the column circuit 103 and the switch Sw.

Figure 3:
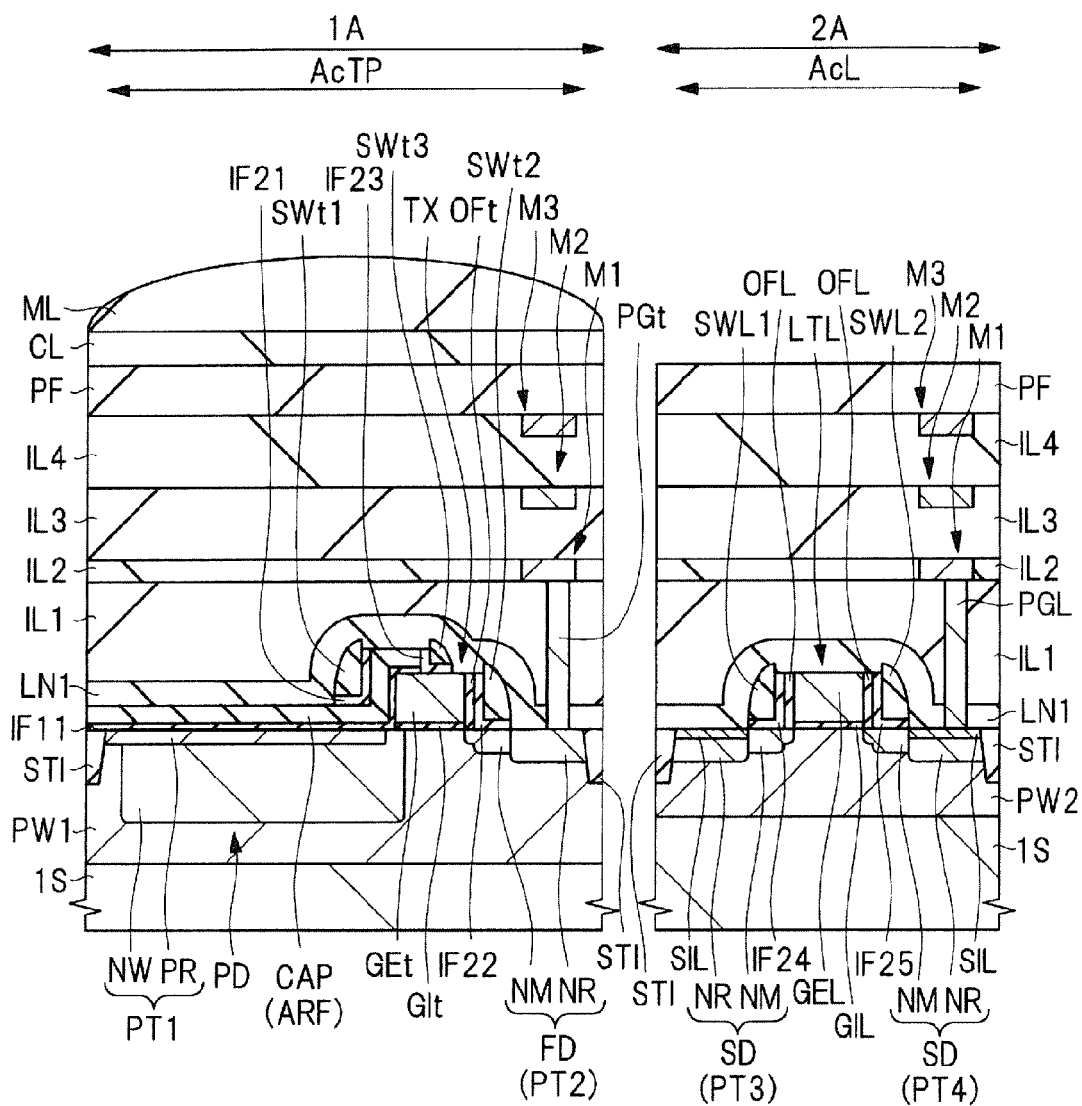
FIG. 3 is a cross-sectional view showing the structure of the semiconductor device in the first embodiment.
Figure 4:
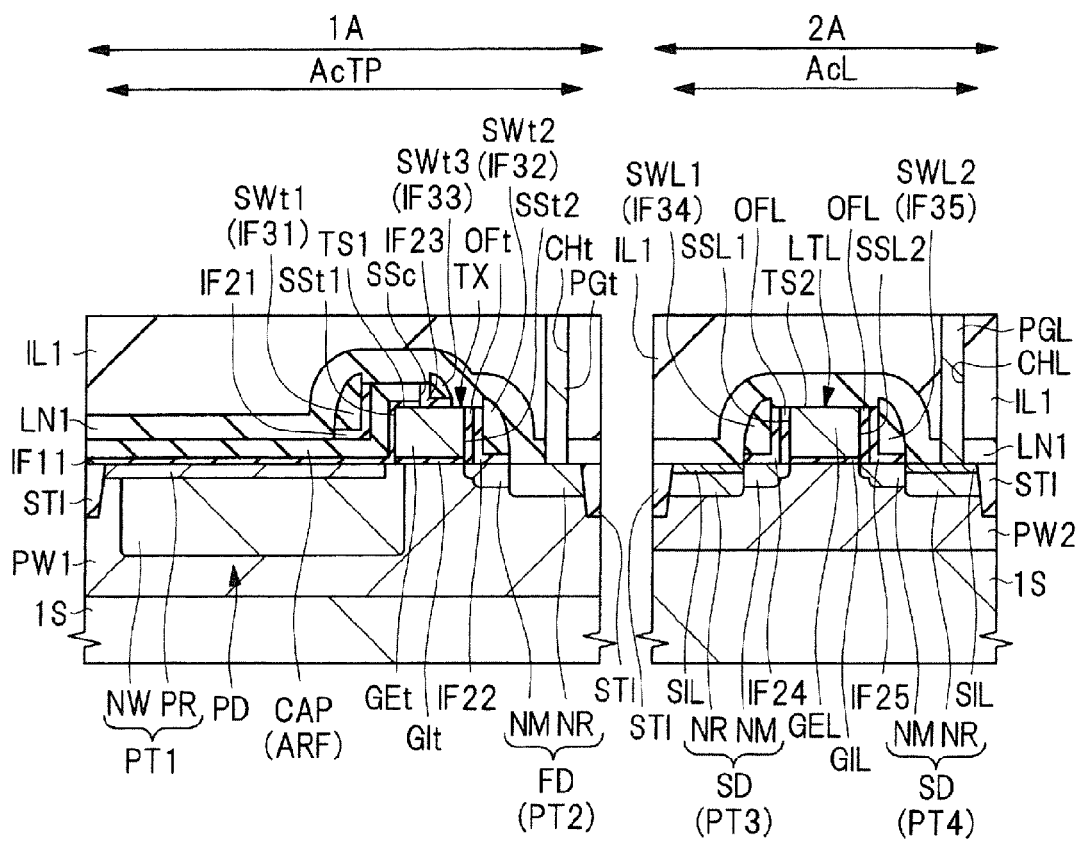
FIG. 4 is a cross-sectional view showing the structure of the semiconductor device in the first embodiment.

<Element Structure in Pixel Region and Peripheral Circuit Region>
Now, the element structure in the pixel region and the peripheral circuit region will be described below. FIGS. 3 and 4 are cross-sectional views showing the structure of the semiconductor device in the first embodiment. FIGS. 3 and 4 illustrate a combination of an element structure in the pixel region 1A and an element structure in the peripheral circuit region 2A (note that the same goes for the following cross-sectional views showing the structures of the semiconductor devices). FIG. 4 omits the illustration of a part above an interlayer insulating film IL1 of FIG. 3.

As shown in FIG. 3, the semiconductor device of the first embodiment includes a semiconductor substrate 1S, an active region AcTP formed as a semiconductor region in a pixel region 1A on the upper surface side as the main surface of the semiconductor substrate 1S, and an active region AcL formed as a semiconductor region in the peripheral circuit region 2A on the upper surface side of the semiconductor substrate 1S.

In the active region AcTP, the photodiode PD and the transfer transistor TX are formed. Although not shown in FIGS. 3 and 4, in the active region of the pixel region 1A, the amplifier transistor AMI, the selection transistor SEL, and the reset transistor RST may be formed as described with reference to FIG. 2.

In the active region AcL, a transistor LTL is formed as a logic transistor configuring the logic circuit. The transistor LTL is comprised of either an n-channel MISFET having electrons as carriers or a p-channel MISFET having holes as carriers. Although not shown in FIGS. 3 and 4, a transistor having a higher drive voltage than that of the transistor LTL may be formed in the active region of the peripheral circuit region 2A. This transistor having the higher drive voltage is also comprised of either the n-channel MISFET or the p-channel MISFET, like the transistor LTL. Alternatively, in the peripheral circuit region 2A, a plurality of types of transistors with different drive voltages may be formed.

The semiconductor substrate 1S is comprised of a single crystal silicon that contains n-type impurities, such as phosphor (P) or arsenic (As). Element isolation regions STI are arranged at the respective outer peripheries of the active regions ACTP and ACL. In this way, the respective parts on the upper surface side of the semiconductor substrate 1S enclosed by the element isolation regions STI are the active regions, including the active regions AcTP and ACL.

In the active region AcTP of the pixel region 1A, a p-type well PW1 is formed as the semiconductor region by introducing p-type impurities, such as boron (B). In the active region AcL of the peripheral circuit region 2A, a p-type well PW2 is formed as the semiconductor region by introducing p-type impurities, such as boron (B). The conduction type of the p-type wells PW1 and PW2 is a p type. The p type is an opposite conduction type to an n type, which is the conduction type of the semiconductor substrate 1S.

A gate electrode GEt is formed over the active region AcTP, that is, over the p-type well PW1 via a gate insulating film GIt. The gate electrode GEt is a gate electrode for the transfer transistor TX. The photodiode PD is formed in one part PT1 of the p-type well PW1 positioned on one side (on the left side of FIG. 3) of the gate electrode GEt in the planar view. The floating diffusion FD functioning as a charge storage portion or a floating diffusion layer is formed in the other part PT2 of the p-type well PW1 positioned on the other side (on the right side of FIG. 3) of the gate electrode GEt, that is, positioned on the side opposite to the photodiode PD via the gate electrode GEt in the planar view.

Inside the part PT1 of the p-type well PW1 in the active region AcTP, an n-type well NW is formed as the semiconductor region by introducing n-type impurities, such as phosphor (P) or arsenic (As). Specifically, the n-type well NW is formed in an upper layer portion of the part PT1 in the p-type well PW1. The p-type well PW1 and the n-type well NW configure the photodiode PD. That is, the photodiode PD includes the p-type well PW1 formed in the active region AcTP, and the n-type well NW formed in the p-type well PW1. The photodiode PD includes a p-n junction formed between the p-type well PW1 and the n-type well NW.

A $p^+$-type semiconductor region PR is formed in a part of the upper surface of the n-type well NW. The $p^+$-type semiconductor region PR is formed in order to suppress the generation of electrons due to the presence of a plurality of interface states at the upper surface of the semiconductor substrate 1S. That is, in the part near the upper surface of the semiconductor substrate 1S, electrons are generated by the influence of interface state even without irradiation of the light, leading to an increased dark current in some cases. For this reason, the $p^+$-type semiconductor region PR having holes as numerous carriers is formed over the upper surface of the n-type well NW having electrons as numerous carriers, which can suppress the generation of electrons without irradiation of light, thereby preventing the increase in dark current. That is, the photodiode PD has the $p^+$-type semiconductor region PR formed in a part of the upper surface of the n-type well NW. Therefore, the part of the p-type well PW1 in which the n-type well NW and the $p^+$-type semiconductor region PR are formed is the part PT1.

Inside an upper layer portion of the part PT2 of the p-type well PW1 in the active region AcTP, an n-type high-concentration semiconductor region NR is formed by introducing n-type impurities, such as phosphor (P) or arsenic (As). The n-type high-concentration semiconductor region NR is a semiconductor region serving as the floating diffusion FD, and also serves as a drain region of the transfer transistor TX. That is, the transfer transistor TX includes the gate electrode GEt formed in the active region AcTP, and the n-type high-concentration semiconductor region NR, which is the drain region formed at the upper layer portion of the active region AcTP in alignment with the gate electrode GEt. In other words, the transfer transistor TX is comprised of the gate electrode GEt, and the n-type high-concentration semiconductor region NR formed at the upper layer portion of the part PT2 in the p-type well PW1. Therefore, the part of the p-type well PW1 in which the n-type high-concentration semiconductor region NR is formed is the part PT2.

A cap insulating film CAP containing silicon and nitrogen is formed over the n-type well NW and the part PT1 comprised of the $p^+$-type semiconductor region PR, via an insulating film IF11 containing silicon and oxygen. The cap insulating film CAP is formed as a protective film that protects the part PT1 comprised of the n-type well NW and the $p^+$-type semiconductor region PR, that is, the photodiode PD. The insulating film IF11 is formed as an etching stopper, for example, when etching the cap insulating film CAP.

The formed cap insulating film CAP contains silicon and nitrogen, and thus can improve its performance as the protective film and also its performance as an antireflective film. The formed insulating film IF11 contains silicon and oxygen, and thus can improve its performance as the etching stopper when etching the cap insulating film CAP.

As mentioned using FIG. 10 to be described later, in the manufacturing procedure for the semiconductor device in the first embodiment, the cap insulating film CAP is formed over the part PT1 comprised of the n-type well NW and the $p^+$-type semiconductor region PR before forming the low-concentration semiconductor region NM and the high-concentration semiconductor region NR in the upper layer portion of the part PT2 in the p-type well PW1. With the cap insulating film CAP formed over the part PT1, the low-concentration semiconductor region NM and the high-concentration semiconductor region NR are formed in the upper layer portion of the part PT2 in the p-type well PW1. Thus, when the low-concentration semiconductor region NM and the high-concentration semiconductor region NR are formed in the upper layer portion of the part PT2 of the p-type well PW1, the photodiode PD can be protected.

Until the end of the manufacturing procedure for the semiconductor device, the cap insulating film CAP is maintained as an antireflective film ARF without being removed, as the cap insulating film CAP is formed before forming the low-concentration semiconductor region NM and the high-concentration semiconductor region NR in the upper layer portion of the part PT2 in the p-type well PW1.

Preferably, the insulating film IF11 is comprised of a silicon oxide ($SiO_2$) film, and the cap insulating film CAP is comprised of a silicon nitride (SiN) film. The silicon nitride film has a higher chemical stability, compared to the silicon oxide film, or a higher refractive index, compared to the silicon oxide film. Thus, the cap insulating film CAP is formed of the silicon nitride film, so that the performance of the cap insulating film CAP as the protective film can be further improved to enhance the performance of the cap insulating film CAP as the antireflective film. The insulating film IF11 is formed of the silicon oxide film, so that the performance of the insulating film IF11 as the etching stopper can be further improved when etching the cap insulating film CAP.

The cap insulating film CAP is integrally formed over the part PT1, a side surface SSt1 on the side of the photodiode PD of the gate electrode GEt, and the upper surface TS1 of the gate electrode GEt. Thus, the cap insulating film CAP can protect a part adjacent to the gate electrode GEt in the planar view, in the part PT1 comprised of the n-type well NW and the $p^+$-type semiconductor region PR. When forming the low-concentration semiconductor region NM and the high-concentration semiconductor region NR in the upper layer portion of the part PT2 in the p-type well PW1, the cap insulating film CAP can protect the part of the photodiode PD adjacent to the gate electrode GEt in the planar view.

A sidewall spacer SWt1 is formed of an insulating film IF31 over the side surface SSt1 of the gate electrode GEt on the side of the photodiode PD via the insulating film IF11, the cap insulating film CAP, and the insulating film IF21. A sidewall spacer SWt2 is formed of an insulating film IF32 over a side surface SSt2 of the gate electrode GEt opposite to the side of the photodiode PD via an offset spacer OFt and an insulating film IF22. The insulating film IF22 is formed in the same layer as the insulating film IF21, and the insulating film IF32 is formed in the same layer as the insulating film IF31. The sidewall spacer SWt2 is comprised of the insulating film IF32 formed in the same layer as the insulating film IF31 included in the sidewall spacer SWt1. Thus, both the sidewall spacers SWt1 and SWt2 are formed of insulating films different from the cap insulating film CAP.

With this arrangement, the insulating film formed over the side surface SSt1 of the gate electrode GEt on the side of the photodiode PD and the insulating film formed over the side surface SSt2 opposite to the side of the photodiode PD of the gate electrode GEt are arranged asymmetrically with respect to the gate electrode GEt as the center. Thus, various characteristics, including stress applied to the semiconductor substrate 1S, can differ between the side of the gate electrode GEt on the photodiode PD side and the side of the gate electrode GEt opposite to the photodiode PD side, thereby optimizing the characteristics of the semiconductor device as the CMOS image sensor.

The end of the cap insulating film CAP on the side of the side surface SSt2 of the gate electrode GEt is arranged over the upper surface TS1 of the gate electrode GEt. At this time, a sidewall spacer SWt3 may be formed of an insulating film IF33 over a side surface SSc of the cap insulating film CAP on the side of the side surface SSt2 of the gate electrode GEt via an insulating film IF23. The insulating film IF23 is formed in the same layer as the insulating film IF21, and the insulating film IF33 is formed in the same layer as the insulating film IF31. The sidewall spacer SWt3 is comprised of the insulating film IF33 formed in the same layer as the insulating film IF31 included in the sidewall spacer SWt1.

With this arrangement, the structure of the insulating films, including the cap insulating film CAP formed over the photodiode PD, differs between the center of the photodiode PD and the end of the photodiode PD on the side of the gate electrode GEt. This can relieve the stress or the like applied to the p-type well PW1, for example, in a part positioned under the end of the gate electrode GEt on the side of the photodiode PD.

Alternatively, the number of insulating films over the end of the photodiode PD on the side of the gate electrode GEt is increased or the like, compared to that over the center of the photodiode PD, making it difficult for light to reach the end of the photodiode PD on the side of the gate electrode GEt. Thus, the influence of the characteristics at the end of the photodiode PD on the side of the gate electrode GEt can be reduced, with respect to the characteristics at the center of the photodiode PD.

Preferably, each of the insulating films IF21, IF22, and IF23 is comprised of a silicon oxide film, and each of the insulating films IF31, IF32, and IF33 is comprised of a silicon nitride film. The insulating film IF31 formed of the silicon nitride film has a higher Young's modulus, compared to the silicon oxide film, which can easily adjust the stress applied to the part of the photodiode PD adjacent to the gate electrode GEt in the planar view, that is, to the end of the photodiode PD on the side of the gate electrode GEt. The insulating film IF31 formed of the silicon nitride film has a higher refractive index, compared to the silicon oxide film, making it more difficult for the light to reach the end of the photodiode PD on the side of the gate electrode GEt.

Note that as shown in FIGS. 3 and 4, the high-concentration semiconductor region NR included in the floating diffusion FD may be formed in alignment with the sidewall spacer SWt2, at a position of the part PT2 in the p-type well PW1 located opposite to the gate electrode GEt with the sidewall spacer SWt2 sandwiched. The low-concentration semiconductor region NM included in the floating diffusion FD may be formed in alignment with the gate electrode GEt, at the part PT2 in the p-type well PW1. The floating diffusion FD having a lightly doped drain (LDD) structure may be comprised of the low-concentration semiconductor region NM and the high-concentration semiconductor region NR.

A gate electrode GEL is formed at the active region AcL, that is, over the p-type well PW2 via a gate insulating film GIL. The gate electrode GEL is a gate electrode of a transistor LTL. One source/drain region SD of the transistor LTL that is comprised of the n-type low-concentration semiconductor region NM and the n-type high-concentration semiconductor region NR is formed in the part PT3 of the p-type well PW2 positioned on one side (on the left side of FIG. 3) of the gate electrode GEL in the planar view. The other source/drain region SD of the transistor LTL that is comprised of the n-type low-concentration semiconductor region NM and the n-type high-concentration semiconductor region NR is formed in the part PT4 of the p-type well PW2 positioned on the side (on the right side of FIG. 3) opposite to the one side of the gate electrode GEL in the planar view.

The term "source/drain region" as used in the specification of the present application means a semiconductor region, which is a source region or a drain region.

A sidewall spacer SWL1 comprised of an insulating film IF34 is formed over a side surface SSL1 on one side (on the left side of FIG. 3) of the gate electrode GEL via an offset spacer OFL and an insulating film IF24. A sidewall spacer SWL2 comprised of an insulating film IF35 is formed over a side surface SSL2 on the other side (on the right side of FIG. 3) of the gate electrode GEL opposite to the one side via the offset spacer OFL and an insulating film IF25. Each of the insulating films IF24 and IF25 is formed in the same layer as the insulating film IF21, and each of the insulating films IF34 and IF35 is formed in the same layer as the insulating film IF31. Thus, the sidewall spacers SWL1 and SWL2 include the insulating films IF34 and IF35, respectively, formed in the same layer as the insulating film IF31 included in the sidewall spacer SWt1.

The n-type low-concentration semiconductor region NM, that is, the n⁻-type semiconductor region NM is formed in alignment with the gate electrode GEL, in the upper layer portion of the part PT3 in the p-type well PW2. The n-type high-concentration semiconductor region NR, that is, the n⁺-type semiconductor region NR is formed in alignment with the sidewall spacer SWL1, in the upper layer portion of a part in the part PT3 within the p-type well PW2 that is located opposite to the gate electrode GEL with the sidewall spacer SWL1 sandwiched in the planar view. The source/drain region SD having the LDD structure is formed of the low-concentration semiconductor region NM and the high-concentration semiconductor region NR, in the upper layer portion of the part PT3 in the p-type well PW2.

The n-type low-concentration semiconductor region NM is formed in alignment with the gate electrode GEL, in the upper layer portion of the part PT4 in the p-type well PW2. The n-type high-concentration semiconductor region NR is formed in alignment with the sidewall spacer SWL2, in the upper layer portion of the part PT4 within the p-type well PW2 that is located opposite to the gate electrode GEL via the sidewall spacer SWL2 in the planar view. The source/drain region SD having the LDD structure is formed of the low-concentration semiconductor region NM and the high-concentration semiconductor region NR, in the upper layer portion of the part PT4 in the p-type well PW2.

Therefore, the transistor LTL includes the gate electrode GEL and the source/drain region SD. In other words, the transistor LTL is formed by the gate electrode GEL and the source/drain region SD.

A silicide layer SIL comprised of a metal silicide layer, such as nickel silicide, is formed over the upper surface of the n-type high-concentration semiconductor region NR. That is, the silicide layer SIL is formed in an upper layer portion of the n-type high-concentration semiconductor region NR.

Note that the silicide layer SIL may be formed over the upper surface of the gate electrode GEL. The silicide layer SIL may be formed at the upper surface of the n-type high-concentration semiconductor region NR, which is the floating diffusion FD. Alternatively, the silicide layer may not be formed at the upper surface of the n-type high-concentration semiconductor region NR, which is the floating diffusion FD.

In the pixel region 1A, a liner film LN1 is formed as the insulating film to cover the active region AcTP, including the transfer transistor TX and the photodiode PD. An interlayer insulating film IL1 is formed over the liner film LN1. A plug PGt is formed in the interlayer insulating film IL1 and the liner film LN1 to reach the n-type high-concentration semiconductor region NR as the floating diffusion FD through the interlayer insulating film IL1 and the liner film LN1.

In the peripheral circuit region 2A, the liner film LN1 is formed to cover the active region AcL including the transistor LTL, and the interlayer insulation film IL1 is formed over the liner film LN1. Plugs PGL are formed in the interlayer insulating film IL1 to reach the n-type high-concentration semiconductor regions NR on both sides of the gate electrode GEL through the interlayer insulating film IL1 and the liner film LN1. Note that FIG. 3 illustrates only the plug PGL reaching the n-type high-concentration semiconductor region NR on a side (on the right side of FIG. 3) opposite to one side of the gate electrode GEL.

The liner film LN1 is comprised of, for example, a silicon nitride film. The interlayer insulating film IL1 is a silicon oxide film formed using, for example, a tetraethyl orthosilicate (TEOS) as a raw material.

As shown in FIG. 4, in the pixel region 1A, a contact hole CHt is formed in the interlayer insulating film IL1 and the liner film LN1, while in the peripheral circuit region 2A, a contact hole CHL is formed in the interlayer insulating film IL1 and the liner film LN1. In each of the contact holes CHt and CHL, for example, a main conductive film is embedded. The main conductive film is comprised of, for example, a barrier conductive film including a titanium film and a titanium nitride film formed over the titanium film, and a tungsten film formed over the barrier conductive film. In this way, the respective plugs PGt and PGL are formed.

As shown in FIG. 3, for example, an interlayer insulating film IL2 is formed over the interlayer insulating film IL1 with the plug PGt formed therein in the pixel region 1A, and over the interlayer insulating film IL1 with the plug PGL formed therein in the peripheral circuit region 2A. A wiring M1 is formed in the interlayer insulating film IL2. The plugs PGt and PGL are coupled to the wiring M1.

The interlayer insulating film IL2 is a laminated film comprised of, e.g., a silicon nitride film and a silicon oxide film. The interlayer insulating film IL2 is not limited thereto, and can also be formed of, for example, a low-dielectric-constant film having a lower dielectric constant than that of a silicon oxide film. The low-dielectric-constant film can include, for example, a carbon-containing silicon oxide (SiOC) film. The wiring M1 is formed of, e.g., a copper wiring, and can be formed, for example, by the damascene method. Note that the wiring M1 is not limited to a copper wiring, and can also be formed of an aluminum wiring.

An interlayer insulating film IL3 including, for example, a silicon oxide film or a low-dielectric-constant film, is formed over the interlayer insulating film IL2 with the wiring M1 formed therein. In the interlayer insulating film IL3, a wiring M2 is formed. An interlayer insulating film IL4 is formed over the interlayer insulating film IL3 with the wiring M2 formed therein. A wiring M3 is formed in the interlayer insulating film IL4. The wirings M1 to M3 form respective wiring layers. The plugs PGt and PGL are coupled by wiring layers comprised of the wirings M1 to M3. In this way, the circuit shown in FIGS. 1 and 2 can be formed.

The wirings M1 to M3 are formed not to overlap with the photodiode PD in the planar manner. This is because the light entering the photodiode is not to be interrupted by the wirings M1 to M3.

In the pixel region 1A, a microlens ML is mounted over the interlayer insulating film IL4 with the wiring M3 formed therein. As illustrated in FIG. 3, a passivation film PF and a color filter CL may be formed from the side of the semiconductor substrate 1S in this order, between the microlens ML and the interlayer insulating film IL4. At this time, as shown in FIG. 3, also in the peripheral circuit region 2A, the passivation film PF may be provided over the interlayer insulating film IL4.

Referring to FIG. 3, once the light is applied to the pixel PU (see FIG. 1), first, an incident light passes through the microlens ML. Then, after the light passes through the interlayer insulating films IL4 to IL1 that are transparent to visible light, as well as the liner film LN1, the light enters the antireflective film ARF. The antireflective film ARF suppresses the reflection of the incident light, thereby allowing the incident light of sufficient quantity to enter the photodiode PD. In the photodiode PD, since the energy of the incident light is larger than a bandgap of silicon, the incident light is absorbed to produce pairs of holes and electrons by photoelectric conversion. The electrons produced at this time are stored in the n-type well NW.

At appropriate timing, the transfer transistor TX is turned on. Specifically, a voltage equal to or higher than a threshold voltage is applied to the gate electrode GEt of the transfer transistor TX. Then, a channel region is formed at a part under the gate insulating film GIt in the p-type well PW1, whereby the n-type well NW as the source region of the transfer transistor TX is electrically conducted with the n-type high-concentration semiconductor region NR as the drain region of the transfer transistor TX. As a result, electrons stored in the n-type well NW reach the drain region through the channel region, and are extracted from the drain region toward the outside through a wiring layer.

<<Method for Manufacturing Semiconductor Device>>

Figure 5:
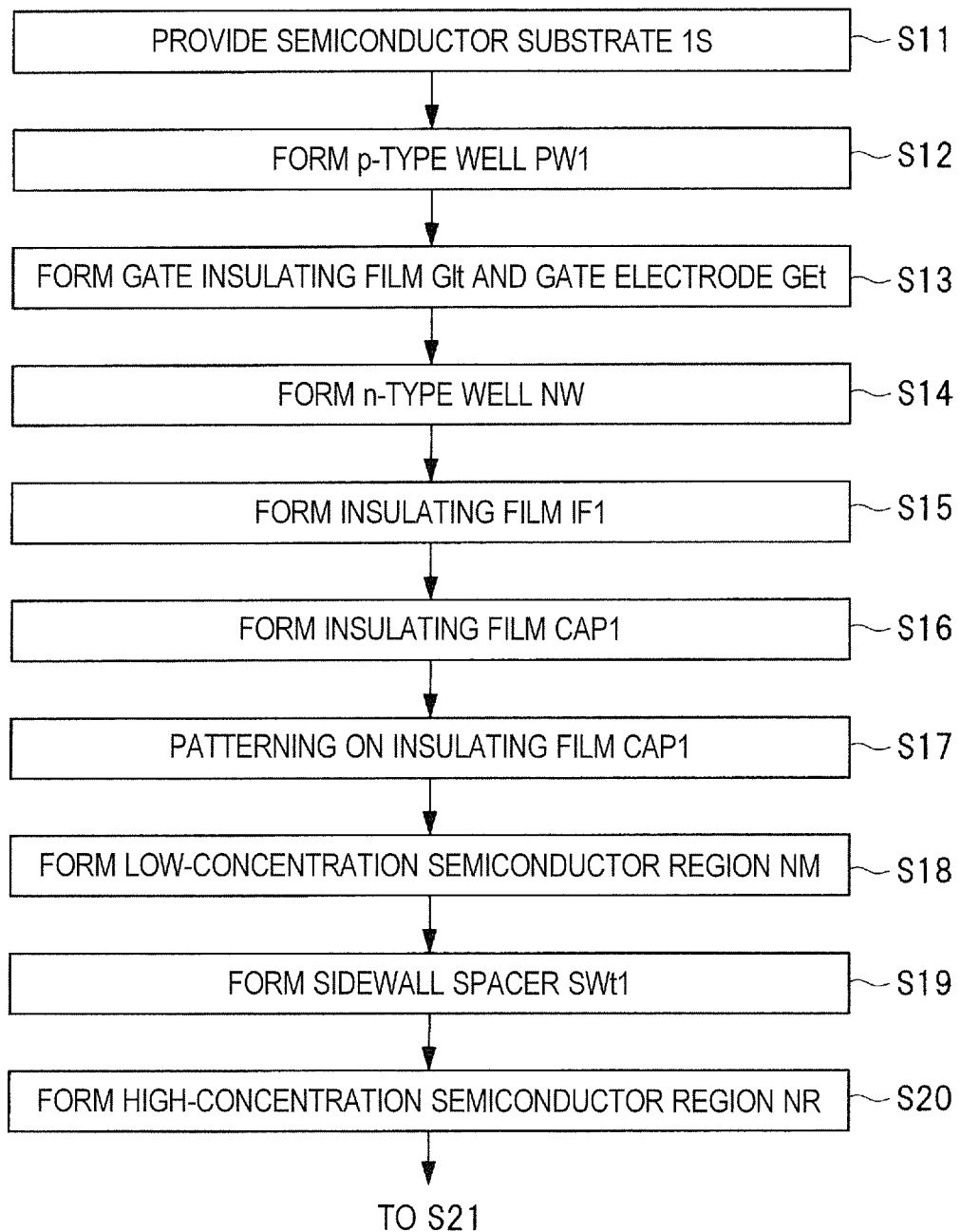
FIG. 5 is a manufacturing process flowchart showing parts of manufacturing steps for the semiconductor device in the first embodiment.
Figure 6:
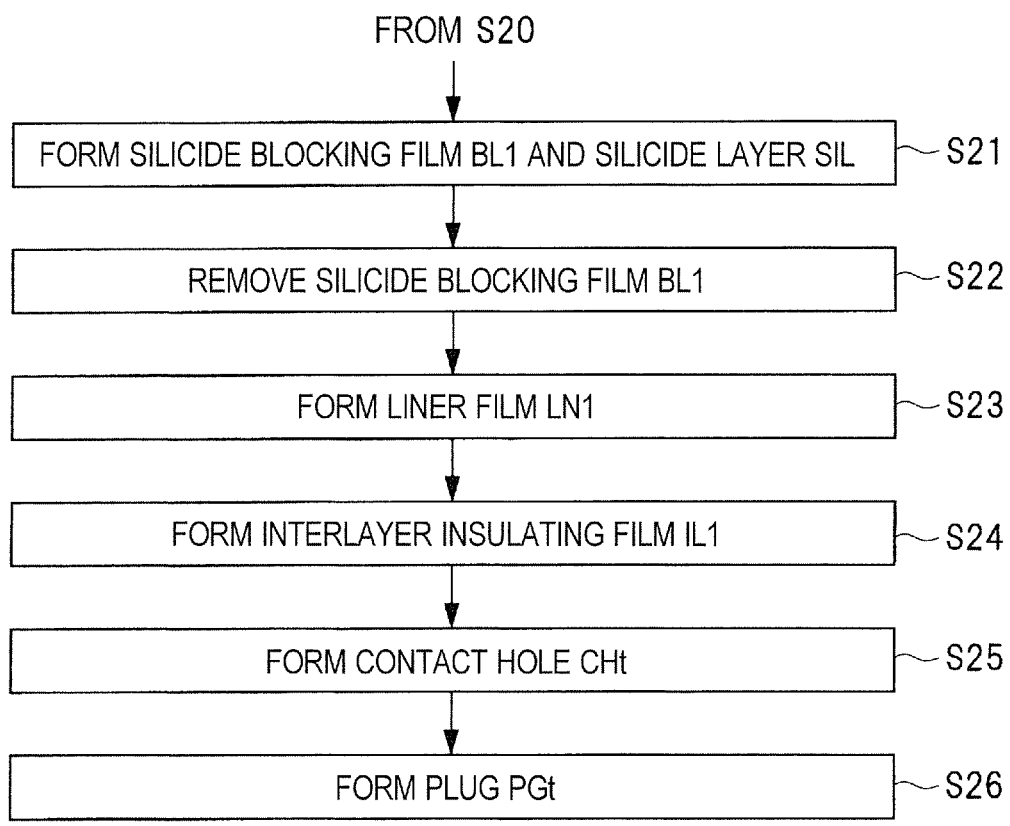
FIG. 6 is a manufacturing process flowchart showing other parts of the manufacturing steps for the semiconductor device in the first embodiment.

Next, a method for manufacturing the semiconductor device in the first embodiment will be described below. FIGS. 5 and 6 are manufacturing process flowcharts showing parts of a manufacturing procedure for the semiconductor device in the first embodiment. FIGS. 7 to 19 are cross-sectional views showing manufacturing steps for the semiconductor device in the first embodiment. Each of FIGS. 7 to 19 illustrates a manufacturing step in the pixel region 1A as well as in the peripheral circuit region 2A (the same goes for the cross-sectional views below that show the following manufacturing steps for the semiconductor devices.)

Figure 7:
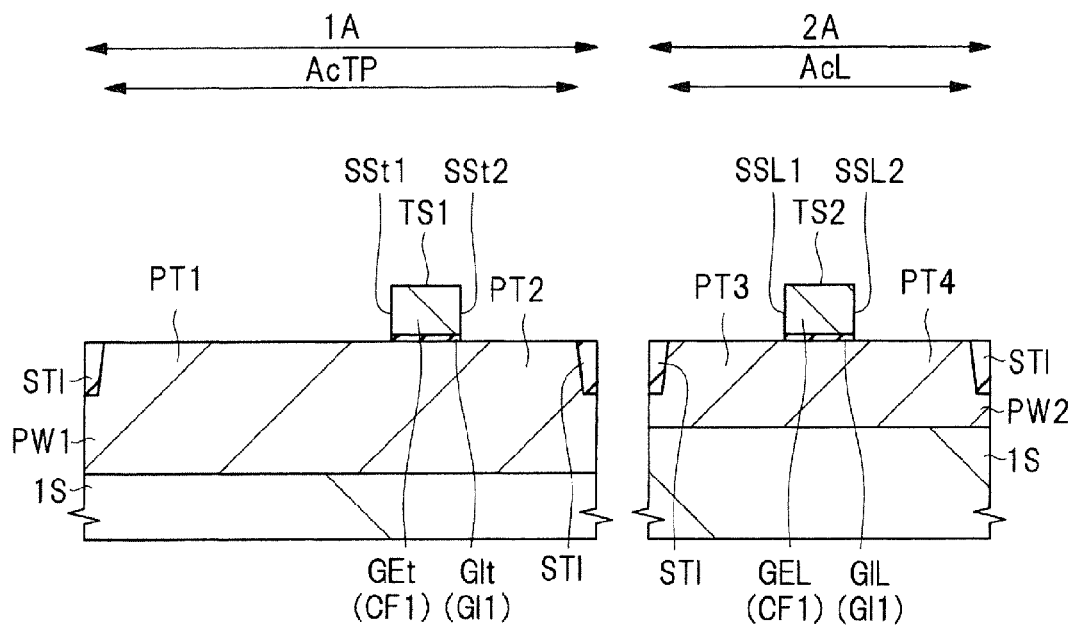
FIG. 7 is a cross-sectional view showing a manufacturing step for the semiconductor device in the first embodiment.

First, as shown in FIG. 7, the semiconductor substrate 1S is provided (in step S11 of FIG. 5). In step S11, first, an n-type monocrystalline silicon substrate containing n-type impurities, such as phosphor (P) or arsenic (As), is provided as the semiconductor substrate 1S.

Then, element isolation regions STI are formed in the semiconductor substrate 1S. The element isolation region STI is formed of an insulating member that is embedded in a trench in the semiconductor substrate 1S. The semiconductor substrate 1S is etched, for example, using a silicon nitride (SiN) film as a mask, whereby isolation trenches are formed in regions of the semiconductor substrate 1S to serve as the active regions, including the active regions AcTP and AcL. Then, an insulating film, such as a silicon oxide ($SiO_2$) film, is embedded in the isolation trenches, thereby forming the element isolation regions STI. Such an element isolation method is called a shallow trench isolation (STI) method. The element isolation regions STI partition the semiconductor substrate into, or to form the active regions, including the active regions AcTP and AcL. The active region AcTP is formed in the pixel region 1A on an upper surface side as a main surface of the semiconductor substrate 1S, and the active region AcL is formed in the peripheral circuit region 2A on an upper surface side as a main surface of the semiconductor substrate 1S.

Note that the element isolation region may be formed by a local oxidation of silicon (LOCOS) method, instead of the STI method. In this case, the element isolation region is formed of a thermally-oxidized film. For example, the regions of the semiconductor substrate 1S to serve as the active regions, including the active regions AcTP and AcL, are covered with a silicon nitride film and thermally oxidized, thereby forming element isolation regions that are made of insulating members, such as silicon oxide films.

Then, as shown in FIG. 7, the p-type well PW1 is formed (in step S12 of FIG. 5). In step S12, the p-type well PW1 is formed as the p-type semiconductor region in the active region AcTP within the pixel region 1A. In step S12, the p-type well PW2 is formed as the p-type semiconductor region in the active region AcL within the peripheral circuit region 2A.

In step S12, p-type impurities made of, e.g., boron (B) are introduced into the semiconductor substrate 1S in the active regions AcTP and ACL by photolithography technique and ion implantation technique. In this way, the p-type wells PW1 and PW2 are formed in the pixel region 1A and the peripheral circuit region 2A. The conduction type of the p-type wells PW1 and PW2 is a p-type, opposite to an n-type which is the conduction type of the semiconductor substrate 1S. The concentration of the p-type impurities in each of the p-type wells PW1 and PW2 is not limited specifically, but can be any value.

Then, as shown in FIG. 7, the gate insulating film GIt and the gate electrode GEt are formed (in step S13 of FIG. 5).

In step S13, first, the semiconductor substrate 1S is thermally oxidized to form an insulating film GI1 including a silicon oxide film, over an upper surface of the p-type well PW1 in the pixel region 1A. Further, the semiconductor substrate 1S is thermally oxidized to form the insulating film GI1 over an upper surface of the p-type well PW2 in the peripheral circuit region 2A.

A silicon nitride film, a silicon oxynitride (SiON) film, or the like may be used for the insulating film GI1. The so-called high-dielectric-constant film, such as a hafnium-based insulating film, which is obtained by introducing lanthanum oxide ($La_2O_3$) into a hafnium oxide ($HfO_2$) film, that is, a film which has a higher dielectric constant than that of the silicon nitride film, may be used. These films can be formed, for example, by the chemical vapor deposition (CVD) method.

In step S13, next, a conductive film CF1 made of, e.g., a polycrystalline silicon film, is formed by the CVD method or the like over the insulating film GI1 in the pixel region 1A, and the conductive film CF1 is also formed by the CVD method or the like over the insulating film GI1 in the peripheral circuit region 2A.

Then, in step S13, the conductive film CF1 and the insulating film GI1 are patterned.

Specifically, a photoresist film (not shown) is formed over the conductive film CF1, and exposed to light and developed using the photolithography technique. Hereinafter, the photoresist film is also referred to as a resist film. In this way, the photoresist film is maintained in the pixel region 1A and the peripheral circuit region 2A where forming the gate electrodes GEt and GEL.

Then, the conductive film CF1 and the insulating film GI1 are etched using the photoresist film as a mask. Thus, the gate electrode GEt is formed of the conductive film CF1 over the p-type well PW1 via the gate insulating film GIt including the insulating film GI1 in the pixel region 1A. The gate electrode GEL is formed of the conductive film CF1 over the p-type well PW2 via the gate insulating film GIL including the insulating film GI1 in the peripheral circuit region 2A.

Note that the upper surface of the gate electrode GEt is defined as an upper surface TS1, one side surface (on the left side of FIG. 7) of the gate electrode GEt is defined as a side surface SSt1, and the other side surface (on the right side of FIG. 7) of the gate electrode GEt is defined as a side surface 55t2. The upper surface of the gate electrode GEL is defined as an upper surface TS2, one side surface (on the left side of FIG. 7) of the gate electrode GEL is defined as a side surface SSL1, and the other side surface (on the right side of FIG. 7) of the gate electrode GEL is defined as a side surface SSL2.

A part of the p-type well PW1 positioned on one side (on the left side of FIG. 7) of the gate electrode GEt is defined as a part PT1, and the other part of the p-type well PW1 positioned on the other side opposite to the one side (on the right side of FIG. 7) of the gate electrode GEt is defined as a part PT2. A part of the p-type well PW2 positioned on one side (on the left side of FIG. 7) of the gate electrode GEL is defined as a part PT3, and the other part of the p-type well PW2 positioned on the other side opposite to the one side (on the right side of FIG. 7) of the gate electrode GEL is defined as a part PT4.

Figure 8:
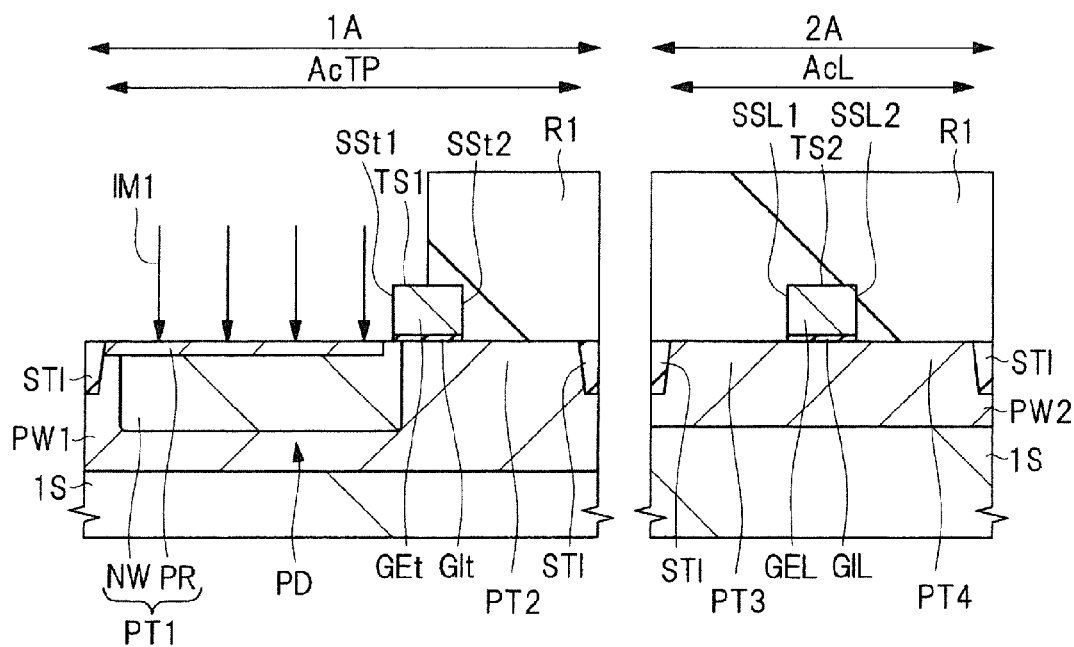
FIG. 8 is a cross-sectional view showing another manufacturing step for the semiconductor device in the first embodiment.

Then, as shown in FIG. 8, the n-type well NW is formed (in step S14 of FIG. 5). In step S14, the n-type well NW is formed by ion implantation in the part PT1 of the p-type well PW1 positioned on one side (on the left side of FIG. 8) with respect to the gate electrode GEt in the pixel region 1A.

For example, in the pixel region 1A and the peripheral circuit region 2A, a photoresist film (resist film) R1 is formed over the semiconductor substrate 1S, and exposed to light and developed by the photolithography technique, whereby the photoresist film R1 is patterned.

Specifically, the photoresist film R1 is formed over the part PT1 of the p-type well PW1, the gate electrode GEt, and the part PT2 of the p-type well PW1 in the pixel region 1A, while the photoresist film R1 is also formed over the part PT3 of the p-type well PW2, the gate electrode GEL, and the part PT4 of the p-type well PW2 in the peripheral circuit region 2A. Then, in the pixel region 1A, a part of the photoresist film R1 formed over the part PT1 of the p-type well PW1 is removed. In other words, the photoresist film R1 is patterned to expose the part PT1 of the p-type well PW1.

At this time, in the peripheral circuit region 2A, the p-type well PW2 is covered with the photoresist film R1 not to implant n-type impurity ions thereinto. On the other hand, in the pixel region 1A, the part PT2 of the p-type well PW1 is covered with the photoresist film R1 not to implant n-type impurity ions thereinto.

Then, n-type impurity ions IM1 are implanted into the part PT1 of the p-type well PW1 in the pixel region 1A, using the photoresist film R1 and the gate electrode GEt as a mask. In this way, the n-type well NW is formed in the upper layer portion of the part PT1 in the p-type well PW1. That is, the n-type well NW is formed in the part PT1 of the p-type well PW1. The photodiode PD is formed by the p-n junction between the p-type well PW1 and the n-type well NW. At this time, the part PT1 is comprised of the n-type well NW.

Note that as shown in FIG. 8, in step S14, after forming the n-type well NW, the p$^+$-type semiconductor region PR may be formed in the upper layer portion of the n-type well NW. At this time, the part PT1 is comprised of the n-type well NW and the p$^+$-type semiconductor region PR.

Figure 9:
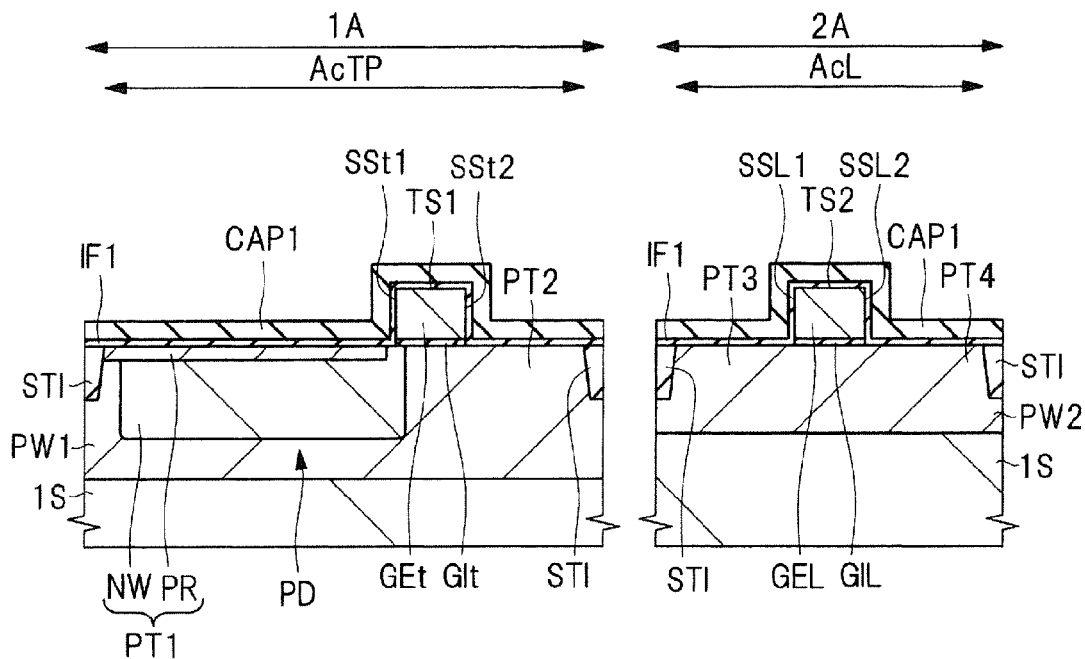
FIG. 9 is a cross-sectional view showing another manufacturing step for the semiconductor device in the first embodiment.

Then, as shown in FIG. 9, the insulating film IF1 is formed (in step S15 of FIG. 5). In step S15, the insulating film IF1 containing silicon and oxygen is formed over the part PT1 comprised of the n-type well NW and the p$^+$-type semiconductor region PR, and over the gate electrode GEt in the pixel region 1A, for example, by the thermal oxidation or the CVD method. The insulating film IF1 is also formed over the part PT2 of the p-type well PW1 in the pixel region 1A. In other words, in step S15, the insulating film IF1 is formed to cover the part PT1, the gate electrode GEt, and the part PT2.

On the other hand, the insulating film IF1 is formed over the part PT3 of the p-type well PW2, the gate electrode GEL, and the part PT4 of the p-type well PW2 in the peripheral circuit region 2A. In other words, in step S15, the insulating film IF1 is formed to cover the part PT3, the gate electrode GEL, and the part PT4.

Then, as shown in FIG. 9, an insulating film CAP1 is formed (in step S16 of FIG. 5). In step S16, the insulating film CAP1 containing silicon and nitrogen is formed over the insulating film IF1 in the pixel region 1A and the peripheral circuit region 2A, for example, by the CVD method. In other words, in step S16, the insulating film CAP1 is formed to cover the part PT1, the gate electrode GEt, and the part PT2 in the pixel region 1A. In step S16, the insulating film CAP1 is also formed to cover the part PT3, the gate electrode GEL, and the part PT4 in the peripheral circuit region 2A.

Preferably, the insulating film IF1 is comprised of a silicon oxide film, and the insulating film CAP1 is comprised of a silicon nitride film. The silicon nitride film has the higher chemical stability, compared to the silicon oxide film, or the higher refractive index, compared to the silicon oxide film. Thus, the silicon nitride film can improve the performance of the cap insulating film CAP made of the insulating film CAP1 as the protective film, as well as the performance of the cap insulating film CAP as the antireflective film.

Figure 10:
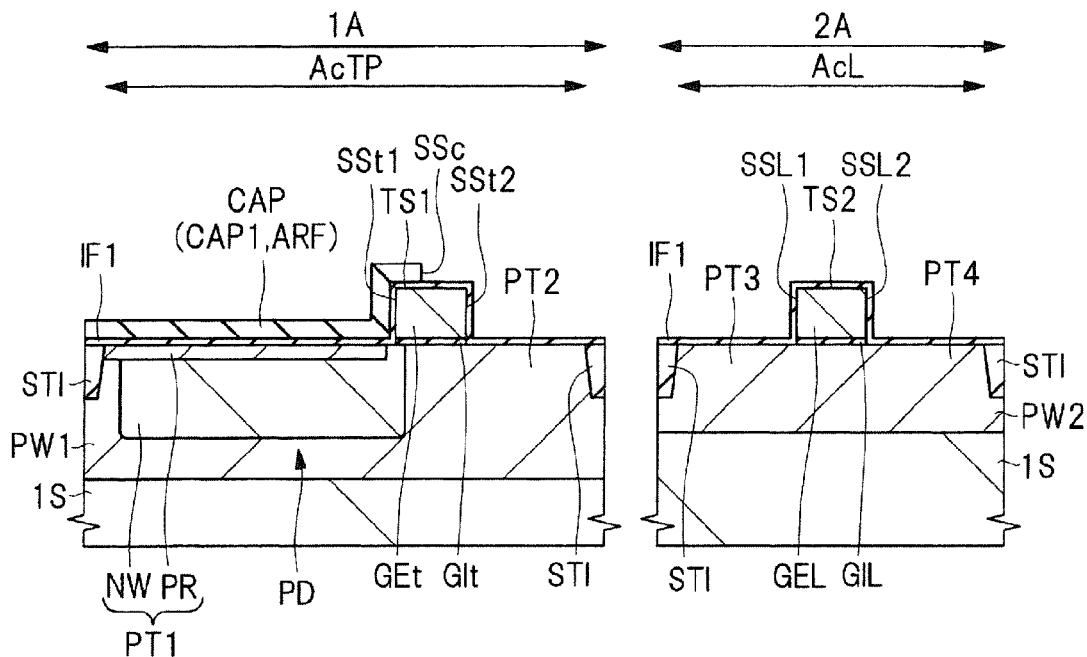
FIG. 10 is a cross-sectional view showing another manufacturing step for the semiconductor device in the first embodiment.

Then, as shown in FIG. 10, the insulating film CAP1 is patterned (in step S17 of FIG. 5). In step S17, for example, a photoresist film (not shown) is formed over the insulating film CAP1 in the pixel region 1A and the peripheral circuit region 2A, and exposed to light and developed using the photolithography. Thus, the photoresist film positioned over the part PT1 comprised of the n-type well NW and the p$^+$-type semiconductor region PR and over the part of the gate electrode GEt on the side of the photodiode PD is maintained, and other parts of the photoresist film are removed.

Thus, the cap insulating film CAP1 is etched in the pixel region 1A and the peripheral circuit region 2A by a reactive ion etching (RIE) method, etc., while the photoresist film covers the part PT1 comprised of the n-type well NW and the p$^+$-type semiconductor region PR as well as the part of the gate electrode GEt on the side of the photodiode PD.

Specifically, in the pixel region 1A, a part of the insulating film CAP1 covering the part PT2 is removed, and in the peripheral circuit region 2A, the insulating film CAP1 is also removed. In the pixel region 1A, the part of the cap insulating film CAP including the insulating film CAP1 is formed to be integrally maintained over the part PT1 comprised of the n-type well NW and the p$^+$-type semiconductor region PR, the side surface SSt1 of the gate electrode GEt on the photodiode PD side, and the upper surface TS1 of the gate electrode GEt. That is, the cap insulating film CAP is integrally formed over the part PT1, the side surface SSt1 of the gate electrode GEt, and the upper surface TS1 of the gate electrode GEt in the pixel region 1A. The cap insulating film CAP functions as the antireflective film ARF. Thereafter, the photoresist film is removed.

In the example shown in FIG. 10, a part of the insulating film IF1 exposed from the cap insulating film CAP is maintained without being removed. However, as described later with reference to FIGS. 20 to 23, the part of the insulating film IF1 exposed from the cap insulating film CAP may be removed.

The side surface of the cap insulating film CAP on the side of the side surface SSt2 of the gate electrode GEt is defined as a side surface SSc.

Figure 11:
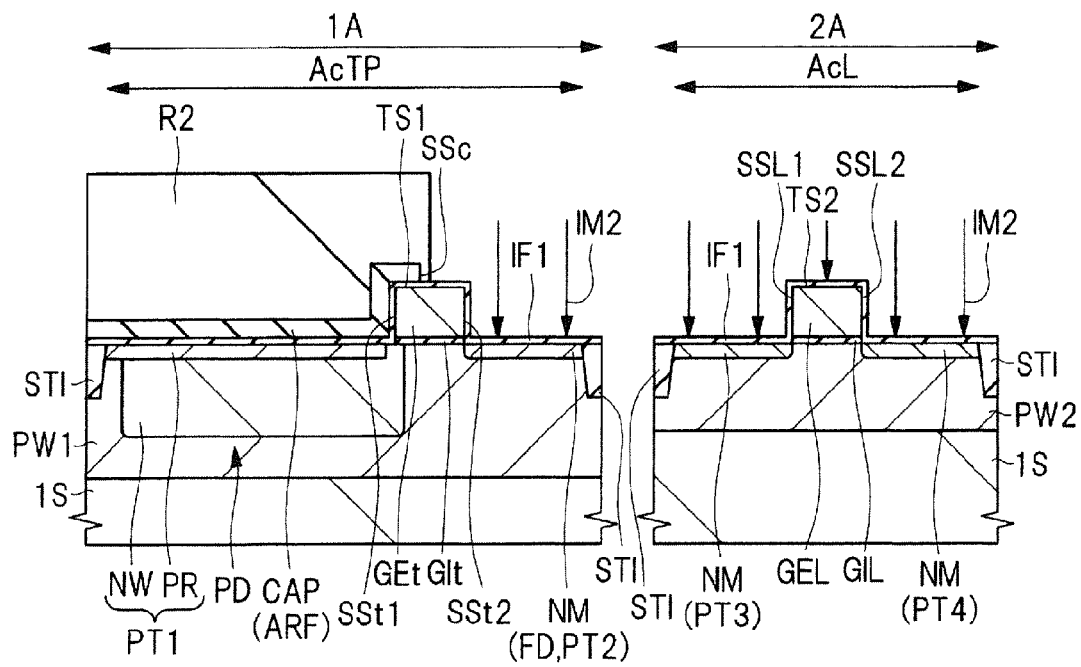
FIG. 11 is a cross-sectional view showing another manufacturing step for the semiconductor device in the first embodiment.
Figure 12:
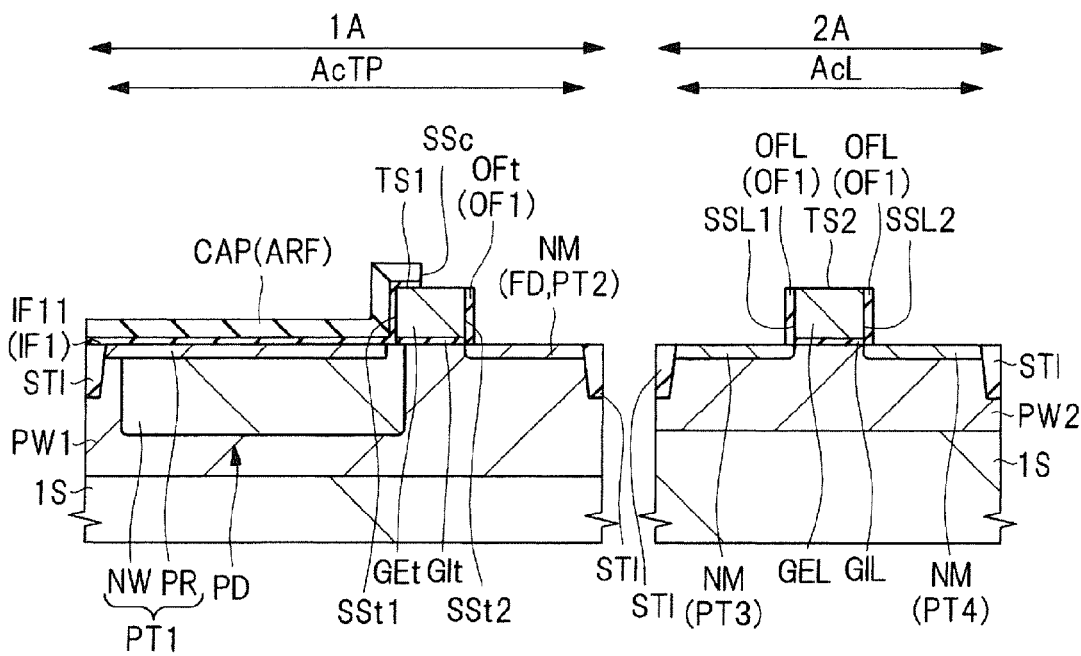
FIG. 12 is a cross-sectional view showing another manufacturing step for the semiconductor device in the first embodiment.
Figure 13:
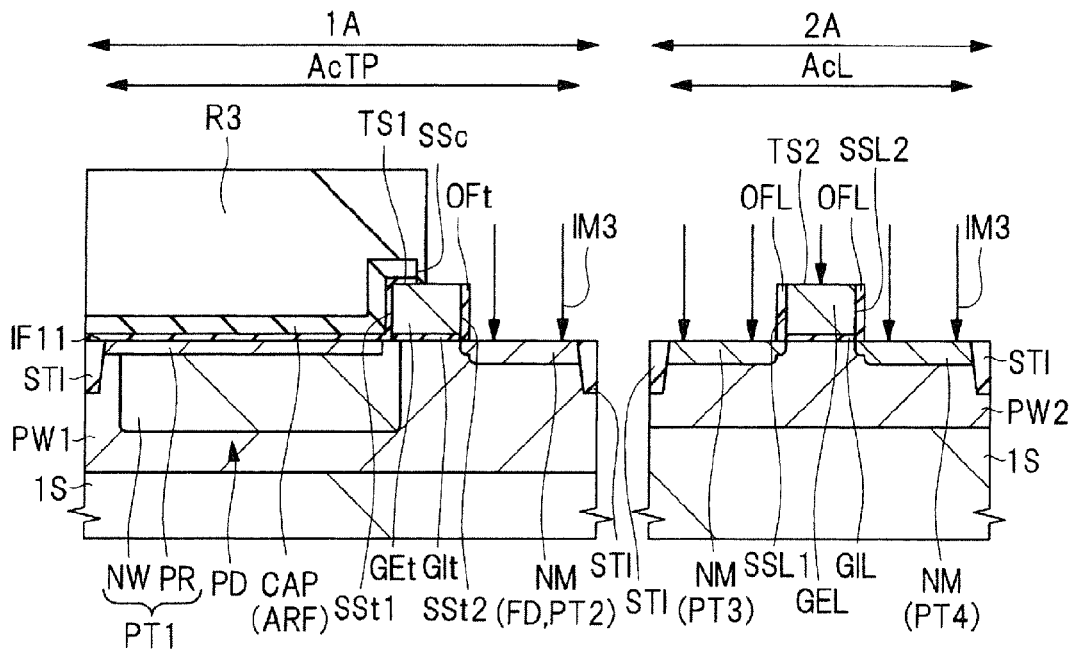
FIG. 13 is a cross-sectional view showing another manufacturing step for the semiconductor device in the first embodiment.

Then, as shown in FIGS. 11 to 13, the n-type low-concentration semiconductor region NM is formed (in step S18 of FIG. 5).

In step S18, first, as shown in FIG. 11, for example, the photoresist film R2 is formed over the semiconductor substrate 1S in the pixel region 1A and the peripheral circuit region 2A, and exposed to light and developed by the photolithography technique, whereby the photoresist film R2 is patterned.

Specifically, the photoresist film R2 is formed over the cap insulating film CAP, the gate electrode GEt, and the part PT2 of the p-type well PW1 in the pixel region 1A, while the photoresist film R2 is also formed over the part PT3 of the p-type well PW2, the gate electrode GEL, and the part PT4 of the p-type well PW2 in the peripheral circuit region 2A. Then, in the pixel region 1A, a part of the photoresist film R2 formed over the part PT2 of the p-type well PW1 is removed. In other words, the photoresist film R2 is patterned to expose the part PT2 of the p-type well PW1.

At this time, a part of the photoresist film R2 formed over the gate electrode GEL and the respective parts PT3 and PT4 of the p-type well PW2 is removed in the peripheral circuit region 2A. On the other hand, in the pixel region 1A, the part PT1 that is comprised of the n-type well NW and the p⁺-type semiconductor region PR is covered with the insulating film IF1, the cap insulating film CAP, and the photoresist film R2 to prevent implantation of the n-type impurity ions into the part PT1.

Thus, n-type impurity ions IM2 are implanted into the part PT2 of the p-type well PW1 using the gate electrode GEt as a mask in the pixel region 1A with the cap insulating film CAP and the photoresist film R2 formed over the part PT1 comprised of the n-type well NW and the p⁺-type semiconductor region PR. Then, n-type impurity ions IM2 are also implanted into the parts PT3 and PT4 of the p-type well PW2 in the peripheral circuit region 2A, using the gate electrode GEL as a mask with the cap insulating film CAP and the photoresist film R2 formed over the part PT1.

Thus, in the pixel region 1A, the n-type low-concentration semiconductor region NM is formed in the upper layer portion of the part PT2 of the p-type well PW1. On the other hand, in the peripheral circuit region 2A, the n-type low-concentration semiconductor region NM is formed in the upper layer portions of the parts PT3 and PT4 of the p-type well PW2. The n-type low-concentration semiconductor region NM in the pixel region 1A is a drain region for the transfer transistor TX, or a semiconductor region serving as the floating diffusion FD. Thereafter, the photoresist film R2 is removed, for example, by SPM cleaning or asking process.

In step S18, next, as shown in FIG. 12, a part of the insulating film IF1 exposed from the cap insulating film CAP is removed, for example, by wet etching using hydrofluoric acid. Thus, an insulating film IF11 is formed to include the part of the insulating film IF1 covered with the cap insulating film CAP.

An insulating film OF1 comprised of, e.g., a silicon oxide film is formed, for example, by the thermal oxidation or CVD method to cover the gate electrode GEt and the part PT2 of the p-type well PW1 in the pixel region 1A. At this time, the insulating film OF1 is formed to cover the gate electrode GEL and the respective parts PT3 and PT4 of the p-type well PW2 in the peripheral circuit region 2A.

In the pixel region 1A and the peripheral circuit region 2A, the insulating film OF1 is etched back. In this way, an offset spacer OFt is formed of the part of the insulating film OF1 remaining over the side surface SSt2 of the gate electrode GEt in the pixel region 1A. Offset spacers OFL are formed of the insulating films OF1 remaining over the respective side surfaces SSL1 and SSL2 of the gate electrode GEL in the peripheral circuit region 2A.

In step S18, next, as shown in FIG. 13, for example, the photoresist film R3 is formed over the semiconductor substrate 1S in the pixel region 1A and the peripheral circuit region 2A, and exposed to light and developed by the photolithography technique, whereby the photoresist film R3 is patterned.

Specifically, in the pixel region 1A, the photoresist film R3 is formed over the cap insulating film CAP, the gate electrode GEt, and the part PT2 of the p-type well PW1. Further, in the peripheral circuit region 2A, the photoresist film R3 is formed over the part PT3 of the p-type well PW2, the gate electrode GEL, and the part PT4 of the p-type well PW2. Then, in the pixel region 1A, a part of the photoresist film R3 formed over the part PT2 of the p-type well PW1 is removed. In other words, the photoresist film R3 is patterned to expose the part PT2 of the p-type well PW1.

At this time, a part of the photoresist film R3 formed over the gate electrode GEL and the respective parts PT3 and PT4 of the p-type well PW2 is removed in the peripheral circuit region 2A. On the other hand, in the pixel region 1A, the part PT1 that is comprised of the n-type well NW and the p⁺-type semiconductor region PR is covered with the insulating film IF11, the cap insulating film CAP, and the photoresist film R3 to prevent implantation of the n-type impurity ions into the part PT1.

Thus, n-type impurity ions IM3 are implanted into the part PT2 of the p-type well PW1 using the gate electrode GEt and the offset spacer OFt formed at the side surface of the gate electrode GEt as a mask in the pixel region 1A with the cap insulating film CAP and the photoresist film R3 formed over the part PT1 comprised of the n-type well NW and the p⁺-type semiconductor region PR. Then, n-type impurity ions IM3 are also implanted into the parts PT3 and PT4 of the p-type well PW2 in the peripheral circuit region 2A, using the gate electrode GEL and the offset spacer OFL formed at each of the side surfaces SSL1 and SSL2 of the gate electrode GEL as masks with the cap insulating film CAP and the photoresist film R3 formed over the part PT1.

Thus, in the pixel region 1A, n-type impurity ions are further implanted into the n-type low-concentration semiconductor region NM formed in the part PT2 of the p-type well PW1. In the peripheral circuit region 2A, n-type impurity ions are further implanted into the n-type low-concentration semiconductor region NM formed in the upper layer portions of the parts PT3 and PT4 of the p-type well PW2. Thereafter, the photoresist film R3 is removed, for example, by the SPM cleaning or the asking process.

In the first embodiment, after forming the gate electrode GEt in the transfer transistor TX and forming the photodiode PD, and before forming the low-concentration semiconductor region NM contained in the drain region of the transfer transistor TX and the like, the cap insulating film CAP containing silicon and nitrogen is formed over the part PT1 comprised of the n-type well NW and the p+-type semiconductor region PR.

Thus, the n-type well NW and the p+-type semiconductor region PR can be prevented or suppressed from being damaged when implanting impurity ions for formation of the low-concentration semiconductor region NM, or when removing the photoresist film R2 or R3, for example, by the SPM cleaning or the asking process. Thus, the occurrence of crystal defects in the photodiode PD is prevented or suppressed, which can avoid or reduce generation of white spots due to the mis-lighting that is caused as the light is determined to be irradiated, even though the light is not irradiated.

When the p-channel MISFET is formed in the peripheral circuit region 2A, p-type impurity ions, such as boron (B), may be implanted into the peripheral circuit region 2A, thereby forming the p-type low-concentration semiconductor region.

Figure 14:
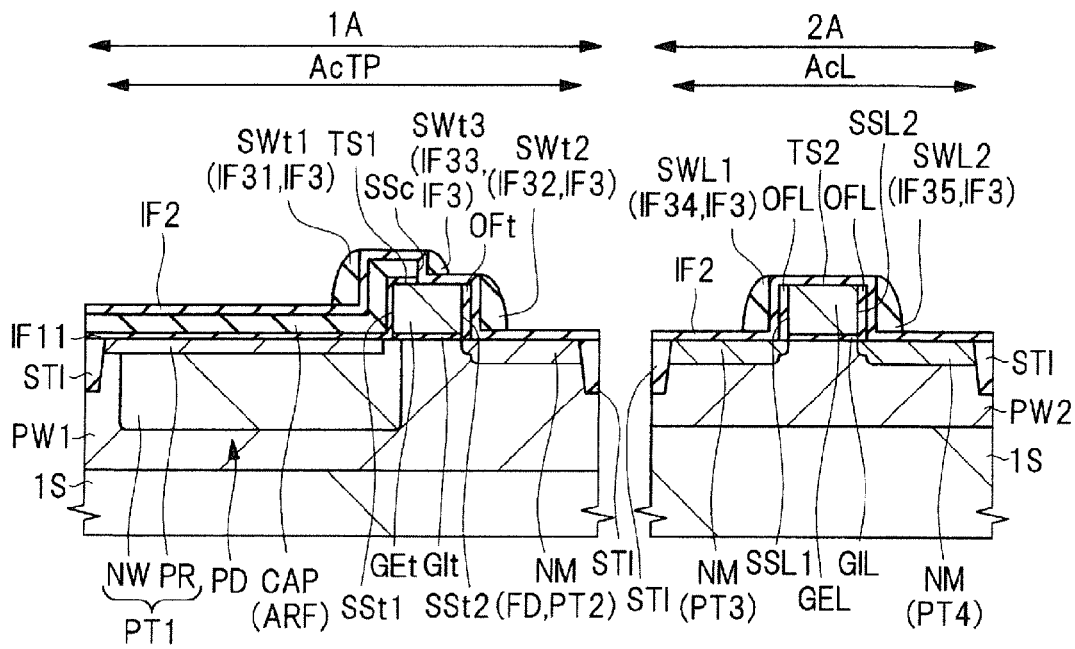
FIG. 14 is a cross-sectional view showing another manufacturing step for the semiconductor device in the first embodiment.

Then, as shown in FIG. 14, the sidewall spacer SWt1 is formed (in step S19 of FIG. 5).

In step S19, first, the insulating film IF2, for example, including a silicon oxide film is formed in the pixel region 1A to cover the cap insulating film CAP, the gate electrode GEt, the offset spacer OFt formed at the side surface SSt2 of the gate electrode GEt, and the part PT2 of the p-type well PW1, for example, by the thermal oxidation method or the CVD method. At this time, in the peripheral circuit region 2A, the insulating film IF2 is formed to cover the gate electrode GEL, the offset spacers OFL formed in the respective side surfaces SSL1 and SSL2 of the gate electrode GEL, and parts PT3 and PT4 of the p-type well PW2.

In step S19, next, an insulating film IF3, such as a silicon nitride film, containing silicon and nitride is formed over the insulating film IF2 in the pixel region 1A and the peripheral circuit region 2A, for example, by the CVD method. In this way, the insulating film IF3 is etched back in the pixel region 1A and the peripheral circuit region 2A.

Thus, in the pixel region 1A, the sidewall spacer SWt1 comprised of the insulating film IF31 as the part of the insulating film IF3 remaining over the side surface SSt1 is formed over the side surface SSt1 of the gate electrode GEt via the insulating film IF11, the cap insulating film CAP, and the insulating film IF2. In the pixel region 1A, the sidewall spacer SWt2 comprised of the insulating film IF32 as the part of the insulating film IF3 remaining over the side surface SSt2 is formed over the side surface SSt2 of the gate electrode GEt via the offset spacer OFt and the insulating film IF2.

Note that the sidewall spacer SWt3 comprised of the insulating film IF33 as the part of the insulating film IF3 remaining over the side surface SSc may be formed over the side surface SSc of the cap insulating film CAP on the side of the side surface SSt2 of the gate electrode GEt via the insulating film IF2.

The sidewall spacer SWL1 comprised of an insulating film IF34 as the part of the insulating film IF3 remaining over the side surface SSL1 is formed over the side surface SSL1 of the gate electrode GEL via the offset spacer OFL and the insulating film IF2 in the peripheral circuit region 2A. The sidewall spacer SWL2 comprised of an insulating film IF35 as the part of the insulating film IF3 remaining over the side surface SSL2 is formed over the side surface SSL2 of the gate electrode GEL via the offset spacer OFL and the insulating film IF2 in the peripheral circuit region 2A.

Figure 15:
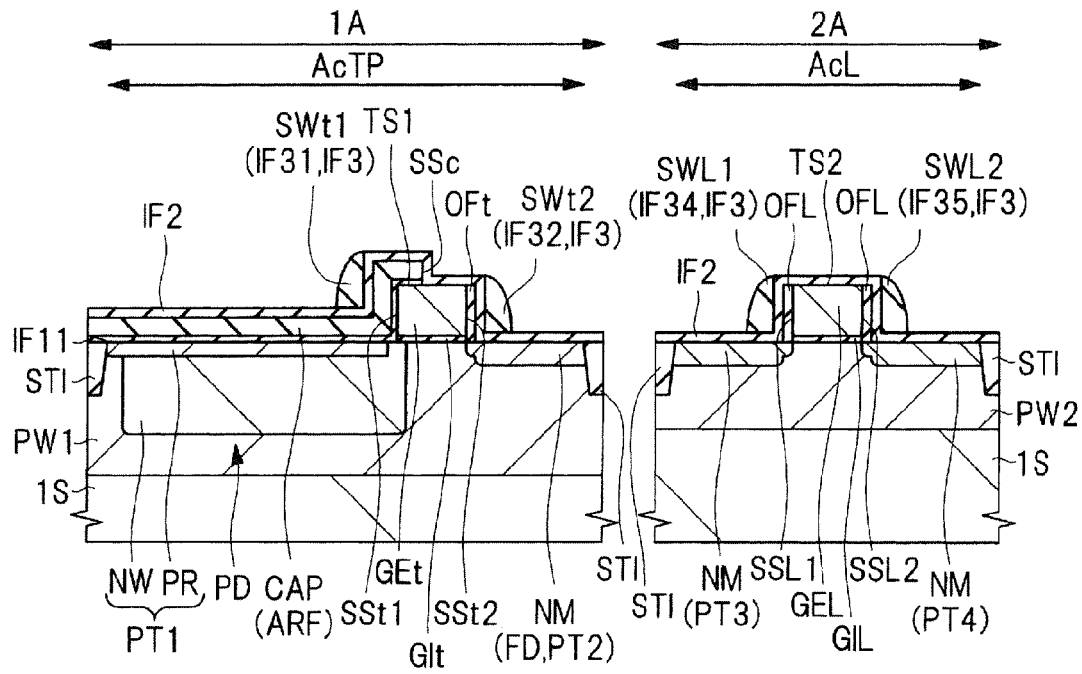
FIG. 15 is a cross-sectional view showing another manufacturing step for the semiconductor device in the first embodiment.

Note that by adjusting the conditions for etching back the insulating film IF3, as shown in FIG. 15, in the pixel region 1A, the insulating film IF3 over the side surface SSc of the cap insulating film CAP on the side of the side surface SSt2 of the gate electrode GEt can also be removed not to form the sidewall spacer SWt3 (see FIG. 14).

Figure 16:
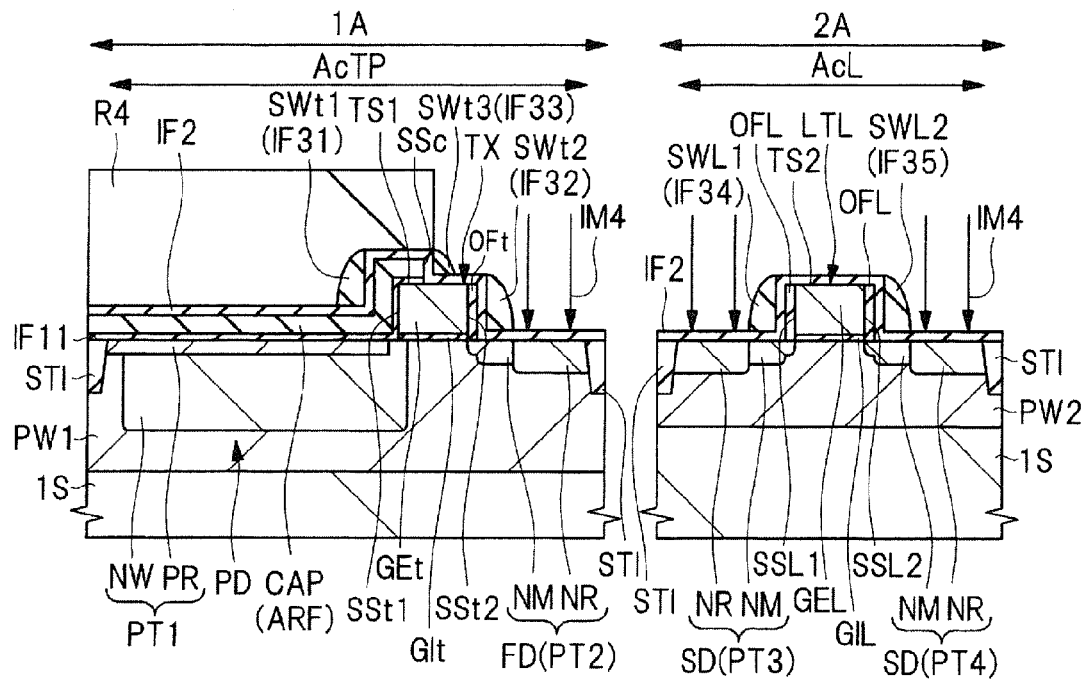
FIG. 16 is a cross-sectional view showing another manufacturing step for the semiconductor device in the first embodiment.

Then, as shown in FIG. 16, the n-type high-concentration semiconductor region NR is formed (in step S20 of FIG. 5).

In step S20, for example, the photoresist film R4 is formed over the semiconductor substrate 1S in the pixel region 1A and the peripheral circuit region 2A, and exposed to light and developed using the photolithography, thereby patterning the photoresist film R4.

Specifically, in the pixel region 1A, the photoresist film R4 is formed over the cap insulating film CAP, the gate electrode GEt, and the part PT2 of the p-type well PW1 via the insulating film IF2 and the respective sidewall spacers SWt1, SWt2, and SWt3. In the peripheral circuit region 2A, the photoresist film R4 is formed over the part P3 of the p-type well PW2, the gate electrode GEL, and the part P14 of the p-type well PW2 via the insulating film IF2 and the respective sidewall spacers SWL1 and SWL2. Then, in the pixel region 1A, a part of the photoresist film R4 formed over the part PT2 of the p-type well PW1 is removed. In other words, the photoresist film R4 is patterned to expose the part of the insulating film IF2 formed over the part PT2 of the p-type well PW1.

At this time, a part of the photoresist film R4 formed over the gate electrode GEL and the respective parts PT3 and PT4 of the p-type well PW2 is removed in the peripheral circuit region 2A. On the other hand, in the pixel region 1A, the part PT1 that is comprised of the n-type well NW and the p+-type semiconductor region PR is covered with the insulating film IF11, the cap insulating film CAP, the insulating film IF2, and the photoresist film R4 to prevent implantation of the n-type impurity ions into the part PT1.

In the pixel region 1A, n-type impurity ions IM4 are implanted into the part PT2 of the p-type well PW1 using the sidewall spacer SWt2 formed over the side surface SSt2 of the gate electrode GEt as a mask with the cap insulating film CAP and the photoresist film R4 formed over the part PT1 comprised of the n-type well NW and the p+-type semiconductor region PR. In the peripheral circuit region 2A, n-type impurity ions IM4 are implanted into the parts PT3 and PT4 of the p-type well PW2 using the sidewall spacers SWL1 and SWL2 formed at the respective side surfaces SSL1 and SSL2 of the gate electrode GEL as a mask with the cap insulating film CAP and the photoresist film R4 formed over the part PT1.

Thus, in the pixel region 1A, the n-type high-concentration semiconductor region NR is formed in the upper layer portion of the part PT2 of the p-type well PW1 that is opposed to the gate electrode GEt with the sidewall spacer SWt2 sandwiched. The n-type high-concentration semiconductor region NR is the drain region in the transfer transistor TX, or a semiconductor region as the floating diffusion FD. That is, the transfer transistor TX is formed by the gate electrode GEt and the drain region including the n-type low-concentration semiconductor region NM and the high-concentration semiconductor region NR.

Thus, in the peripheral circuit region 2A, the n-type high-concentration semiconductor region NR is formed in the upper layer portion of the part PT3 of the p-type well PW2 that is opposed to the gate electrode GEL with the sidewall spacer SWL1 sandwiched. The n-type high-concentration semiconductor region NR is formed in the upper layer portion of the part PT4 of the p-type well PW2 that is opposed to the gate electrode GEL with the sidewall spacer SWL2 sandwiched. The transistor LTL is formed of the gate electrode GEL and the n-type high-concentration semiconductor region NR as the source/drain region SD. Thereafter, the photoresist film R4 is removed, for example, by the SPM cleaning or asking process.

When the p-channel MISFET is formed in the peripheral circuit region 2A, p-type impurity ions, such as boron (B), may be implanted into the peripheral circuit region 2A, thereby forming the p-type high-concentration semiconductor region as the source/drain region of the p-channel MISFET.

Thereafter, the activating annealing is performed to activate impurities implanted in the processes described above. The order of implantation of the respective impurities is not limited to that of the above-mentioned processes. Regarding a plurality of the same conduction type of semiconductor regions, impurities can be implanted at the same time in one step, thereby adjusting the implantation steps for the respective impurities.

Figure 17:
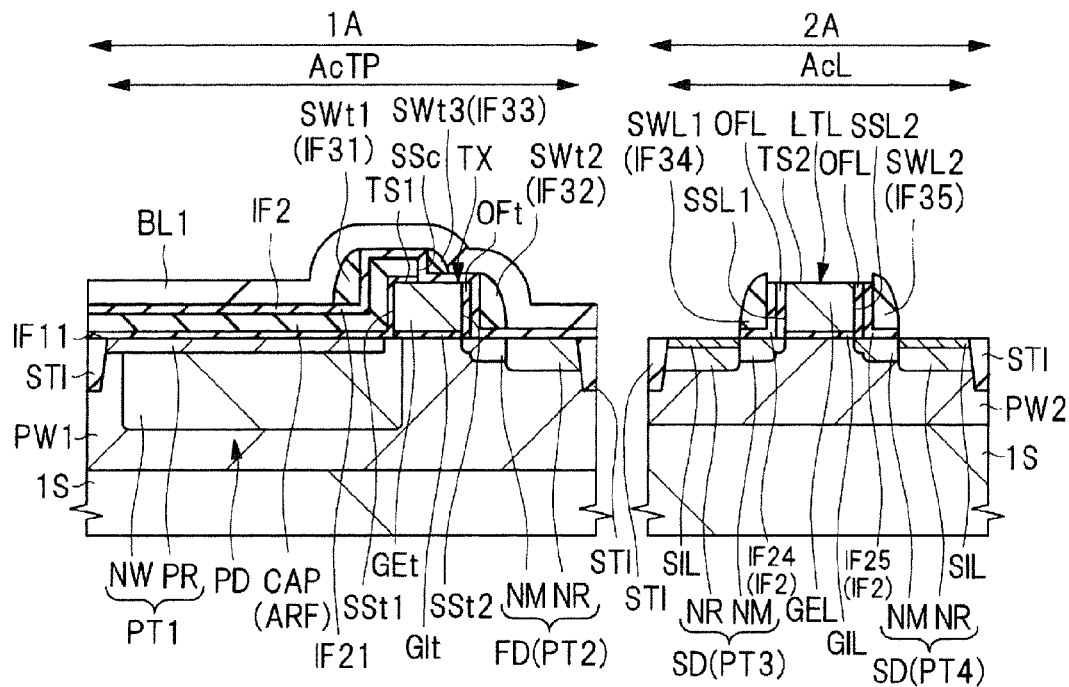
FIG. 17 is a cross-sectional view showing another manufacturing step for the semiconductor device in the first embodiment.

Then, as shown in FIG. 17, a silicide blocking film BL1 and a silicide layer SIL are formed (in step S21 of FIG. 6).

In the process at step S21, first, the silicide blocking film BL1 is formed of, e.g., a silicon oxide film over the semiconductor substrate 1S in a region without having the silicide layer. On the other hand, in a region with the silicide layer SIL formed therein, the silicide blocking film BL1 is not formed over the semiconductor substrate 1S.

Specifically, in the pixel region 1A and the peripheral circuit region 2A, the silicide blocking film BL1 made of, e.g., a silicon oxide film is formed over the semiconductor substrate 1S, and then in the region where the silicide layer SIL is to be formed, the silicide blocking film BL1 is removed by wet etching using, e.g., a hydrofluoric acid. At this time, in the peripheral circuit region 2A, for example, a part of the silicide blocking film BL1 covering the n-type high-concentration semiconductor region NR of the transistor LTL is removed. Parts of the insulating films IF2 exposed from the sidewall spacers SWL1 and SWL2 are removed. The insulating film IF24 is formed to include a part of the insulating film IF2 covered with the sidewall spacer SWL1, and the insulating film IF25 is formed to include a part of the insulating film IF2 covered with the sidewall spacer SWL2.

In the process of the step S21, a metal film (not shown) is formed of, e.g., a nickel (Ni) film over the semiconductor substrate 1S by using a sputtering method, etc. A metal film, such as a nickel film, a titanium (Ti) film, a cobalt (Co) film, or a platinum (Pt) film, or an alloy film comprised of these metals may be used as the metal film.

A heat treatment is applied to the semiconductor substrate 1S, whereby in the peripheral circuit region 2A, the metal film (not shown) reacts with silicon included in the n-type high-concentration semiconductor region NR, thereby forming the silicide layer SIL made of, e.g., a nickel silicide layer. Thereafter, the unreacted metal film (not shown) is removed. The silicide layer SIL can reduce the coupling resistance between the n-type high-concentration semiconductor region NR and the plug.

Although not shown in FIG. 17, in the peripheral circuit region 2A, the silicide layer may be formed over the upper surface of the gate electrode GEL. Alternatively, in the pixel region 1A, the silicide layer SIL may be formed over the upper surface of the n-type high-concentration semiconductor region NR, which is the drain region of the transfer transistor TX.

Figure 18:
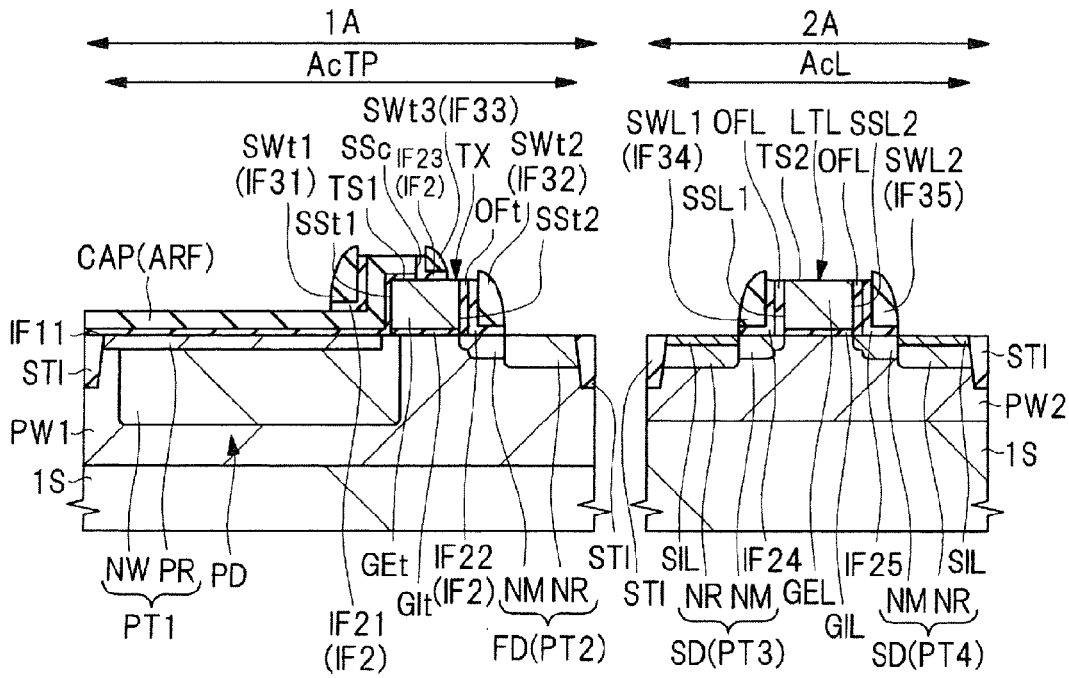
FIG. 18 is a cross-sectional view showing another manufacturing step for the semiconductor device in the first embodiment.

Then, as shown in FIG. 18, a silicide blocking film BL1 is removed (in step S22 of FIG. 6). In step S22, the silicide blocking film BL1 is removed, for example, by wet etching using hydrofluoric acid. At this time, in the pixel region 1A, the parts of the insulating film IF2 exposed from the sidewalls spacers SWt1, SWt2, and SWt3 are also removed. The insulating film IF21 is formed to include a part of the insulating film IF2 covered with the sidewall spacer SWL1. The insulating film IF22 is formed to include a part of the insulating film IF2 covered with the sidewall spacer SWt2. The insulating film IF23 is formed to include a part of the insulating film IF2 covered with the sidewall spacer SWt3.

Figure 19:
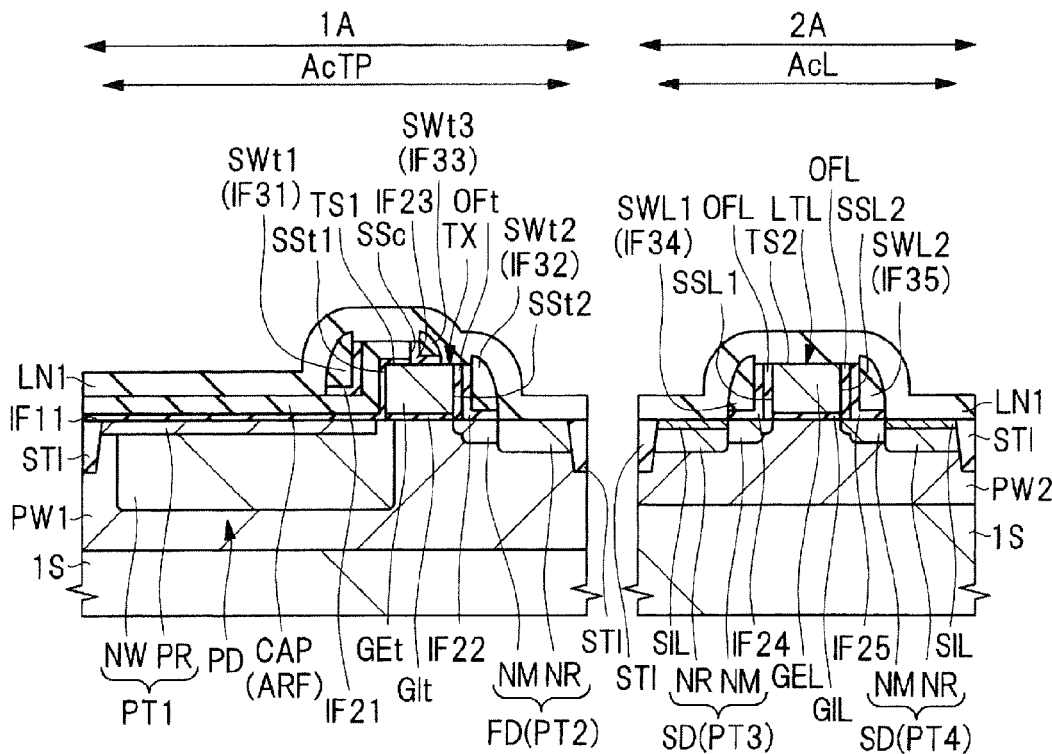
FIG. 19 is a cross-sectional view showing another manufacturing step for the semiconductor device in the first embodiment.

Then, as shown in FIG. 19, the liner film LN1 is formed (in step S23 of FIG. 6). In step S23, in the pixel region 1A, the liner film LN1 is formed as the insulating film, for example, by the CVD method to cover the cap insulating film CAP, the gate electrode GEt, the sidewall spacers SWt1, SWt2, and SWt3, and the n-type high-concentration semiconductor region NR formed in the upper layer portion of the part PT2 in the p-type well PW1. In the peripheral circuit region 2A, the liner film LN1 is formed as the insulating film, for example, by the CVD method to cover the n-type high-concentration semiconductor region NR formed over the gate electrode GEL, the sidewall spacers SWL1 and SWL2, and the upper layer portions of the parts PT3 and PT4 of the p-type well PW2. That is, the liner film LN1 is formed to cover the photodiode PD, the transfer transistor TX, and the transistor LTL. The liner film LN1 is comprised of, for example, a silicon nitride film.

Then, as shown in FIG. 4, the interlayer insulating film IL1 is formed (in step S24 of FIG. 6). In step S24, the interlayer insulating film IL1 is formed over the liner film LN1 in the pixel region 1A and the peripheral circuit region 2A.

For example, a silicon oxide film is deposited over the liner film LN1 by the CVD method using a TEOS gas as a raw material gas. Then, the upper surface of the interlayer insulating film IL1 is planarized by the chemical mechanical polishing (CMP) method or the like as needed.

Then, as shown in FIG. 4, the contact hole CHt is formed (in step S25 of FIG. 6). In step S25, in the pixel region 1A, the contact hole CHt is formed by patterning the interlayer insulating film IL1 and the liner film LN1. In the peripheral circuit region 2A, a contact hole CHL is formed by patterning the interlayer insulating film IL1 and the liner film LN1.

Specifically, the contact hole CHt is formed above the n-type high-concentration semiconductor region NR of the transfer transistor TX to reach the n-type high-concentration semiconductor region NR through the interlayer insulating film IL1 and the liner film LN1. The contact hole CHL is formed above the n-type high-concentration semiconductor region NR of the transistor LTL to reach the silicide layer SIL formed at the upper surface of the n-type high-concentration semiconductor region NR through the interlayer insulating film IL1 and the liner film LN1.

At this time, the contact holes (not shown) are formed above the gate electrodes GEt and GEL.

Then, as shown in FIG. 4, the plug PGt is formed (in step S26 of FIG. 6). In step S26, a conductive film is embedded in the contact hole CHt in the pixel region 1A, thereby forming the plug PGt. In the peripheral circuit region 2A, a conductive film is embedded in the contact hole CHL, thereby forming the plug PGL.

First, a barrier conductive film is formed over the interlayer insulating film IL1 including the bottom surface and inner walls of each of the contact holes CHt and CHL. The barrier conductive film is comprised of a titanium film and a titanium nitride film formed over the titanium film. The barrier conductive film can be formed, for example, by the sputtering. The barrier conductive film has the so-called diffusion barrier properties, for example, that prevent diffusion of tungsten serving as material for the main conductive film to be embedded in the following step, into silicon.

The main conductive film comprised of the tungsten film is formed over the barrier conductive film to fill in each of the contact holes CHt and CHL. The main conductive film can be formed, for example, by using the CVD method. Unnecessary parts of the main conductive film and barrier conductive film formed over the interlayer insulating film IL1 can be removed, for example, by the CMP method to form the respective plugs PGt and PGL.

Then, as shown in FIG. 3, the interlayer insulating films IL2 to IL4 and the wirings M1 to M3 are formed over the interlayer insulating film IL1. For example, a laminated film comprised of a silicon nitride film and a silicon oxide film is formed as the interlayer insulating film IL2 over the interlayer insulating film IL1 by the CVD method or the like. Then, the contact hole is formed to reach the wiring M1 while passing through the interlayer insulating film IL2. Next, a laminated film comprised of a tantalum (Ta) film and a tantalum nitride (TaN) film formed thereover is deposited as a barrier film over the interlayer insulating film IL2 covering the inside of the contact hole by the sputtering or the like. Then, a thin copper (Cu) film is deposited as a seed film (not shown) over the barrier film by the sputtering or the like, and another copper film is deposited over the seed film by the electrolytic plating or the like. Then, unnecessary parts of the barrier film, the seed film, and the copper film over the interlayer insulating film IL2 are removed by CMP method or the like. In this way, the barrier film, the seed film, and the copper film can be embedded in the wiring trench to form the wiring M1 (by the single damascene method).

In the following, likewise, as shown in FIG. 3, the interlayer insulating film IL3 is formed over the interlayer insulating film IL2 with the wiring M1 formed therein. The wiring M2 is formed in the interlayer insulating film IL3. The interlayer insulating film IL4 is formed over the interlayer insulating film IL3 with the wiring M2 formed therein. The wiring M3 is formed in the interlayer insulating film IL4.

In the first embodiment, the wirings M1 and M2 are formed of copper wirings by the damascene method by way of example, but are not limited thereto. The wirings M1 and M2 may be formed using aluminum by the patterning method.

Then, as shown in FIG. 3, the microlens ML is formed in a region planarly covering the pixel region 1A, over the interlayer insulating film IL4 as the uppermost layer. That is, the microlens ML is formed as the on-chip lens to overlap with the n-type well NW included in the photodiode PD in the planar view. As illustrated in FIG. 3, a passivation film PF and a color filter CL may be formed from the lower side in this order between the microlens ML and the interlayer insulating film IL4.

In the steps described above, as shown in FIG. 3, the semiconductor device of the first embodiment can be manufactured.

In the first embodiment, for example, the conduction type of each of the semiconductor substrate 1S, the p-type wells PW1 and PW2, the n-type well NW, the $p^+$-type semiconductor region PR, the n-type low-concentration semiconductor region NM, and the n-type high-concentration semiconductor region NR may be changed to the opposite one in a collective manner (the same goes for the following respective modified examples and respective embodiments).

<First Modified Example of Method for Manufacturing Semiconductor Device>

Next, a method for manufacturing a semiconductor device in a first modified example of the first embodiment will be described below. FIGS. 20 to 23 are cross-sectional views showing manufacturing steps for the semiconductor device in the first modified example of the first embodiment.

The manufacturing procedure for the semiconductor device in the first modified example is provided by changing the steps described with reference to FIGS. 10 and 11 (steps S17 and S18 of FIG. 5) in the manufacturing procedure for the semiconductor device in the first embodiment.

Figure 20:
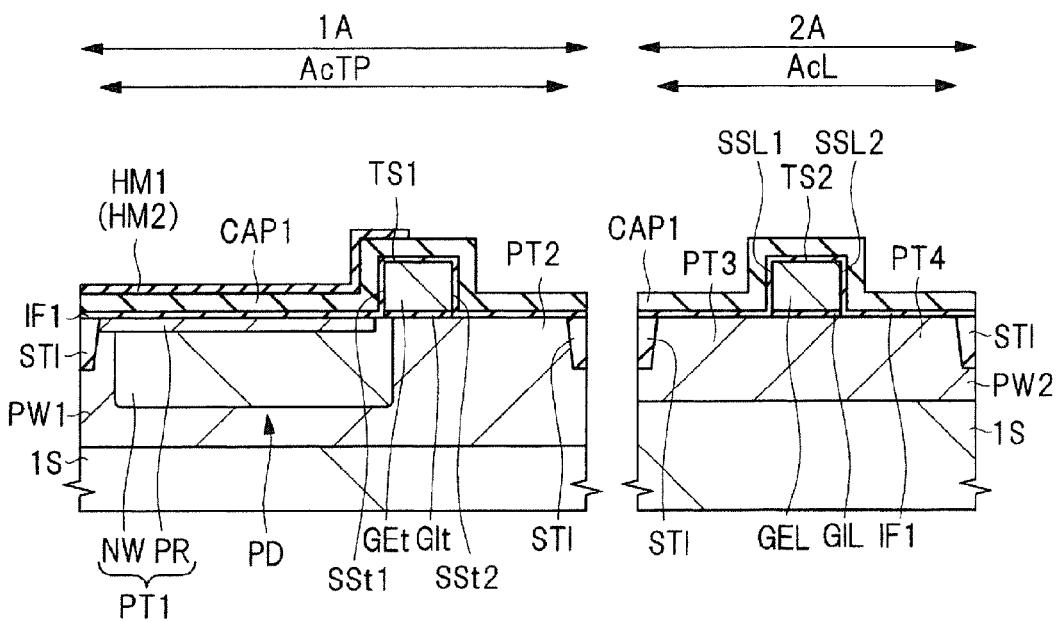
FIG. 20 is a cross-sectional view showing a manufacturing step for a semiconductor device in a first modified example of the first embodiment.

In the first modified example, after the steps (steps S15 and S16 in FIG. 5) described using FIG. 9 in the first embodiment, as shown in FIG. 20, a hard mask film HM1 comprised of, e.g., a silicon oxide film is formed in a region where the cap insulating film CAP (see FIG. 21) is to be formed.

Specifically, in the pixel region 1A and the peripheral circuit region 2A, an insulating film HM2 made of, e.g., a silicon oxide film is formed over the insulating film CAP1, for example, by the CVD method. The insulating film HM2 is patterned by the photolithography and etching techniques, thereby forming the hard mask film HM1 while leaving the insulating film HM2 in the region where the cap insulating film CAP is to be formed. That is, the hard mask film HM1 is formed over the part PT1 comprised of the n-type well NW and the $p^+$-type semiconductor region PR, and the part of the gate electrode GEt on the side of the photodiode PD via the insulating film CAP1. On the other hand, in a region other than the region with the cap insulating film CAP formed thereat, the insulating film HM2 is removed.

Figure 21:
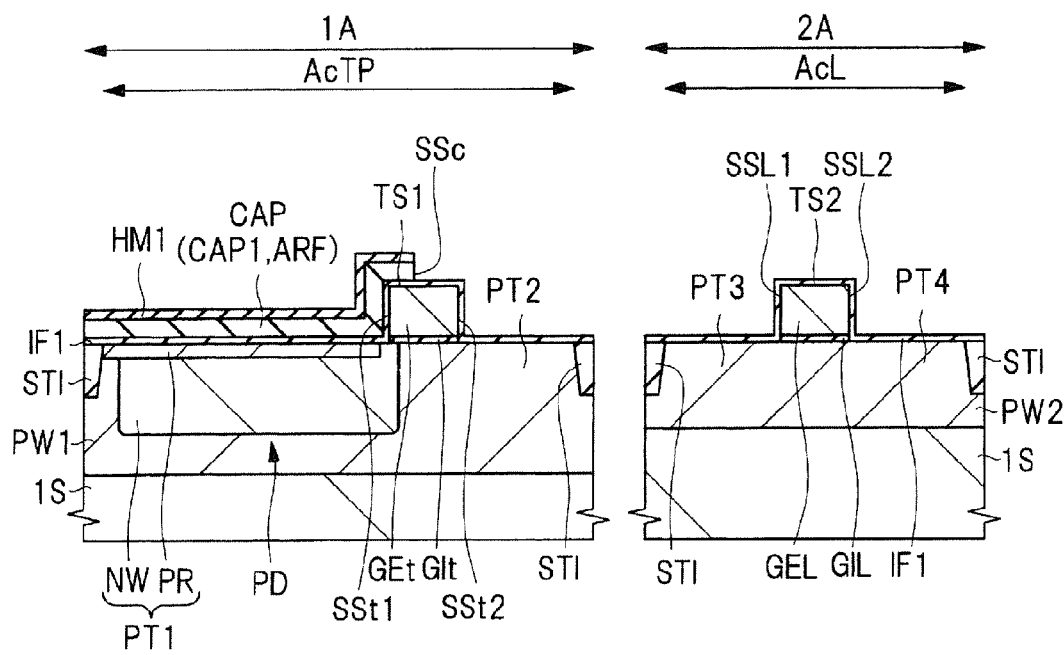
FIG. 21 is a cross-sectional view showing another manufacturing step for a semiconductor device in the first modified example of the first embodiment.
Figure 22:
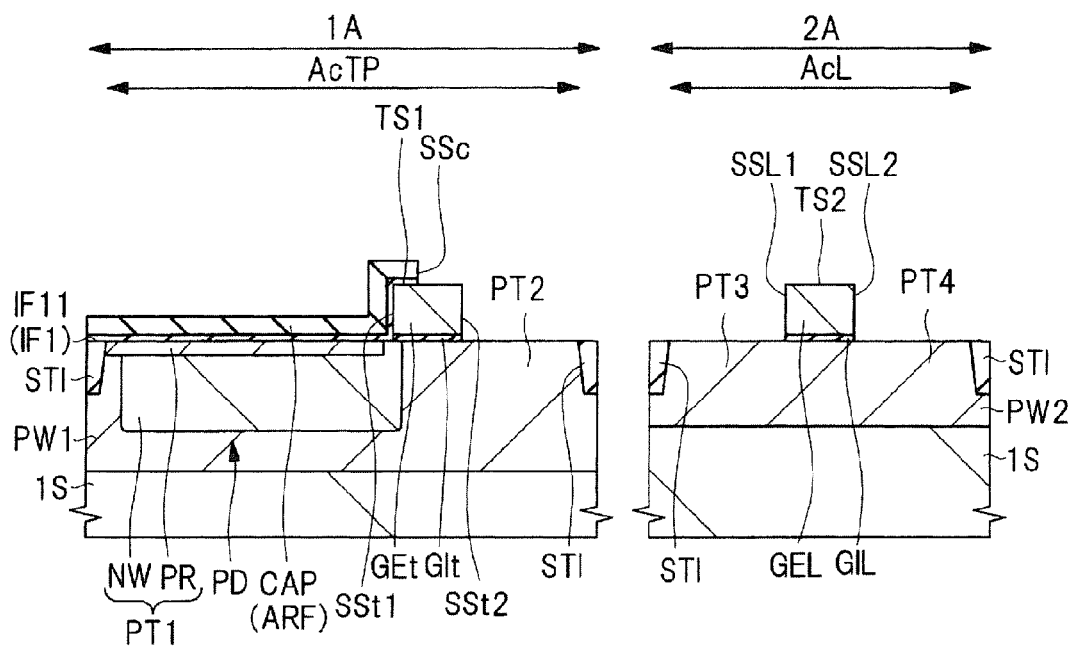
FIG. 22 is a cross-sectional view showing another manufacturing step for a semiconductor device in the first modified example of the first embodiment.

Then, in the first embodiment, the same process as that in the step described using FIG. 10 (in step S17 of FIG. 5) is performed to pattern the insulating film CAP1 as shown in FIGS. 21 and 22.

Note that in the first modified example, as shown in FIG. 21, the insulating film CAP1 is etched by the RIE method or the like in the pixel region 1A and the peripheral circuit region 2A, using the hard mask film HM1 as a mask. Thus, in the pixel region 1A, the cap insulating film CAP is formed over the part PT1 comprised of the n-type well NW and the $p^+$-type semiconductor region PR and over the part of the gate electrode GEt on the photodiode PD side, while leaving the insulating film CAP1.

Thereafter, as shown in FIG. 22, the hard mask film HM1 comprised of a silicon oxide film and maintained over the cap insulating film CAP is removed, for example, by wet etching using hydrofluoric acid. In this way, the cap insulating film CAP is exposed. At this time, the part of the insulating film IF1 comprised of the silicon oxide film and exposed from the cap insulating film CAP is also removed in the pixel region 1A and the peripheral circuit region 2A. At this time, the insulating film IF11 comprised of the part of the insulating film IF1 covered with the cap insulating film CAP is formed.

Figure 23:
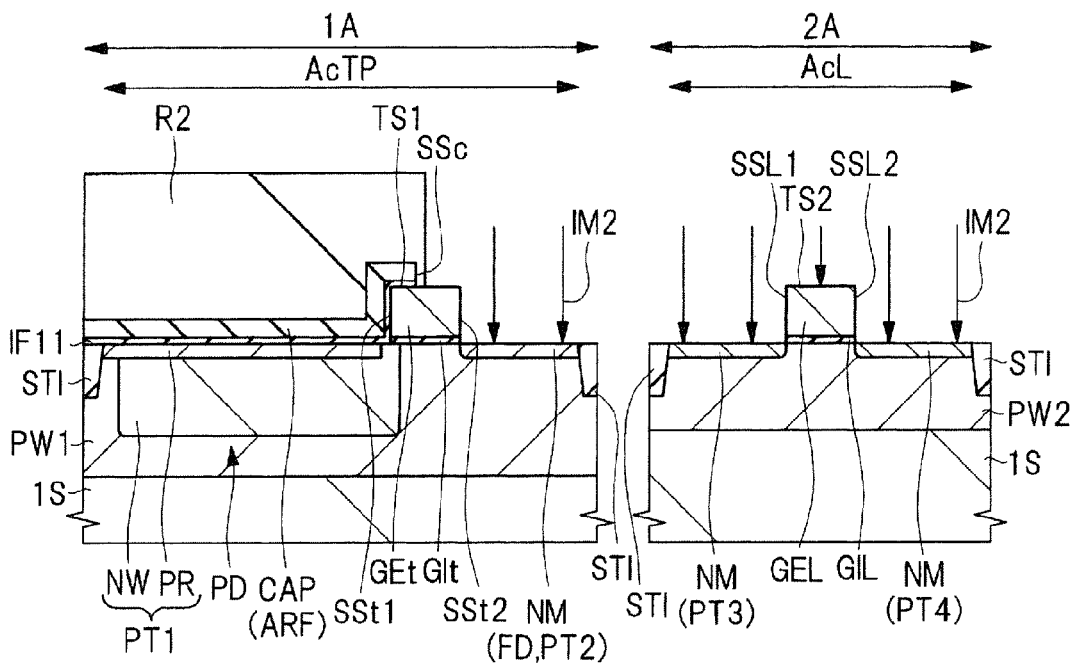
FIG. 23 is a cross-sectional view showing another manufacturing step for a semiconductor device in the first modified example of the first embodiment.

Then, the same process as that in the step described using FIG. 11 (part of the process in step S18 of FIG. 5) is performed to implant n-type impurity ions IM2 as shown in FIG. 23. Note that in the first modified example, the same process as that in the step described using FIG. 11 is performed to thereby implant n-type impurity ions using the gate electrodes GEt and GEL as masks. At this time, as shown in FIG. 23, the part of the insulating film IF1 exposed from the cap insulating film CAP (see FIG. 21) is removed.

The first modified example patterns the insulating film CAP1 using the hard mask film HM1, and thus can improve the shape accuracy, compared to the case of patterning the insulating film CAP1 using the photoresist film. Alternatively, the insulating film IF1 over the side surface SSt2 of the gate electrode GEt is removed, so that impurity ions IM2 can be implanted in more alignment with the gate electrode GEt when implanting the impurity ions into the part PT2 of the p-type well PW1. The insulating film IF1 over each of the side surfaces SSL1 and SSL2 of the gate electrode GEL is removed, so that impurity ions IM2 can be implanted in more alignment with the gate electrode GEL when implanting the impurity ions into the parts PT3 and PT4 of the p-type well PW2.

<Second Modified Example of Method for Manufacturing Semiconductor Device>

Figure 24:
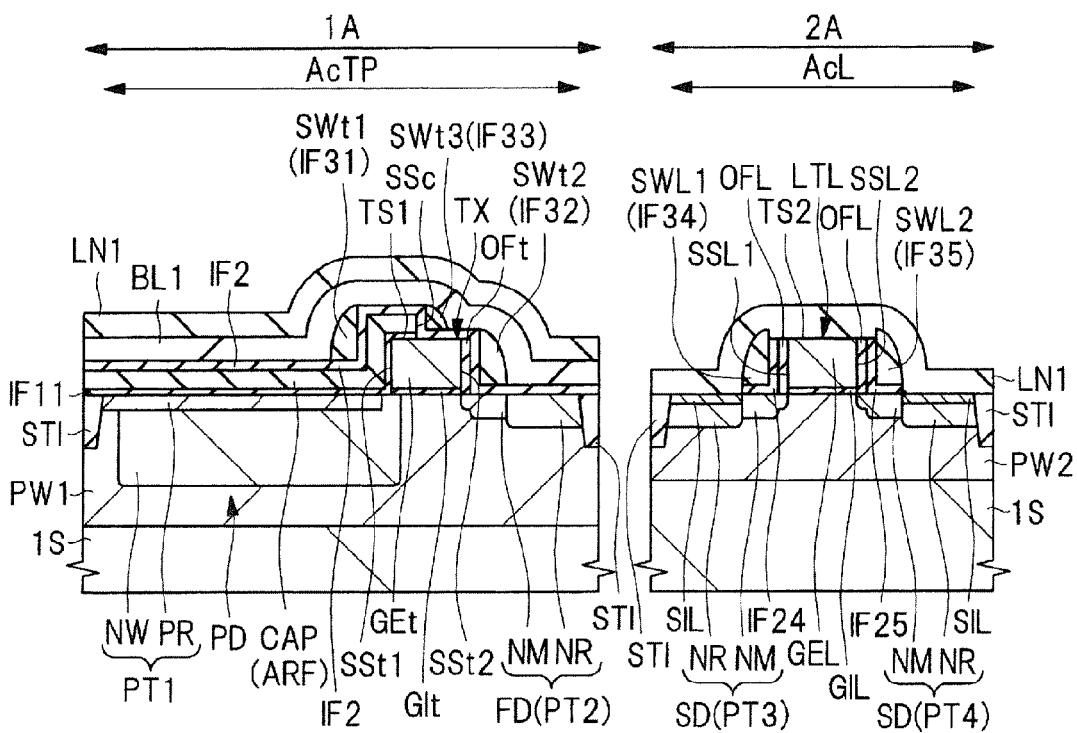
FIG. 24 is a cross-sectional view showing a manufacturing step for a semiconductor device in a second modified example of the first embodiment.

Next, a second modified example of the method for manufacturing the semiconductor device in the first embodiment will be described below. FIG. 24 is a cross-sectional view showing a manufacturing step for a semiconductor device in the second modified example of the first embodiment.

The manufacturing procedure for the semiconductor device in the second modified example is provided by abolishing the step described with reference to FIG. 18 (step S22 of FIG. 6) from the manufacturing procedure for the semiconductor device in the first embodiment. That is, after forming the silicide layer SIL, the silicide blocking film BL1 is not removed. When the process in the step described using FIG. 19 (in step S23 of FIG. 6) is performed, as shown in FIG. 24, the liner film LN1 is formed over the silicide blocking film BL1 in the pixel region 1A.

The second modified example does not perform the step of removing the silicide blocking film BL1, and thus can decrease the number of steps in the manufacturing procedure for the semiconductor device.

<Third Modified Example of Method for Manufacturing Semiconductor Device>

Figure 25:
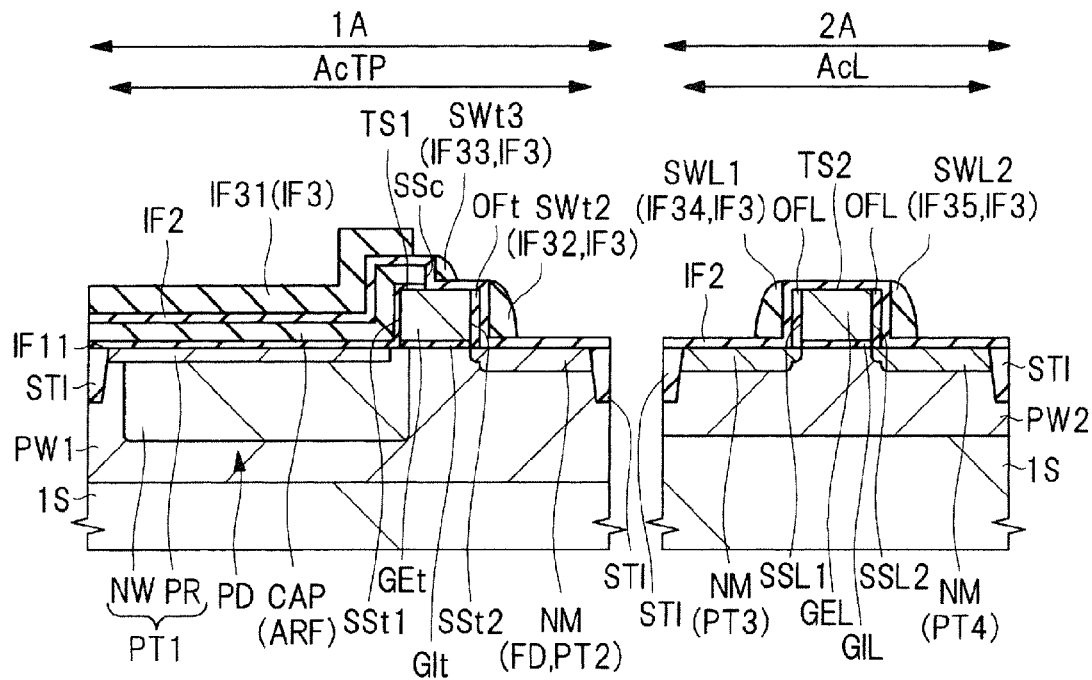
FIG. 25 is a cross-sectional view showing a manufacturing step for a semiconductor device in a third modified example of the first embodiment.

Next, a third modified example of the method for manufacturing a semiconductor device in the first embodiment will be described below. FIG. 25 is a cross-sectional view showing the manufacturing step for the semiconductor device in the third modified example of the first embodiment.

The manufacturing procedure for the semiconductor device in the third modified example is provided by changing the step described with reference to FIG. 14 (steps S19 of FIG. 5) in the manufacturing procedure for the semiconductor device in the first embodiment.

In the third modified example, after the step (step S18 in FIG. 5) described using FIG. 13 in the first embodiment, a step corresponding to the step described using FIG. 14 (step S19 of FIG. 5) is performed to form the sidewall spacers SWt2, SWt3, SWL1, and SWL2 as shown in FIG. 25. Note that in the step of forming the sidewall spacers SWt2, SWt3, SWL1, and SWL2, the sidewall spacer SWt1 (see FIG. 14) is not formed unlike the first embodiment.

Specifically, in the same way as the step described using FIG. 14 (step S19 of FIG. 5), the insulating film IF3 comprised of, e.g., a silicon nitride film is formed, and then a photoresist film (not shown) is formed to cover the parts of the insulating films IF2 and IF3 located above the cap insulating film CAP. Then, the insulating film IF3 is etched back with the parts of the insulating films IF2 and IF3 above the cap insulating film CAP covered with the photoresist film.

Thus, when forming the sidewall spacer SWt2 including the insulating film IF32 and the sidewall spacer SWL1 including the insulating film IF34 or the like, the sidewall spacer SWt1 (see FIG. 14) is not formed, and as shown in FIG. 25, the parts of the insulating films IF2 and IF3 are remained to be positioned above the cap insulating film CAP. The insulating film IF31 comprised of the insulating film IF3 is formed over the cap insulating film CAP in the same layer as the insulating film IF32 via the insulating film IF2.

In the third modified example, before forming the n-type high-concentration semiconductor region NR, the insulating film IF31 containing silicon and nitrogen is formed to cover the part PT1 comprised of the n-type well NW and the $p^+$-type semiconductor region PR, in addition to the cap insulating film CAP containing silicon and nitrogen. That is, the two-layered insulating films comprised of the cap insulating film CAP containing silicon and nitrogen and the insulating film IF31 are formed over the part PT1 comprised of the n-type well NW and the $p^+$-type semiconductor region PR. Note that the insulating film IF32 or the like comprised of the insulating film IF3 also contains silicon and nitrogen.

This arrangement can increase the thickness of the insulating film containing silicon and nitrogen, which is formed over the part PT1 comprised of the n-type well NW and the $p^+$-type semiconductor region PR. Thus, the n-type well NW and the $p^+$-type semiconductor region PR can be prevented or suppressed from being damaged when implanting impurity ions for formation of the high-concentration semiconductor region NR (see FIG. 16), or when removing the photoresist film R4 (see FIG. 16), for example, by the SPM cleaning or the asking process.

Therefore, the occurrence of crystal defects in the photodiode is prevented or suppressed, which can more effectively avoid or reduce generation of white spots due to the mis-lighting that is caused as the light is determined to be irradiated, even though the light is not irradiated, as compared to the first embodiment.

<Damage to Photodiode>

Next, the damage to the photodiode when forming the transistor in the pixel region and the peripheral circuit region will be described below by comparison with a manufacturing method of a semiconductor device in a comparative example. FIGS. 26 to 29 are cross-sectional views showing manufacturing steps for the semiconductor device in the comparative example.

Figure 26:
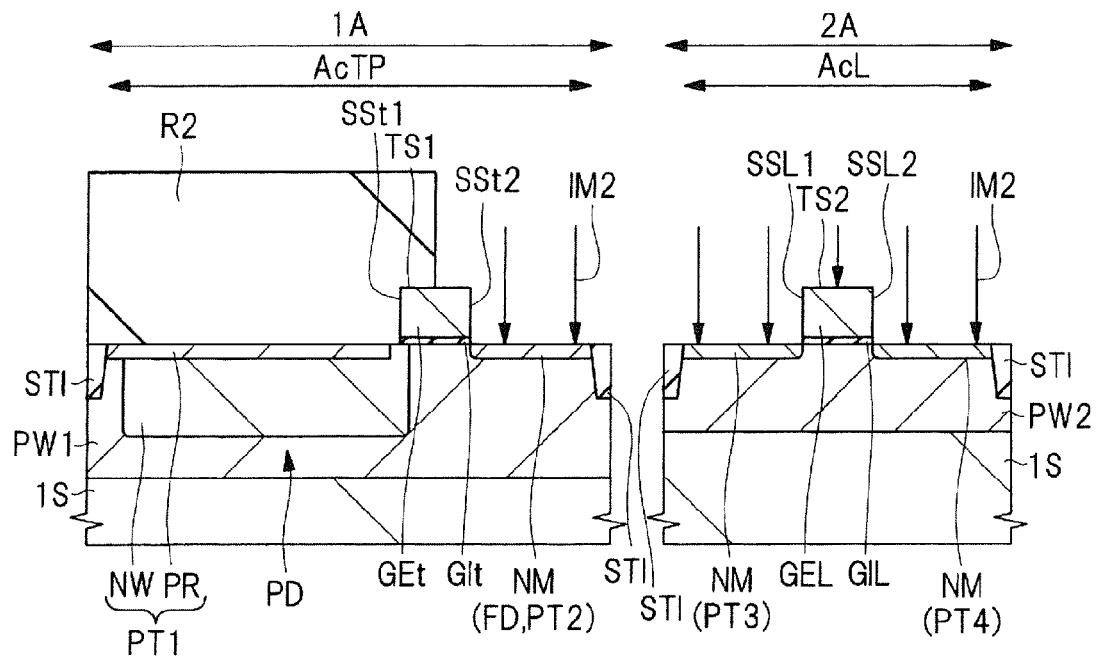
FIG. 26 is a cross-sectional view showing a manufacturing step for a semiconductor device in a comparative example.

In the comparative example, after the step corresponding to the step (step S14 in FIG. 5) described using FIG. 8 in the first embodiment, as shown in FIG. 26, a step corresponding to the step (part of the step S18 in FIG. 5) described using FIG. 11 in the first embodiment is performed without forming the cap insulating film CAP (see FIG. 10). At this time, the n-type impurity ions IM2 are implanted while the part PT1 comprised of the n-type well NW and the $p^+$-type semiconductor region PR is covered with the photoresist film R2, but not covered with the cap insulating film CAP (see FIG. 10). Thereafter, the photoresist film R2 is removed, for example, by the SPM cleaning or ashing process.

Figure 27:
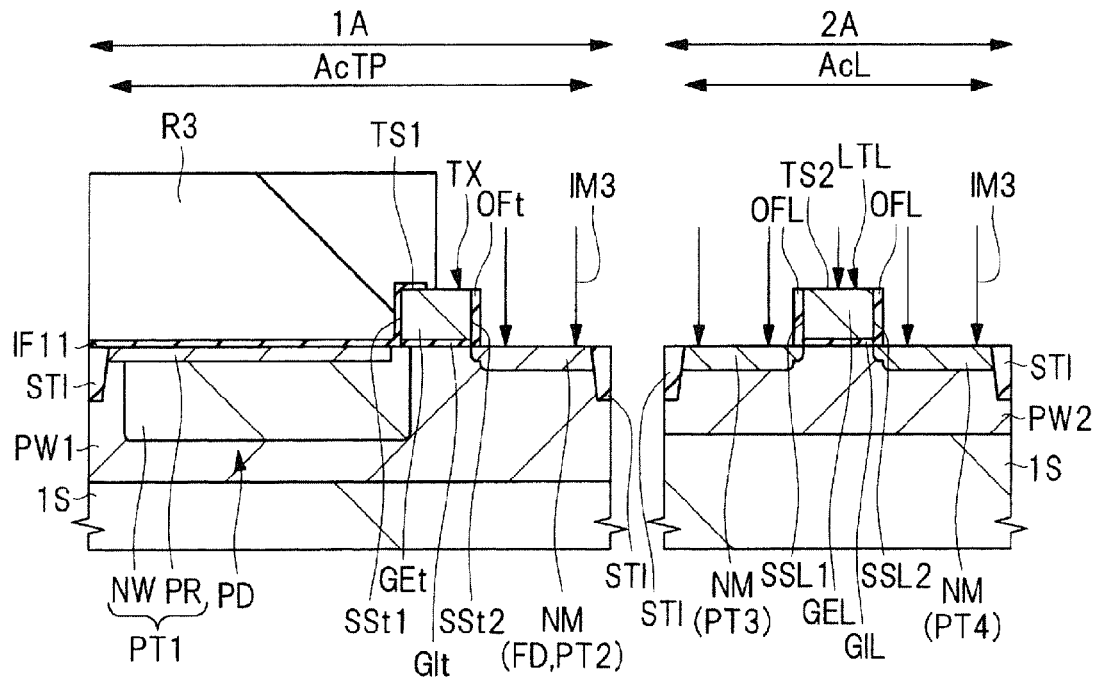
FIG. 27 is a cross-sectional view showing another manufacturing step for the semiconductor device in the comparative example.

In the comparative example, next, as shown in FIG. 27, a step corresponding to the step (the step S18 in FIG. 5) described using FIG. 13 in the first embodiment is performed. At this time, the n-type impurity ions IM3 are implanted while the part PT1 comprised of the n-type well NW and the p$^+$-type semiconductor region PR is covered with the insulating film IF11 and the photoresist film R3, but not covered with the cap insulating film CAP (see FIG. 10). Thereafter, the photoresist film R3 is removed, for example, by the SPM cleaning or ashing process.

Figure 28:
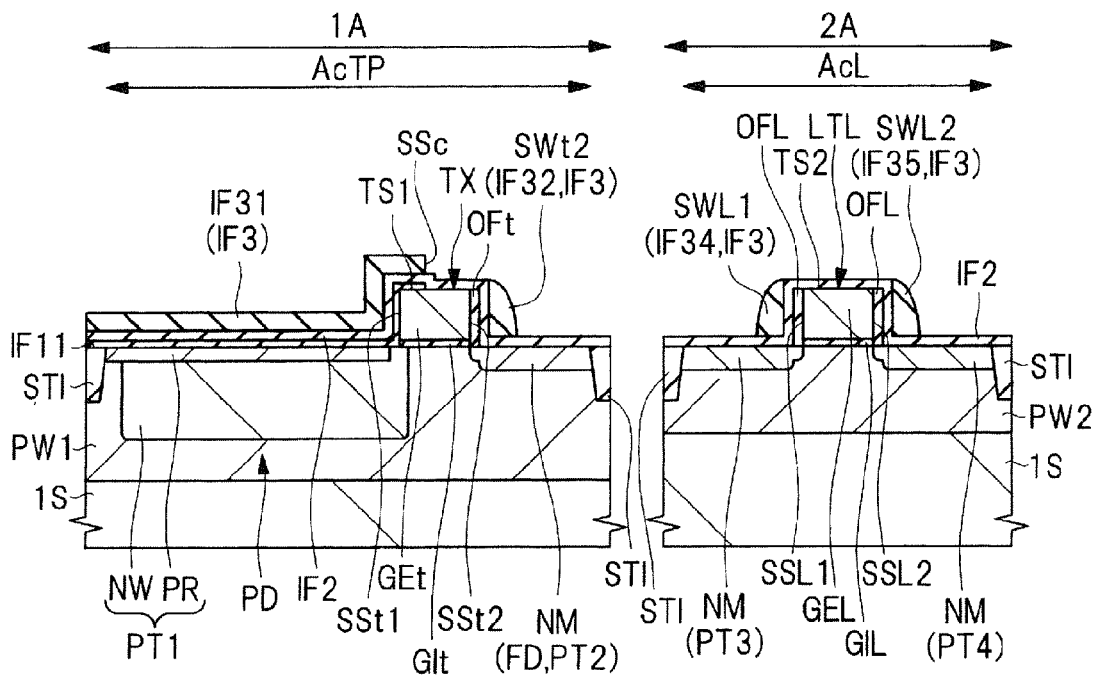
FIG. 28 is a cross-sectional view showing another manufacturing step for the semiconductor device in the comparative example.

In the comparative example, next, as shown in FIG. 28, a step corresponding to the step (part of the step S19 in FIG. 5) described using FIG. 14 in the first embodiment is performed. At this time, the insulating film IF2 and the insulating film IF3 are formed in this order in the pixel region 1A and the peripheral circuit region 2A without forming the cap insulating film CAP (see FIG. 10). A photoresist film (not shown) is formed to cover the parts of the insulating films IF2 and IF3 positioned over the part PT1 comprised of the n-type well NW and the p$^+$-type semiconductor region PR. Then, the insulating film IF3 is etched back with the parts of the insulating films IF2 and IF3 above the part PT1 covered with the photoresist film.

Thus, like the first embodiment, the sidewall spacers SWt2, SWL1, and SWL2 are formed, but as shown in FIG. 28, the parts of the insulating films IF2 and IF3 are maintained to be positioned over the part PT1 comprised of the n-type well NW and the p$^+$-type semiconductor region PR. The insulating film IF31 comprised of the insulating film IF3 is formed over the part PT1 in the same layer as the insulating film IF32 via the insulating film IF2. The insulating film IF31 corresponds to the cap insulating film.

Figure 29:
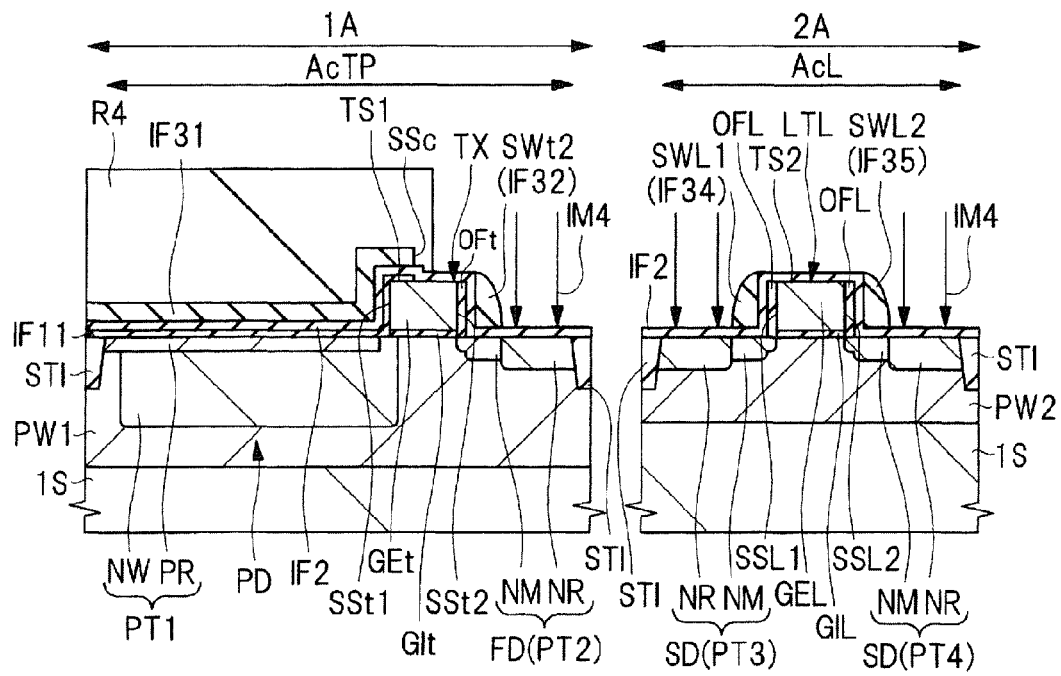
FIG. 29 is a cross-sectional view showing another manufacturing step for the semiconductor device in the comparative example.

In the comparative example, then, as shown in FIG. 29, a step corresponding to the step (the step S20 in FIG. 5) described using FIG. 16 in the first embodiment is performed. At this time, n-type impurity ions IM4 are implanted while the part PT1 comprised of the n-type well NW and the p$^+$-type semiconductor region PR is covered with the insulating films IF11, IF2, and IF31, and the photoresist film R4. Therefore, the photoresist film R4 is removed, for example, by the SPM cleaning or ashing process.

In the comparative example, the impurity ions are implanted to form the n-type well NW in the photodiode PD, and the impurity ions are implanted to form the n-type low-concentration semiconductor region NM included in the drain region of the transfer transistor TX. Then, the cap insulating film is formed over the photodiode PD.

In such a case, the photodiode PD might be damaged when implanting the impurity ions to form the n-type low-concentration semiconductor region NM, or when removing the photoresist film R2 or R3, for example, by the SPM cleaning or the ashing process. That is, crystal defects might be generated in the photodiode PD.

If many crystal defects are included in the photodiode PD, light is falsely determined to be irradiated even though the light is not irradiated, leading to improper lighting, generating white spots. Further, the increase in frequencies of generation of white spots while light is not irradiated, that is, the increase in frequencies of pixel defects might degrade the performance of the CMOS image sensor, thereby reducing the performance of the semiconductor device.

<Main Features and Effects of this Embodiment>

In the manufacturing processes for the semiconductor device in the first embodiment, after forming the gate electrode GEt of the transfer transistor TX and the photodiode PD, the cap insulating film CAP containing silicon and nitrogen is formed over the photodiode PD before forming the low-concentration semiconductor region NM included in the drain region of the transfer transistor TX and the like.

Thus, the n-type well NW and the p$^+$-type semiconductor region PR can be prevented or suppressed from being damaged when implanting impurity ions for formation of the low-concentration semiconductor region NM, or when removing the photoresist film R2 or R3, for example, by the SPM cleaning or the asking process. Therefore, crystal defects can be prevented or suppressed from being generated in the photodiode PD.

Accordingly, the semiconductor device including the CMOS image sensor manufactured by the manufacturing procedure for the semiconductor device in the first embodiment can prevent and suppress the generation of white spots. Further, the frequencies of generation of white spots while light is not irradiated, that is, the frequencies of pixel defects might be reduced to enhance the performance of the CMOS image sensor, thereby improving the performance of the semiconductor device.

The semiconductor device in the first embodiment includes the cap insulating film CAP that contains silicon and nitrogen and is formed over the photodiode PD and at the side surface SSt1 of the gate electrode GEt in the transfer transistor TX on the photodiode PD side. The semiconductor device includes the sidewall spacer SWt1 formed over the side surface SSt1 of the gate electrode GEt in the transfer transistor TX on the side of the photodiode PD via the cap insulating film CAP.

Such a structure of the semiconductor device in the first embodiment is manufactured by the manufacturing steps described above. Thus, as mentioned above, the n-type well NW and the p$^+$-type semiconductor region PR can be prevented or suppressed from being damaged when implanting impurity ions for formation of the low-concentration semiconductor region NM, or when removing the photoresist film R2 or R3, for example, by the SPM cleaning or the asking process.

The structure of the insulating films, including the cap insulating film CAP formed over the photodiode PD differs between the center of the photodiode PD and the end of the photodiode PD on the side of the gate electrode GEt. This can relieve the stress or the like applied to the p-type well PW1 in a part positioned under the end of the gate electrode GEt on the side of the photodiode PD.

Alternatively, the number of insulating films over the end of the photodiode PD on the side of the gate electrode GEt is increased, compared to that over the center of the photodiode PD, making it difficult for light to reach the end on the side of the gate electrode GEt of the photodiode PD. Thus, the influence of the characteristics at the end of the photodiode PD on the side of the gate electrode GEt can be reduced, as compared to the characteristics at the center of the photodiode PD.

Second Embodiment

The first embodiment will describe an example in which the cap insulating film CAP is formed over the n-type well NW and the p$^+$-type semiconductor region PR via the insulating film IF1. On the other hand, the second embodiment will describe an example in which the cap insulating film CAP is formed directly on the n-type well NW and the p$^+$-type semiconductor region PR.

The structure of the semiconductor device in the second embodiment is the same as that of the semiconductor device in the first embodiment with reference to FIGS. 1 and 2, and a description thereof will be omitted below.

<Element Structure in Pixel Region and Peripheral Circuit Region>

Figure 30:
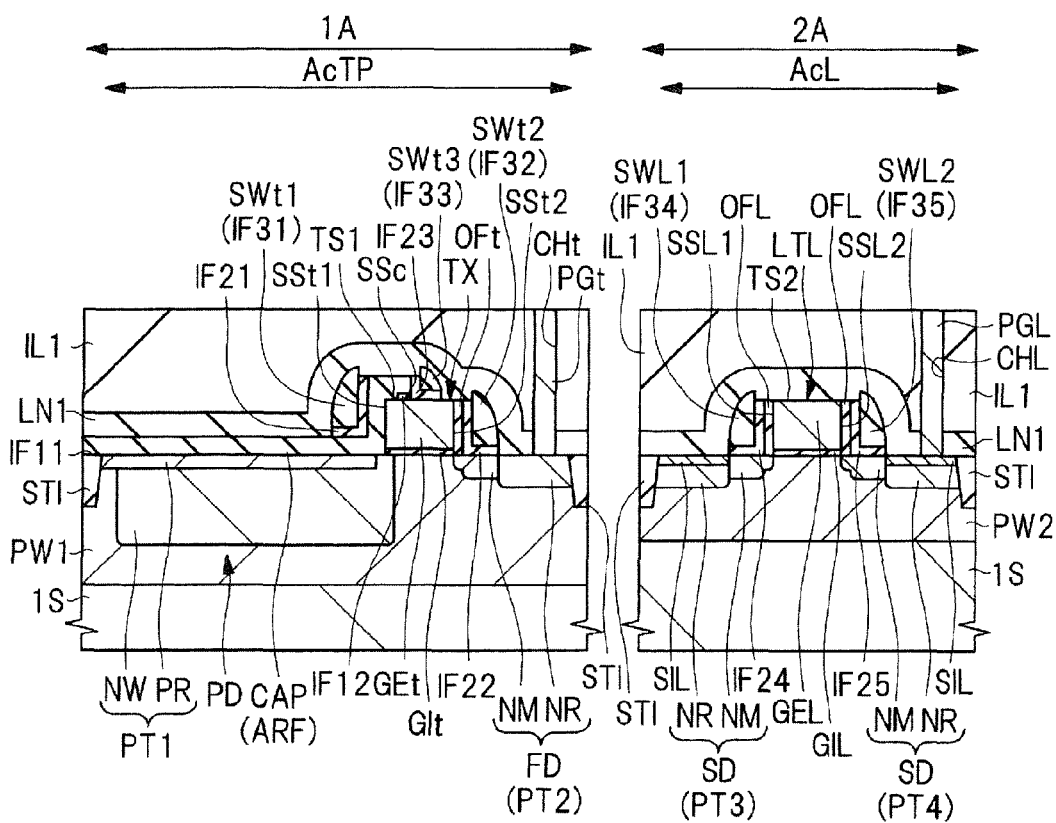
FIG. 30 is a cross-sectional view showing the structure of a semiconductor device according to a second embodiment.

Now, the element structure in the pixel region and the peripheral circuit region will be described below. FIG. 30 is a cross-sectional view showing the structure of the semiconductor device in the second embodiment.

As shown in FIG. 30, the element structure in the pixel region in the second embodiment is the substantially same as that in the first embodiment described using FIGS. 3 and 4, except that the cap insulating film CAP is formed directly on the n-type well NW and the p+-type semiconductor region PR, and a description thereof will be omitted. The element structure at the peripheral circuit region in the second embodiment is also the same as that in the first embodiment described using FIGS. 3 and 4, and a description thereof will be also omitted.

<Method for Manufacturing Semiconductor Device>

Figure 31:
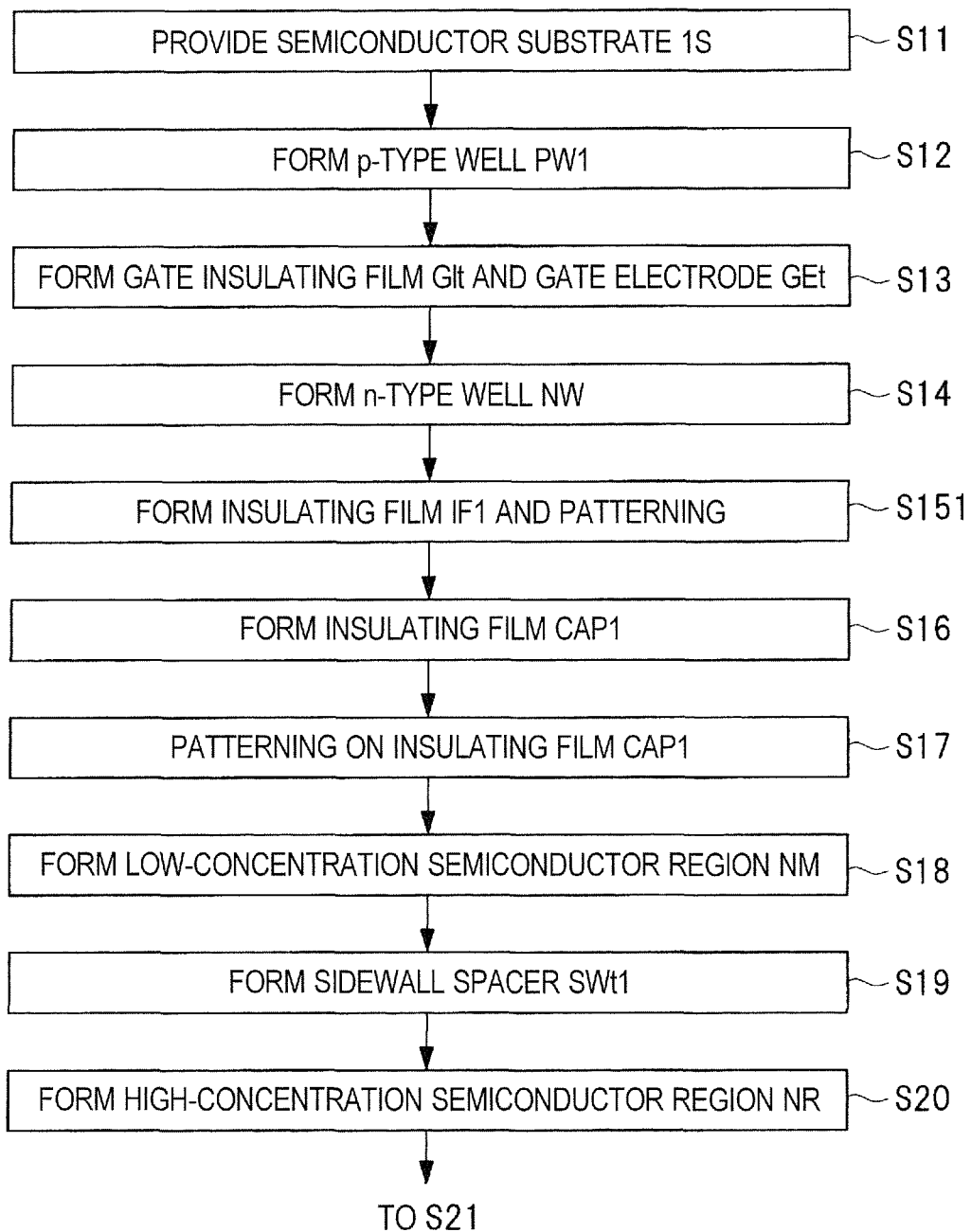
FIG. 31 is a manufacturing process flowchart showing parts of manufacturing steps for the semiconductor device in the second embodiment.

Next, a method for manufacturing a semiconductor device in the second embodiment will be described below. FIG. 31 is a manufacturing process flowchart showing parts of manufacturing steps for the semiconductor device in the second embodiment. FIGS. 32 to 35 are cross-sectional views showing manufacturing steps for the semiconductor device in the second embodiment.

In the second embodiment, the same processes as those in steps S11 to S14 of FIG. 5 are performed (in steps S11 to S14 of FIG. 31) to form the n-type well NW. Thereafter, as shown in FIG. 32, an insulating film IF1 is formed and patterned (in step S151 of FIG. 31).

Figure 32:
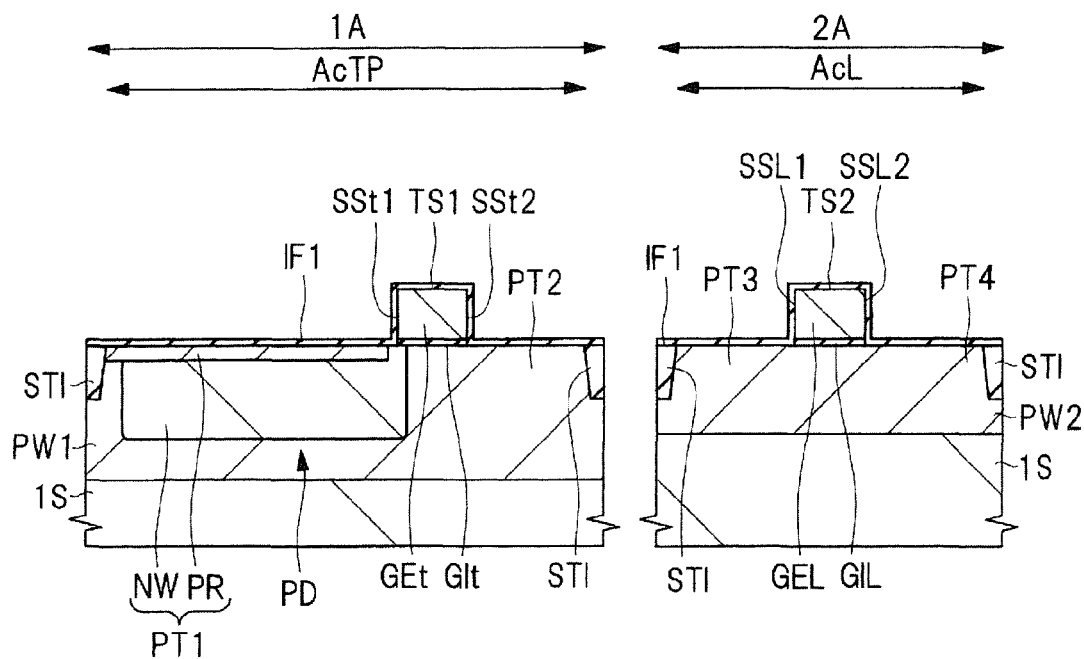
FIG. 32 is a cross-sectional view showing a manufacturing step for the semiconductor device in the second embodiment.

In step S151, first, as shown in FIG. 32, the same process as that in step S15 of FIG. 5 is performed to form the insulating film IF1 over the part PT1 comprised of the n-type well NW and the p+-type semiconductor region PR, the gate electrode GEt, and the part PT2 of the p-type well PW1 in the pixel region 1A. In other words, in step S151, the insulating film IF1 is formed to cover the part PT1, the gate electrode GEt, and the part PT2.

On the other hand, the insulating film IF1 is formed over the part PT3 of the p-type well PW2, the gate electrode GEL, and the part PT4 of the p-type well PW2 in the peripheral circuit region 2A. In other words, in step S151, the insulating film IF1 is formed to cover the part PT3, the gate electrode GEL, and the part PT4.

Figure 33:
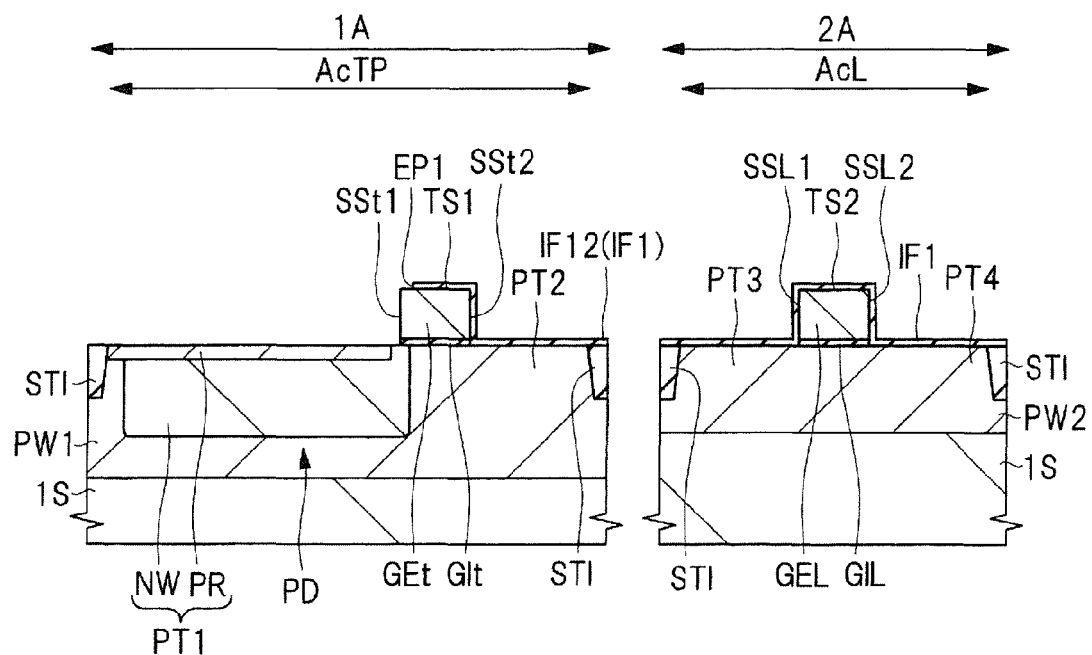
FIG. 33 is a cross-sectional view showing another manufacturing step for the semiconductor device in the second embodiment.

Then, in step S151, as shown in FIG. 33, apart of the insulating film IF1 is patterned using the photolithography technique and the etching technique. Specifically, in the pixel region 1A, the part of the insulating film IF1 covering the part PT1 is removed, whereby the insulating film IF12 is formed of the part of the insulating film IF1 that integrally remains over the part PT2, the side surface SSt2 of the gate electrode GEt on the side opposite to the photodiode PD side, and the upper surface TS1 of the gate electrode GEt. The end EP1 of the insulating film IF12 on the side of the side surface SSt1 of the gate electrode GEt is arranged over the upper surface TS1 of the gate electrode GEt. In the peripheral circuit region 2A, the insulating film IF1 is maintained.

Figure 34:
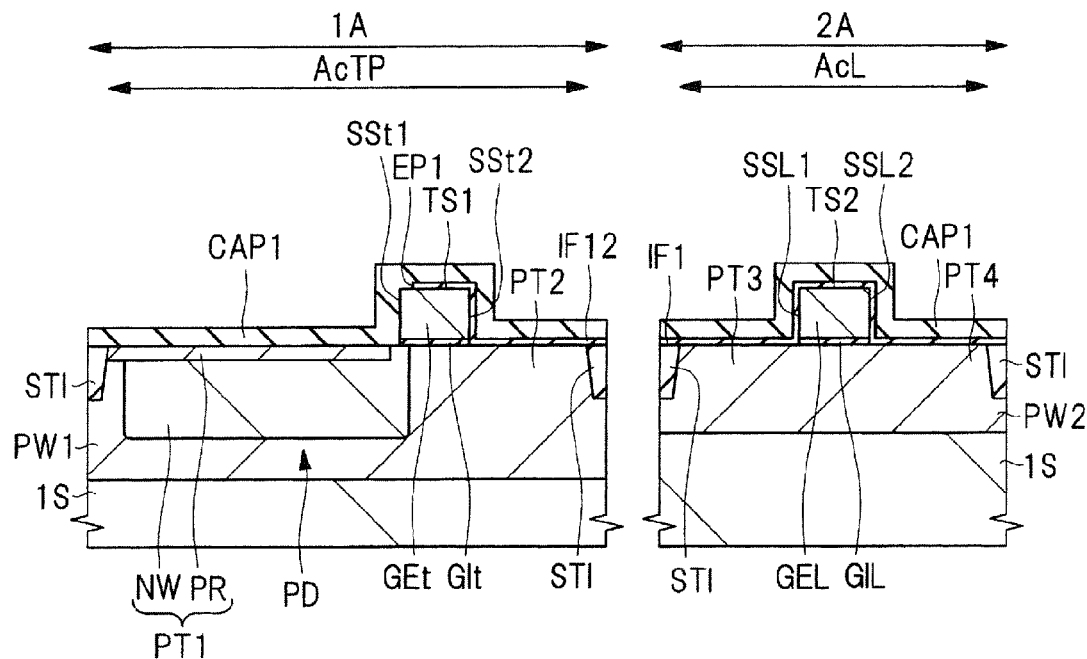
FIG. 34 is a cross-sectional view showing another manufacturing step for the semiconductor device in the second embodiment.

Next, the same process as that of step S16 of FIG. 5 is performed to form an insulating film CAP1 as shown in FIG. 34 (in step S16 of FIG. 31). At this time, the insulating film CAP1 containing silicon and nitrogen is formed to cover the part PT1, the gate electrode GEt, and the insulating films IF12 and IF1 in the pixel region 1A and the peripheral circuit region 2A. At this time, the insulating film CAP1 is formed directly on the part PT1 comprised of the n-type well NW and the p+-type semiconductor region PR.

Figure 35:
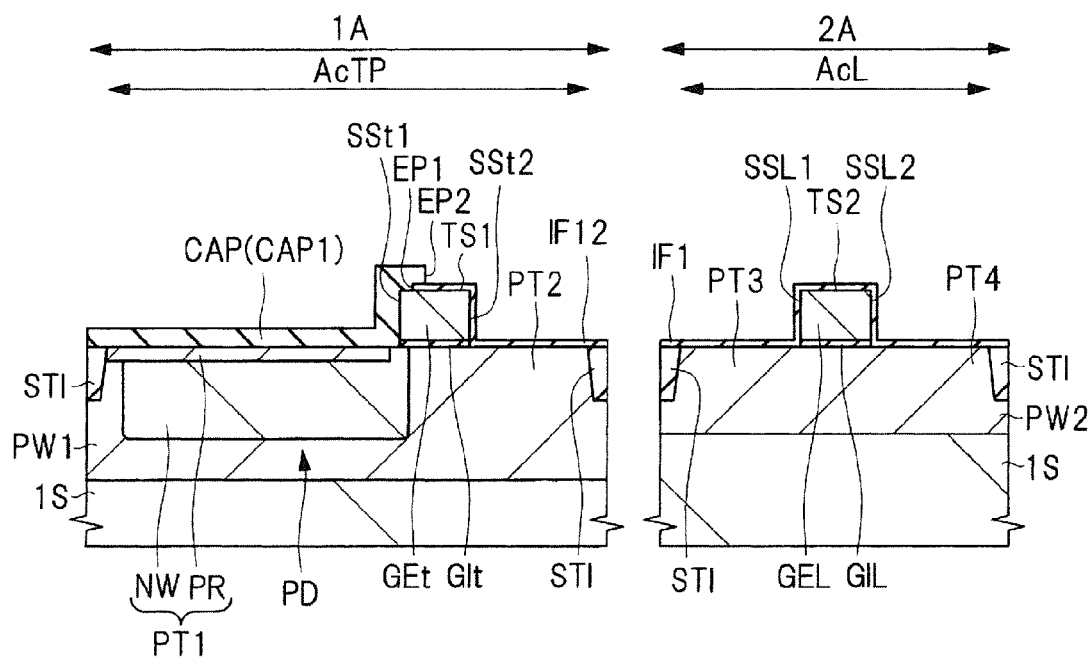
FIG. 35 is a cross-sectional view showing another manufacturing step for the semiconductor device in the second embodiment.

Next, the same process as that of step S17 of FIG. 5 is performed to pattern the insulating film CAP1 as shown in FIG. 35 (in step S17 of FIG. 31). Specifically, the part of the insulating film CAP1 covering the insulating films IF12 and IF1 is removed to thereby form the cap insulating film CAP comprised of the part of the insulating film CAP1 that integrally remains on the part PT1, as well as over the side surface SSt1 of the gate electrode GEt and the upper surface TS1 of the gate electrode GEt.

At this time, the cap insulating film CAP is integrally formed on the part PT1 comprised of the n-type well NW and the p+-type semiconductor region PR, and over the side surface SSt1 of the gate electrode GEt and the upper surface TS1 of the gate electrode GEt. The end EP2 of the cap insulating film CAP on the side of the side surface SSt2 of the gate electrode GEt is arranged over the part of the insulating film IF12 formed over the upper surface TS1 of the gate electrode GEt. That is, the end EP2 of the cap insulating film CAP on the side of the side surface SSt2 of the gate electrode GEt is arranged closer to the side of the side surface SSt2 of the insulating film IF12 rather than the end EP1 on the side of the side surface SSt1 of the gate electrode GEt. Thus, the entire surface of the gate electrode GEt can be protected by the insulating film IF12 and the cap insulating film CAP.

Then, the same processes as those of steps S18 to S20 of FIG. 5 (in steps S18 to S20 of FIG. 31), as well as the processes in steps S21 to S26 of FIG. 6 are performed to form the semiconductor device of the second embodiment.

<Modified Example of Method for Manufacturing Semiconductor Device>

Figure 36:
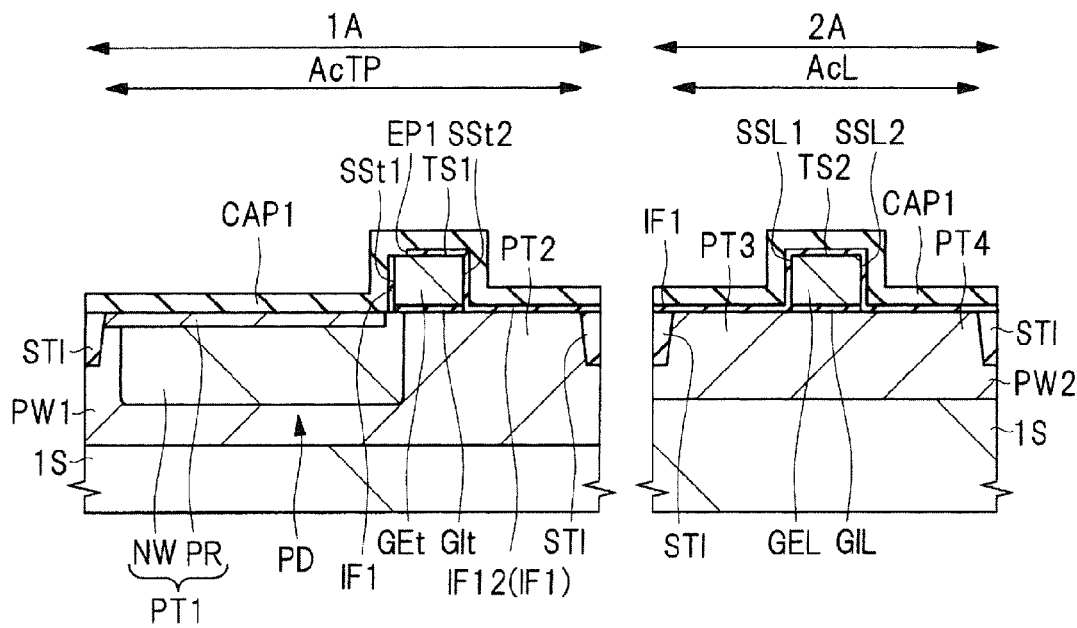
FIG. 36 is a cross-sectional view showing a manufacturing step for a semiconductor device in a modified example of the second embodiment.

Next, a modified example of the method for manufacturing the semiconductor device in the second embodiment will be described below. FIG. 36 is a cross-sectional view showing a manufacturing step for the semiconductor device in a modified example of the second embodiment.

In this modified example, when performing a step (step S151 shown in FIG. 31) described using FIG. 33 in the second embodiment, the insulating film IF1 is patterned by using anisotropic etching to leave the insulating film IF1 over the side surface SSt1 of the gate electrode GEt. Thereafter, the process described in the second embodiment using FIG. 34 is performed (in step S16 of FIG. 31) to form an insulating film CAP1 as shown in FIG. 36.

Even in this modified example, like the second embodiment, the cap insulating film CAP can be formed directly on the part PT1 comprised of the n-type well NW and the p+-type semiconductor region PR.

<Main Features and Effects of this Embodiment>

Even in the manufacturing procedure for the semiconductor device in the second embodiment, the cap insulating film CAP containing silicon and nitrogen is formed over the photodiode PD after forming the gate electrode GEt and the photodiode PD and before forming the low-concentration semiconductor region NM in the same way as the manufacturing procedure for the semiconductor device in the first embodiment.

Thus, the n-type well NW and the p+-type semiconductor region PR can be prevented or suppressed from being damaged when implanting impurity ions for formation of the low-concentration semiconductor region NM, or when removing the photoresist film R2 or R3, for example, by the SPM cleaning or the asking process. Therefore, crystal defects can be prevented or suppressed from being generated in the photodiode PD.

Like the semiconductor device of the first embodiment, the semiconductor device of the second embodiment also has the cap insulating film CAP formed over the photodiode PD and the side surface SSt1 of the gate electrode GEt of the transfer transistor TX on the side of the photodiode PD, the cap insulating film containing silicon and nitrogen. The semiconductor device further has the sidewall spacer SWt1 formed over the side surface SSt1 of the gate electrode GEt of the transfer transistor TX on the side of the photodiode PD via the cap insulating film CAP.

This can relieve the stress or the like applied to, for example, the part of the p-type well PW1 positioned under the end of the gate electrode GEt on the side of the photodiode PD. Alternatively, the influence of the end of the photodiode PD on the side of the gate electrode GEt that would be exerted on the characteristics of the center of the photodiode PD can be reduced.

On the other hand, in the semiconductor device of the second embodiment, the cap insulating film CAP is formed directly on the part PT1 comprised of the n-type well NW and the $p^+$-type semiconductor region PR. Thus, this embodiment can improve optical properties, for example, can improve the light detection sensitivity of the photodiode PD by increasing the amount of light reaching the photodiode PD, as compared to the first embodiment in which the cap insulating film CAP is formed over the part PT1 including the n-type well NW and the $p^+$-type semiconductor region PR via the insulating film IF11.

Third Embodiment

In the description of the first embodiment, by way of example, the sidewall spacer SWt1 (see FIG. 4) is formed over the side surface SSt1 of the gate electrode GEt on the side of the photodiode PD, and the sidewall spacer SWt2 (see FIG. 4) is formed over the side surface SSt2 opposite to the side on the photodiode PD side of the gate electrode GEt. On the other hand, in the third embodiment, both the sidewall spacer SWt1 and the sidewall spacer SWt2 are not formed by way of example.

The structure of the semiconductor device in the third embodiment will be the same as that of the semiconductor device in the first embodiment with reference to FIGS. 1 and 2, and a description thereof will be omitted below.

<Element Structure in Pixel Region and Peripheral Circuit Region>

Now, the element structure in the pixel region and the peripheral circuit region will be described below.

The element structure in the pixel region and the peripheral circuit region of the third embodiment is substantially the same as the element structure in the pixel region and the peripheral circuit region of the first embodiment that has been described with reference to FIGS. 3 and 4, except that the sidewall spacer is not formed. Thus, except for the difference that the sidewall spacer is not formed, the description of the element structure in the pixel region and the peripheral circuit region of the third embodiment will be omitted below.

Figure 37:
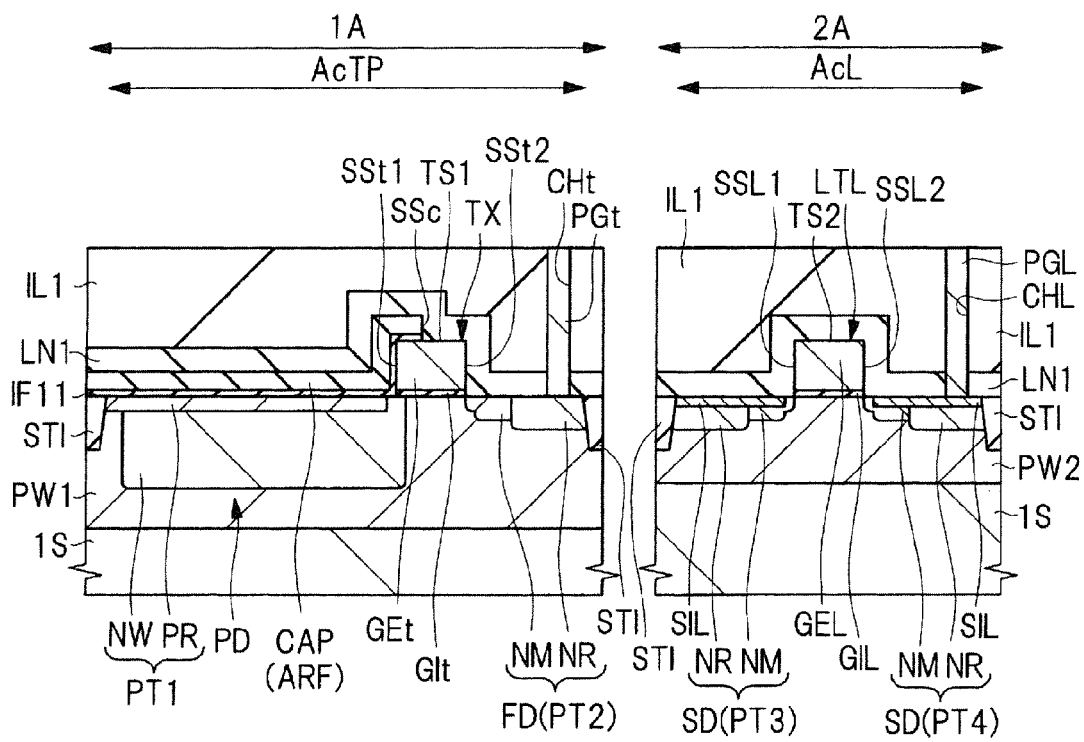
FIG. 37 is a cross-sectional view showing the structure of a semiconductor device according to a third embodiment.

FIG. 37 shows a cross-sectional view of the structure of the semiconductor device in the third embodiment.

As shown in FIG. 37, in the semiconductor device of the third embodiment, the sidewall spacer SWt1 (see FIG. 4) is not formed over the cap insulating film CAP formed at the side surface SSt1 of the gate electrode GEt via the insulating film IF11. The sidewall spacer SWt2 (see FIG. 4) is not formed over the side surface SSt2 of the gate electrode GEt. The sidewall spacers SWL1 and SWL2 (see FIG. 4) are not formed over the respective side surfaces SSL1 and SSL2 of the gate electrode GEL.

Thus, the liner film LN1 is formed directly on the cap insulating film CAP formed over the side surface SSt1 of the gate electrode GEt via the insulating film IF11. The liner film LN1 is formed directly on the side surface SSt2 of the gate electrode GEt. The liner film LN1 is formed directly on the respective side surfaces SSL1 and SSL2 of the gate electrode GEL.

That is, the liner film LN1 is formed to cover the cap insulating film CAP, the gate electrode GEt, the n-type high-concentration semiconductor region NR formed in the upper layer portion of the part PT2 of the p-type well PW1, the gate electrode GEL, and the n-type high-concentration semiconductor regions NR formed in the upper layer portions of the parts PT3 and PT4 of the p-type well PW2.

The liner film LN1 is in direct contact with the part of the cap insulating film CAP formed over the lower end portion of the side surface SSt1 of the gate electrode GEt via the insulating film IF11. The liner film LN1 is in direct contact with the lower end portion of the side surface SSt2 of the gate electrode GEt. The liner film LN1 is in direct contact with each of the lower end portion of the side surface SSL1 of the gate electrode GEL and the lower end portion of the side surface SSL2 of the gate electrode GEL. That is, the liner film LN1 is in direct contact with each of the side surfaces SSt2, SSL1, and SSL2.

Thus, the sidewall spacer SWt1 (see FIG. 4) over the side surface SSt1 of the gate electrode GEt is removed, thus increasing the amount of light reaching a part of the photodiode PD adjacent to the gate electrode GEt in the planar view, which can improve the sensitivity of the photodiode PD.

The liner film LN1 is formed in direct contact with each of the side surfaces SSL1 and SSL2 of the gate electrode GEL, so that the characteristics of the sour/drain region of the transistor LTL can be improved by the influence of the stress in the liner film LN1 and the like. Alternatively, the liner film LN1 is formed directly on the side surface SSt2 of the gate electrode GEt, so that the characteristics and the like of the drain region of the transfer transistor TX can be improved by the influence of the stress in the liner film LN1.

<Method for Manufacturing Semiconductor Device>

Figure 38:
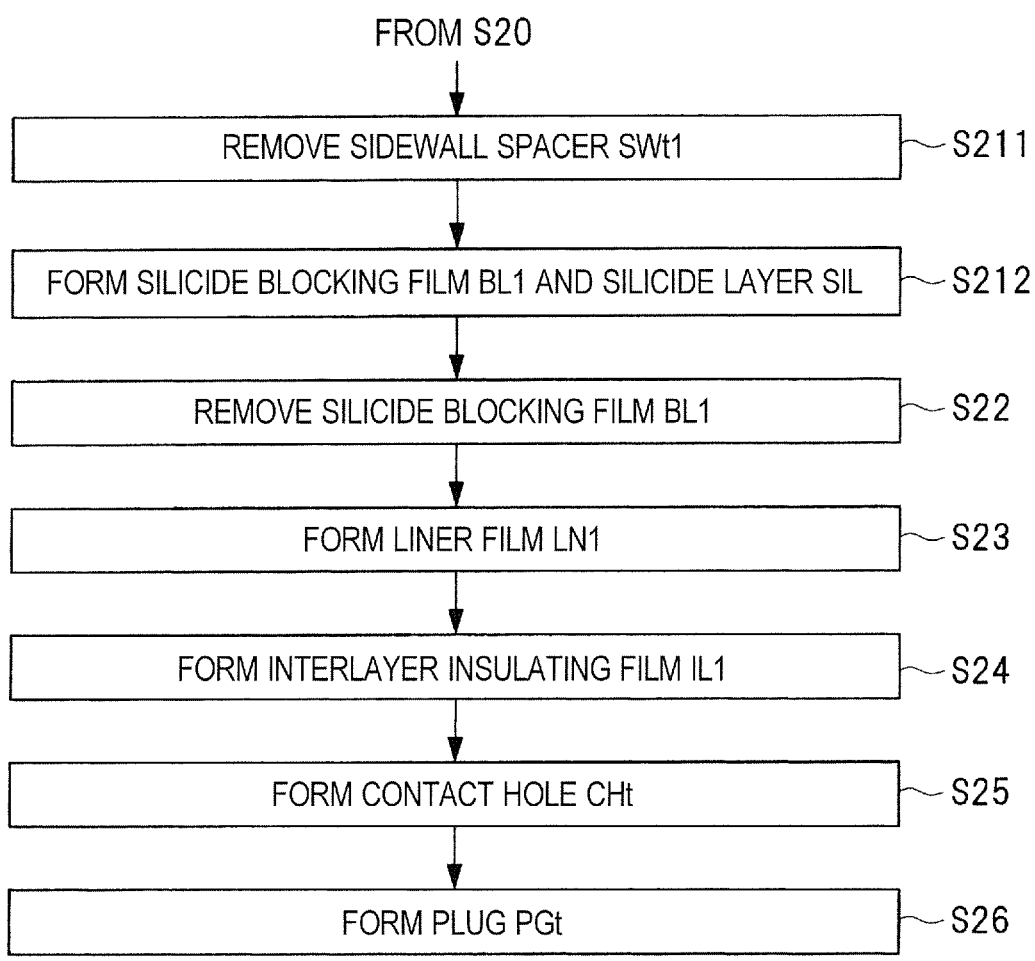
FIG. 38 is a manufacturing process flowchart showing parts of manufacturing steps for the semiconductor device in the third embodiment.

Next, a method for manufacturing the semiconductor device in the third embodiment will be described below. FIG. 38 is a manufacturing process flowchart showing parts of manufacturing steps for the semiconductor device in the third embodiment. FIGS. 39 to 43 are cross-sectional views showing manufacturing steps for the semiconductor device in the third embodiment.

Figure 39:
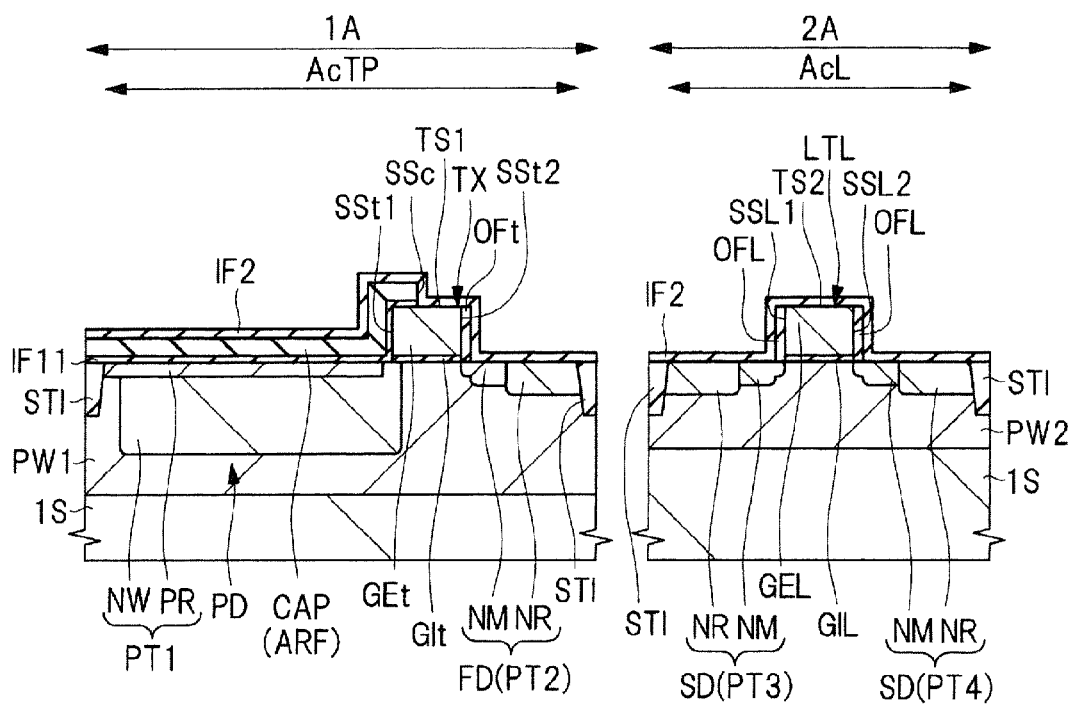
FIG. 39 is a cross-sectional view showing a manufacturing step for the semiconductor device in the third embodiment.

In the third embodiment, the processes in steps S11 to S20 of FIG. 5 are performed to form the high-concentration semiconductor region NR, and then as shown in FIG. 39, the sidewall spacer SWt1 (see FIG. 16) is removed (in step S211 of FIG. 38). In step S211, the sidewall spacers SWt1, SWt2, SWt3, SWL1, and SWL2 (see FIG. 16) are removed, for example, by the RIE method. Thus, the insulating film IF2 is exposed in the pixel region 1A and the peripheral circuit region 2A.

Figure 40:
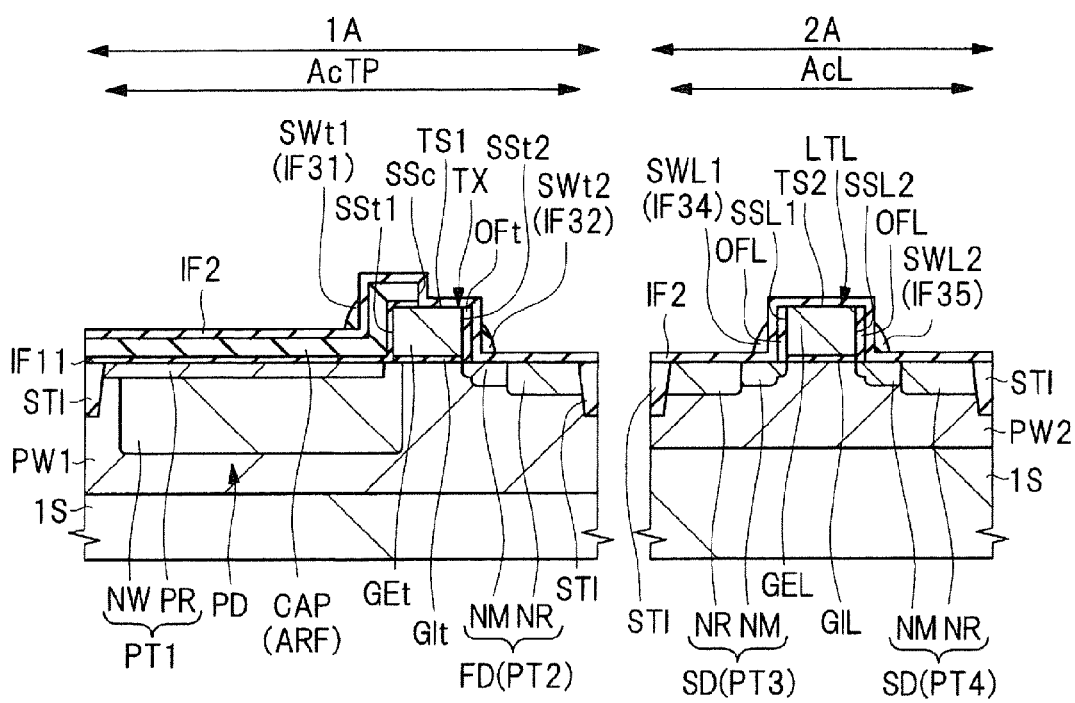
FIG. 40 is a cross-sectional view showing another manufacturing step for the semiconductor device in the third embodiment.

As shown in FIG. 40, the sidewall spacers SWt1, SWt2, SWL1, and SWL2 are not completely removed and may be partially maintained. In such a case, the thickness of the remaining part of each sidewall spacer can be adjusted to thereby adjust or control a distance from the gate electrode GEL to the end of a silicide layer SIL to be formed in step S212 on the side of the gate electrode GEL as will be described later.

Figure 41:
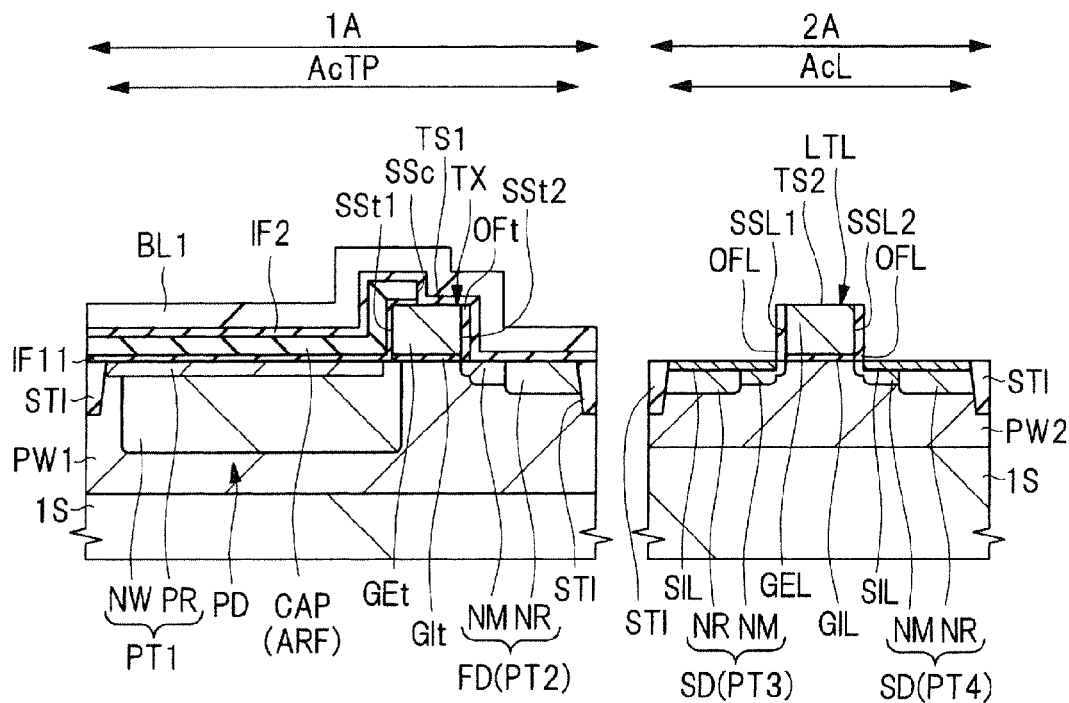
FIG. 41 is a cross-sectional view showing another manufacturing step for the semiconductor device in the third embodiment.

Next, the same process as that of step S21 of FIG. 6 is performed to form the silicide blocking film BL1 and the silicide layer SIL as shown in FIG. 41 (in step S212 of FIG. 38).

Figure 42:
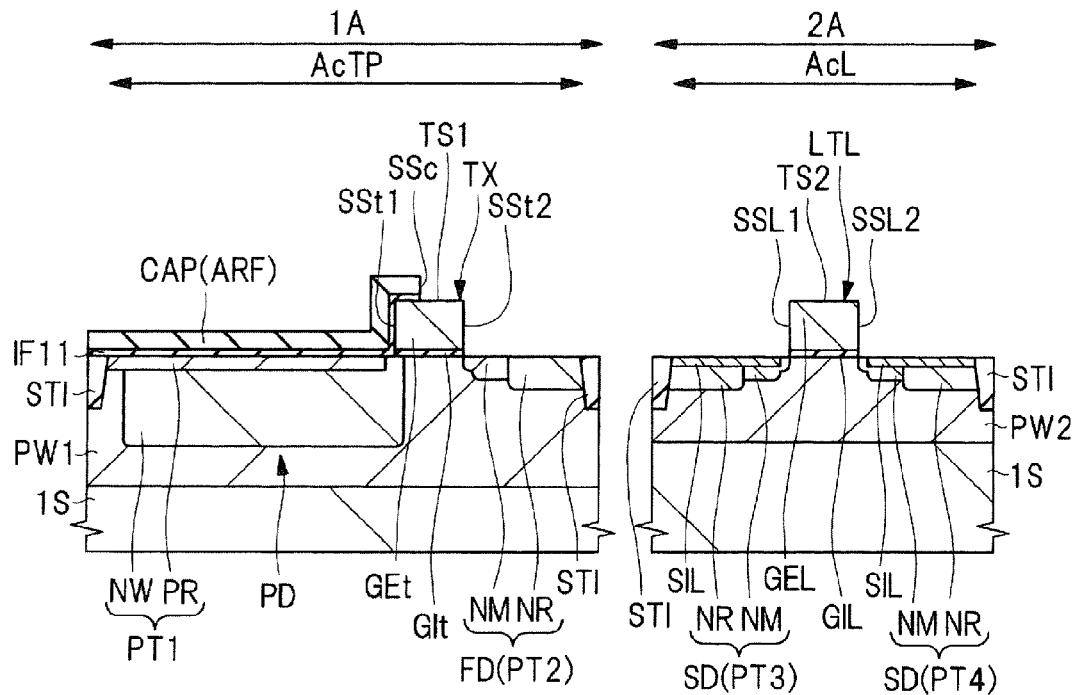
FIG. 42 is a cross-sectional view showing another manufacturing step for the semiconductor device in the third embodiment.

Then, as shown in FIG. 42, the same process as that of step S22 of FIG. 6 is performed to remove the silicide blocking film BL1 (see FIG. 41) (in step S22 of FIG. 38).

Figure 43:
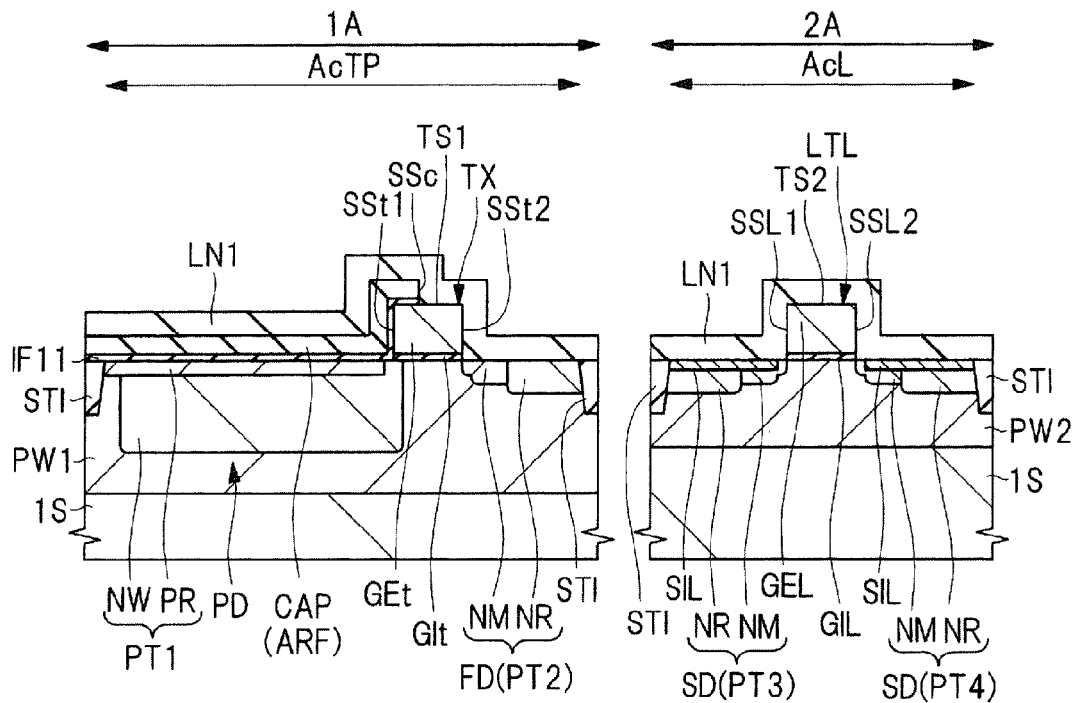
FIG. 43 is a cross-sectional view showing another manufacturing step for the semiconductor device in the third embodiment.

Then, the same process as that of step S23 of FIG. 6 is performed to form the liner film LN1 as shown in FIG. 43 (in step S23 of FIG. 38).

In the third embodiment, in step S211, the sidewall spacers SWt1, SWt2, SWt3, SWL1, and SWL2 (see FIG. 16) are removed. The liner film LN1 is in direct contact with the part of the cap insulating film CAP formed over the lower end portion of the side surface SSt1 of the gate electrode GEt via the insulating film IF11. The liner film LN1 is in direct contact with the lower end portion of the side surface SSt2 of the gate electrode GEt. The liner film LN1 is in direct contact with each of the lower end portion of the side surface SSL1 of the gate electrode GEL and the lower end portion of the side surface SSL2 of the gate electrode GEL. That is, the liner film LN1 is indirect contact with each of the side surfaces SSt2, SSL1, and SSL2.

Thus, the sidewall spacer SWt1 (see FIG. 16) over the side surface SSt1 of the gate electrode GEt is removed, thus increasing the amount of light reaching a part of the photodiode PD adjacent to the gate electrode GEt in the planar view, that is, the end portion of the photodiode PD on the side of the gate electrode GEt, which can improve the sensitivity of the photodiode PD.

The liner film LN1 is formed directly on each of the side surfaces SSL1 and SSL2 of the gate electrode GEL, so that the characteristics of the sour/drain region of the transistor LTL or the like can be improved by the influence of the stress in the liner film LN1.

Thereafter, the same processes as those of steps S24 to S26 of FIG. 6 (in steps S24 to S36 of FIG. 38) are performed to form the semiconductor device of the third embodiment.

<First Modified Example of Method for Manufacturing Semiconductor Device>

Figure 44:
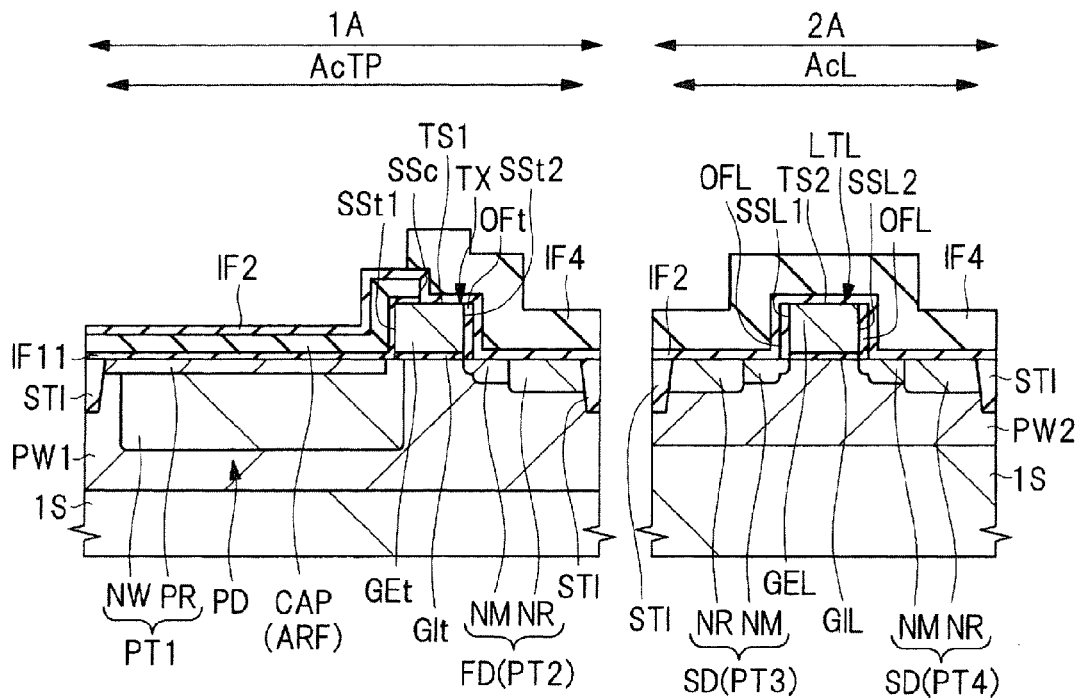
FIG. 44 is a cross-sectional view showing a manufacturing step for a semiconductor device in a first modified example of the third embodiment.
Figure 45:
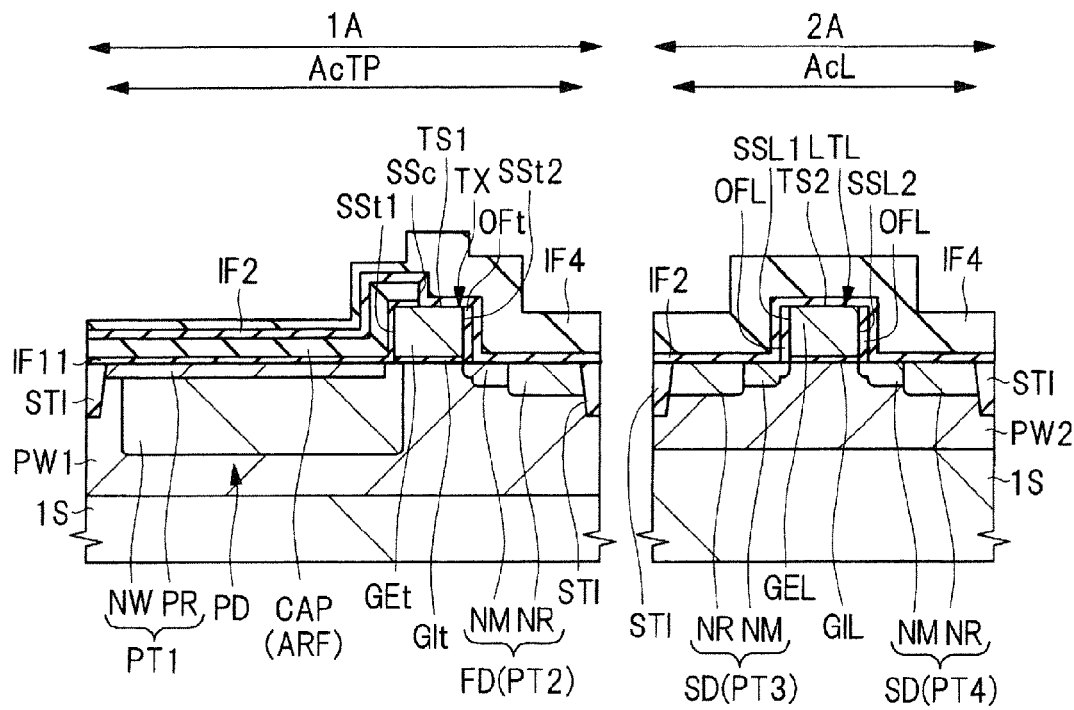
FIG. 45 is a cross-sectional view showing another manufacturing step for a semiconductor device in the first modified example of the third embodiment.
Figure 46:
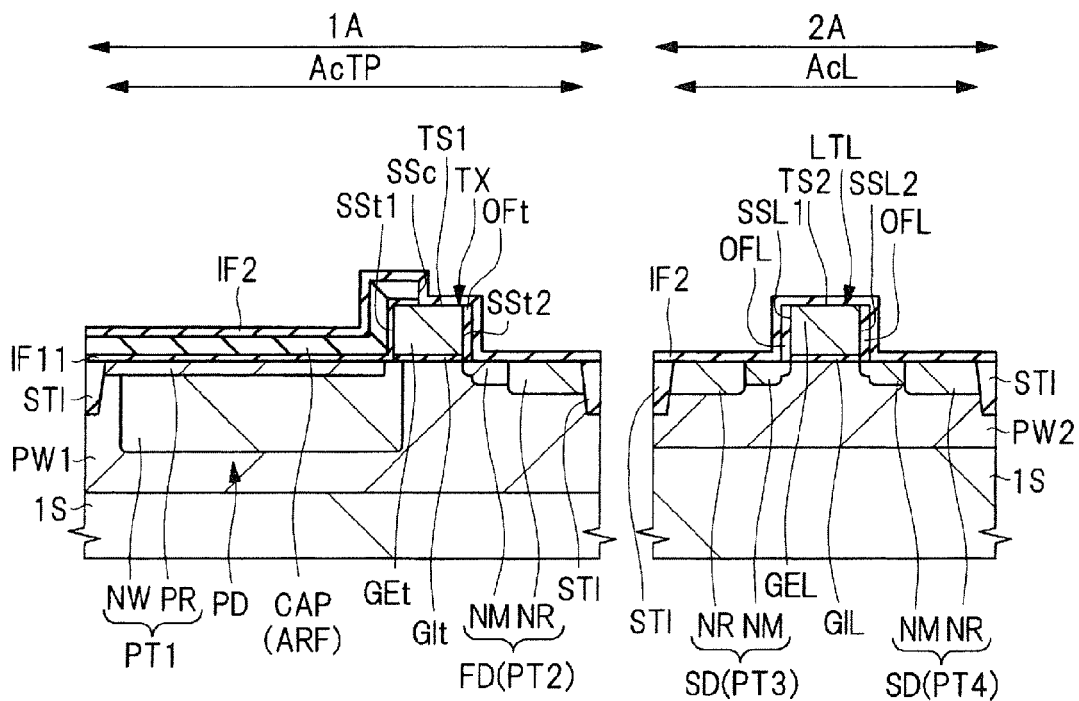
FIG. 46 is a cross-sectional view showing another manufacturing step for a semiconductor device in the first modified example of the third embodiment.

Next, a first modified example of the method for manufacturing the semiconductor device in the third embodiment will be described below. FIGS. 44 to 46 are cross-sectional views showing manufacturing steps for the semiconductor device in a first modified example of the third embodiment.

In the first modified example, after the step (step S211 in FIG. 38) described using FIG. 39 in the third embodiment, as shown in FIG. 44, an insulating film IF4 comprised of, e.g., a silicon nitride film is formed over the insulating film IF2. Then, a heat treatment is performed with the insulating film IF4 formed over the insulating film IF2.

Specifically, the insulating film IF4 is formed over the parts PT3 and PT4, each comprised of the low-concentration semiconductor region NM and the high-concentration semiconductor region NR, via the insulating film IF2 in the peripheral circuit region 2A. The thickness of the insulating film IF4 is relatively large, and larger than that of, for example, the cap insulating film CAP. When the heat treatment is performed with the relatively thick insulating film IF4 formed in this way, the stress can be applied to the p-type well PW2 in the peripheral circuit region 2A, causing internal strain therein. Thus, the channel mobility in the channel region of the transistor LTL can be enhanced, thereby improving the transistor characteristics of the transistor LTL.

In the pixel region 1A, the part of the insulating film IF4 formed over the part PT2 comprised of the low-concentration semiconductor region NM and the high-concentration semiconductor region NR via the insulating film IF2 is relatively large, and larger than, for example, that of the cap insulating film CAP. When the heat treatment is performed with the relatively thick insulating film IF4 formed in this way, the stress can be applied to the p-type well PW1 in the pixel region 1A, causing internal strain therein. Thus, the channel mobility in the channel region of the transfer transistor TX can be enhanced, thereby improving the transistor characteristics of the transfer transistor TX.

In the example shown in FIG. 44, the insulating film IF4 is not formed over the part PT1 that is comprised of the n-type well NW and the p$^+$-type semiconductor region PR. On the other hand, as shown in FIG. 45, the insulating film IF4 may be formed over the part PT1 comprised of the n-type well NW and the p$^+$-type semiconductor region PR via the insulating film IF11, the cap insulating film CAP, and the insulating film IF2.

The thickness of the part of the insulating film IF4 formed over the part PT1 via the insulating film IF11, the cap insulating film CAP, and the insulating film IF2 is preferably smaller than that of the part of the insulating film IF4 formed over the part PT2 via the insulating film IF2 in the pixel region 1A. In this way, by thinning the insulating film IF4 over the part PT1, the stress applied to the inside of the photodiode PD can be reduced even when the heat treatment is performed with the insulating film IF4 formed over the part PT1 via the insulating film IF11, the cap insulating film CAP, and the insulating film IF2. Thus, the generation of white spots in the photodiode PD can be reduced.

Then, as shown in FIG. 46, the insulating film IF4 is removed, for example, by the RIE method. Thereafter, the same processes as those in step S212 and steps S22 to S26 in FIG. 38 are performed.

<Second Modified Example of Method for Manufacturing Semiconductor Device>

Figure 47:
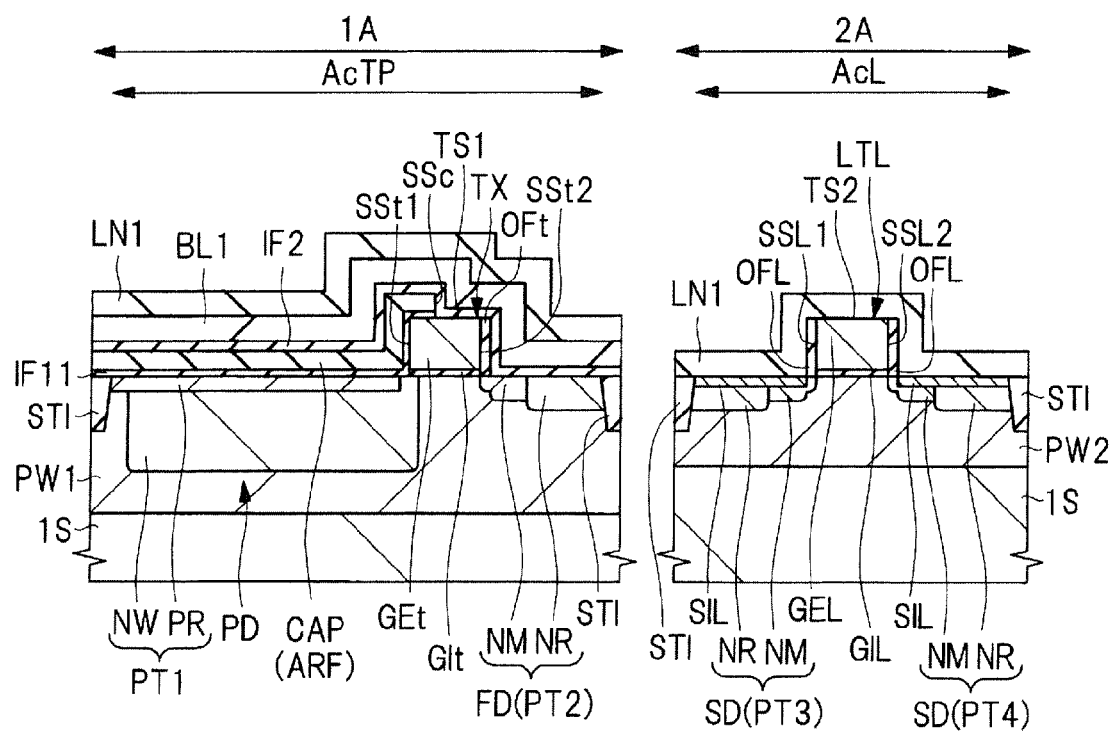
FIG. 47 is a cross-sectional view showing a manufacturing step for a semiconductor device in a second modified example of the third embodiment.

Next, a second modified example of the method for manufacturing a semiconductor device in the third embodiment will be described below. FIG. 47 is a cross-sectional view showing a manufacturing step for the semiconductor device in the second modified example of the third embodiment.

The manufacturing steps for the semiconductor device in the second modified example are provided by removing the step described with reference to FIG. 42 (step S22 of FIG. 38) from the manufacturing steps for the semiconductor device in the third embodiment. That is, after forming the silicide layer SIL, the silicide blocking film BL1 is not removed. Thus, when the process in the step described using FIG. 43 (in step S23 of FIG. 38) is performed, as shown in FIG. 47, the liner film LN1 is formed over the silicide blocking film BL1 in the pixel region 1A.

The second modified example does not perform the step of removing the silicide blocking film BL1, and thus can decrease the number of steps in the manufacturing procedure for the semiconductor device.

<Main Features and Effects of this Embodiment>

Even in the manufacturing procedure for the semiconductor device in the third embodiment, the cap insulating film CAP containing silicon and nitrogen is formed over the photodiode PD after forming the gate electrode GEt and the photodiode PD, and before forming the low-concentration semiconductor region NM, like the manufacturing procedure for the semiconductor device in the first embodiment.

Thus, the n-type well NW and the p$^+$-type semiconductor region PR can be prevented or suppressed from being damaged when implanting impurity ions for formation of the low-concentration semiconductor region NM, or when removing the photoresist film R2 or R3, for example, by the SPM cleaning or the asking process. Therefore, crystal defects can be prevented or suppressed from being generated in the photodiode PD.

On the other hand, the semiconductor device of the third embodiment includes the cap insulating film CAP that contains silicon and nitrogen and is formed over the photodiode PD and the side surface SSt1 of the gate electrode GEt of the transfer transistor TX on the side of the photodiode PD in the pixel region 1A. The semiconductor device includes the liner film LN1 that covers each of the photodiode PD formed in the pixel region 1A, the transfer transistor TX formed in the pixel region 1A, and the transistor LTL formed in the peripheral circuit region 2A. The liner film LN1 is in direct contact with each of the part of the cap insulating film CAP formed over the side surface SSt1 of the gate electrode GEt of the transfer transistor TX, the side surface SSt2 opposite to the photodiode PD side, and the respective side surfaces SSL1 and SSL2 of the gate electrode GEL of the transistor LTL.

Thus, the sidewall spacer SWt1 (see FIG. 4) over the side surface SSt1 of the gate electrode GEt is removed, thus increasing the amount of light reaching a part of the photodiode PD adjacent to the gate electrode GEt in the planar view, thereby enabling improvement of the sensitivity of the photodiode PD.

The liner film LN1 is formed directly on each of the side surfaces SSL1 and SSL2 of the gate electrode GEL, so that the characteristics and the like of the sour/drain region of the transistor LTL can be improved by the influence of the stress in the liner film LN1.

Although the invention made by the inventors has been specifically described above based on the embodiments, it is apparent that the invention is not limited to the above embodiments, and that various modifications and changes can be made without departing from the scope of the invention.

What is claimed is:

1. A method for manufacturing a semiconductor device, comprising the steps of:
   (a) providing a semiconductor substrate;
   (b) forming a first semiconductor region of a first conduction type on a side of a main surface of the semiconductor substrate;
   (c) forming a first gate electrode over the first semiconductor region via a first gate insulating film;
   (d) forming a second semiconductor region of a second conduction type opposite to the first conduction type, in a first part of the first semiconductor region positioned on a first side with respect to the first gate electrode;
   (e) after the step (d), forming a first insulating film over the first part, wherein in the first insulating film is integrally formed over the first part, a first side surface on the first side of the first gate electrode, and a first upper surface of the first gate electrode; and
   (f) forming a third semiconductor region of the second conduction type, in a second part of the first semiconductor region positioned on a side opposite to the first side with respect to the first gate electrode, with the first insulating film formed over the first part,
   wherein a photodiode is formed by the first semiconductor region and the second semiconductor region,
   wherein a transfer transistor for transferring electric charges generated by the photodiode is formed by the first gate electrode and the third semiconductor region, and
   wherein the first insulating film includes silicon and nitrogen;
   (g) after the step (e), forming a first sidewall spacer over the first side surface of the first gate electrode via the first insulating film;
   wherein the first sidewall spacer is comprised of a second insulating film, and
   wherein the step (g) includes forming a second sidewall spacer comprised of a third insulating film that is formed in the same layer as the second insulating film, over a second side surface opposite to the first side of the first gate electrode.

2. The method for manufacturing a semiconductor device according to claim 1,
   wherein the step (e) comprises the steps of:
   (e1) forming a fourth insulating film including silicon and nitrogen to cover the first part, the first gate electrode, and the second part; and
   (e2) after the step (e1), removing a part of the fourth insulating film covering the second part to form the first insulating film comprised of a remaining part of the fourth insulating film that integrally remains over the first part, the first side surface of the first gate electrode, and the first upper surface of the first gate electrode.

3. The method for manufacturing a semiconductor device according to claim 1,
   wherein in the step (e), the first insulating film is formed directly on the first part.

4. The method for manufacturing a semiconductor device according to claim 3,
   wherein the step (e) further comprises the steps of:
   (e3) forming a fifth insulating film including silicon and oxygen to cover the first part, the first gate electrode, and the second part;
   (e4) after the step (e3), removing apart of the fifth insulating film covering the first part to thereby form a sixth insulating film comprised of a remaining part of the fifth insulating film that integrally remains over the second part, a third side surface of the first gate electrode on a side opposite to the first side, and the first upper surface of the first gate electrode;
   (e5) after the step (e4), forming a seventh insulating film including silicon and nitrogen to cover the first part, the first gate electrode, and the sixth insulating film; and
   (e6) after the step (e5), removing a part of the seventh insulating film covering the sixth insulating film, thereby forming the first insulating film comprised of a remaining part of the seventh insulating film that integrally remains over the first part, the first side surface of the first gate electrode, and the first upper surface of the first gate electrode,
   wherein in the step (e5), the seventh insulating film is formed directly on the first part,
   wherein a first end of the sixth insulating film on a side of the first side surface of the first gate electrode is arranged over the first upper surface of the first gate electrode, and
   wherein a second end of the first insulating film on a side of the third side surface of the first gate electrode is arranged over a part of the sixth insulating film formed over the first upper surface of the first gate electrode.

5. The method for manufacturing a semiconductor device according to claim 1,
   wherein in the step (b), the first semiconductor region is formed in a first region on the main surface side of the semiconductor substrate, and a fourth semiconductor region of a third conduction type is formed in a second region on the main surface side of the semiconductor substrate, wherein in the step (c), a second gate electrode is formed over the fourth semiconductor region via a second gate insulating film, and wherein in the step (f), a fifth semiconductor region of a fourth conduction type opposite to the third conduction type is formed in a third part positioned on a second side of the fourth semiconductor region with respect to the second gate electrode with the first insulating film formed over the first part.

6. The method for manufacturing a semiconductor device according to claim 5, wherein in the step (e), the first insulating film is integrally formed over the first part, a fourth side surface on the first side of the first gate electrode, and a second upper surface of the first gate electrode, the method further comprising the steps of:

(h) after the step (e), forming a third sidewall spacer comprised of an eighth insulating film over the fourth side surface of the first gate electrode via the first insulating film, forming a fourth sidewall spacer comprised of a ninth insulating film formed in the same layer as the eighth insulating film, over a fifth side surface opposite to the first side of the first gate electrode, and forming a fifth sidewall spacer comprised of a tenth insulating film formed in the same layer as the eighth insulating film, over a sixth side surface on the second side of the second gate electrode;

(i) implanting first impurity ions of the second conduction type into the second part using the fourth sidewall spacer as a mask, and implanting second impurity ions of the fourth conduction type into the third part using the fifth sidewall spacer as a mask;

(j) after the step (i), removing the third sidewall spacer, the fourth sidewall spacer, and the fifth sidewall spacer; and (k) after the step (j), forming an eleventh insulating film to cover the first insulating film, the first gate electrode, the second part, the second gate electrode, and the third part, wherein the eleventh insulating film is in contact with each of the part of the first insulating film formed over the fourth side surface of the first gate electrode, the fifth side surface of the first gate electrode, and the sixth side surface of the second gate electrode.

7. The method for manufacturing a semiconductor device according to claim 1, further comprising the step of:

(l) after the step (e), forming a sixth sidewall spacer comprised of a twelfth insulating film over a seventh sidewall surface opposite to the first side of the first gate electrode, the twelfth insulating film including silicon and nitrogen, wherein the step (l) includes forming a thirteenth insulating film in the same layer as the twelfth insulating film, over the first insulating film, the thirteenth insulating film including silicon and nitrogen.

8. The method for manufacturing a semiconductor device according to claim 1, wherein the step (f) comprises the steps of:

(f1) forming a resist film over the first insulating film, the first gate electrode, and the second part;

(f2) removing a part of the resist film formed over the second part;

(f3) after the step (f2), forming the third semiconductor region in the second part by implanting third impurity ions of the second conduction type in the second part using the first gate electrode as a mask with the resist film formed over the first insulating film; and (f4) removing the resist film.

9. The method for manufacturing a semiconductor device according to claim 1, wherein the first insulating film is comprised of a silicon nitride film.

* * * * *